US012685058B2

(12) United States Patent
Kamimura

(10) Patent No.: US 12,685,058 B2

(45) Date of Patent: *Jul. 14, 2026

(54) POLISHING LIQUID AND CHEMICAL MECHANICAL POLISHING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 1244 days.

This patent is subject to a terminal disclaimer.

(21) Appl. No.: 17/553,811

(22) Filed: Dec. 17, 2021

(65) Prior Publication Data

US 2022/0106499 A1 Apr. 7, 2022

Related U.S. Application Data

(63) Continuation of application No. PCT/JP2020/018766, filed on May 11, 2020.

(30) Foreign Application Priority Data

Jun. 20, 2019 (JP) ................................ 2019-114752

(51) Int. Cl.

| | |
|---|---|
| ***H10P 52/40*** | (2026.01) |
| ***C09G 1/02*** | (2006.01) |
| ***H10P 52/00*** | (2026.01) |

(52) U.S. Cl.

CPC .............. *H10P 52/403* (2026.01); *C09G 1/02* (2013.01); *H10P 52/00* (2026.01)

(58) Field of Classification Search

None

See application file for complete search history.

(56) References Cited

U.S. PATENT DOCUMENTS 12,448,541 B2 * 10/2025 Kamimura ............... C09G 1/02
2008/0242091 A1 10/2008 Kato et al.

(Continued)

FOREIGN PATENT DOCUMENTS

JP 2004273650 9/2004
JP 2008251677 10/2008

(Continued)

OTHER PUBLICATIONS

"International Search Report (Form PCT/ISA/210) of PCT/JP2020/018766," mailed on Jul. 21, 2020, with English translation thereof, pp. 1-7.

(Continued)

*Primary Examiner* — Roberts P Culbert

(74) *Attorney, Agent, or Firm* — JCIPRNET

(57) ABSTRACT

An object of the present invention is to provide a polishing liquid which reduces the occurrence of dishing on a surface to be polished of an object to be polished having a cobalt-containing film after polishing in a case where the polishing liquid is applied to CMP of the object to be polished. In addition, another object of the present invention is to provide a chemical mechanical polishing method using the above-mentioned polishing liquid.

The polishing liquid of an embodiment of the present invention is a polishing liquid used for chemical mechanical polishing of an object to be polished having a cobalt-containing film, including colloidal silica, a nitrogen-containing aromatic heterocycle, and hydrogen peroxide, in which at least a specific nitrogen-containing aromatic heterocyclic compound (1), a specific nitrogen-containing aromatic heterocyclic compound (2) different from the nitrogen-containing aromatic heterocyclic compound (1) are included as the nitrogen-containing aromatic heterocyclic compound.

25 Claims, 1 Drawing Sheet

(56) References Cited

U.S. PATENT DOCUMENTS

| | | | | |
|---|---|---|---|---|
| 2016/0115353 | A1* | 4/2016 | Kraft | C09G 1/02<br>438/693 |
| 2017/0154787 | A1 | 6/2017 | Sakashita et al. | |
| 2017/0158913 | A1 | 6/2017 | Reichardt et al. | |
| 2019/0085208 | A1* | 3/2019 | Shinoda | C09G 1/02 |

FOREIGN PATENT DOCUMENTS

| | | |
|---|---|---|
| JP | 2009064881 | 3/2009 |
| JP | 2011091248 | 5/2011 |
| JP | 2017107918 | 6/2017 |
| JP | 2017157591 | 9/2017 |
| JP | 2017527654 | 9/2017 |
| KR | 20170033329 | 3/2017 |
| TW | 201827390 | 8/2018 |
| WO | 2016006631 | 1/2016 |
| WO | 2018159530 | 9/2018 |

OTHER PUBLICATIONS

"Written Opinion of the International Searching Authority (Form PCT/ISA/237)" of PCT/ JP2020/018766, mailed on Jul. 21, 2020, with English translation thereof, pp. 1-9.

"Notice of Reasons for Refusal of Japan Counterpart Application", issued on Dec. 6, 2022, with English translation thereof, p. 1-p. 8.

"Office Action of Korean Counterpart Application", issued on Feb. 14, 2024, with English translation thereof, p. 1-p. 11.

"Office Action of Taiwan Counterpart Application", issued on Nov. 29, 2023, with English translation thereof, p. 1-p. 7.

* cited by examiner

POLISHING LIQUID AND CHEMICAL MECHANICAL POLISHING METHOD

CROSS-REFERENCE TO RELATED APPLICATIONS

This application is a Continuation of PCT International Application No. PCT/JP2020/018766 filed on May 11, 2020, which claims priority under 35 U.S.C. § 119(a) to Japanese Patent Application No. 2019-114752 filed on Jun. 20, 2019. The above application is hereby expressly incorporated by reference, in its entirety, into the present application.

BACKGROUND OF THE INVENTION

1. Field of the Invention

The present invention relates to a polishing liquid and a chemical mechanical polishing method.

2. Description of the Related Art

In the manufacture of a semiconductor integrated circuit (large-scale integrated circuit: LSI), a chemical mechanical polishing (CMP) method is used for flattening a bare wafer, flattening an interlayer insulating film, forming a metal plug, forming an embedded wiring line, and the like.

By the way, cobalt has recently been attracting attention as a wiring line metal element instead of copper due to a demand for miniaturization of a wiring line. In a case where cobalt is used as the wiring line metal element, it is necessary to use a polishing liquid for CMP, which can remove cobalt.

For example, WO2016/006631A discloses "a polishing liquid for CMP used for polishing a surface to be polished, having at least a cobalt-containing part and a metal-containing part that contains a metal other than cobalt, the polishing liquid comprising polishing particles, a metal corrosion inhibitor and water, in which a pH is 4.0 or less, and in a case where a corrosion potential EA of cobalt and a corrosion potential EB of the metal are measured in the polishing liquid for CMP, an absolute value of a corrosion potential difference between the corrosion potential EA and the corrosion potential EB, that is, a potential difference EA−EB, is 0 to 300 mV".

SUMMARY OF THE INVENTION

The present inventors have examined the polishing liquid for CMP described in WO2016/006631A, and have thus found that there is room for an improvement in a dishing suppressing property (dishing: phenomenon in which a surface of a wiring line exposed to a surface to be polished has a dish-shaped indentation by polishing in a case where the wiring line is formed by CMP) that occurs on a surface to be polished of an object to be polished after polishing.

Therefore, an object of the present invention is to provide a polishing liquid which reduces the occurrence of dishing on a surface to be polished of an object to be polished having a cobalt-containing film after polishing, in a case where the polishing liquid is applied to CMP of the object to be polished.

In addition, another object of the present invention is to provide a chemical mechanical polishing method using the polishing liquid.

The present inventors have found that the objects can be accomplished by the following configurations.

[1] A polishing liquid used for chemical mechanical polishing of an object to be polished having a cobalt-containing film, the polishing liquid comprising:

colloidal silica;

a nitrogen-containing aromatic heterocyclic compound; and hydrogen peroxide, in which at least a nitrogen-containing aromatic heterocyclic compound (1) and a nitrogen-containing aromatic heterocyclic compound (2) different from the nitrogen-containing aromatic heterocyclic compound (1) are included as the nitrogen-containing aromatic heterocyclic compound, and the nitrogen-containing aromatic heterocyclic compound (1) and the nitrogen-containing aromatic heterocyclic compound (2) are two selected from the group consisting of a compound represented by General Formula (I) which will be described later, a compound represented by General Formula (II) which will be described later, and a compound represented by General Formula (III) which will be described later, or two selected from the group consisting of a compound represented by General Formula (IV) which will be described later and a compound represented by General Formula (V) which will be described later.

[2] The polishing liquid as described in [1], further comprising one or more passivation film forming agents selected from the group consisting of a compound represented by General Formula (1) which will be described later and a compound represented by General Formula (2) which will be described later.

[3] The polishing liquid as described in [2], in which a C log P value of the passivation film forming agent is 1.0 to 3.8.

[4] The polishing liquid as described in [2] or [3], in which the passivation film forming agent includes one or more selected from the group consisting of 4-methylphthalic acid, 4-nitrophthalic acid, salicylic acid, 4-methylsalicylic acid, anthranilic acid, 4-methylbenzoic acid, 4-tert-butylbenzoic acid, 4-propylbenzoic acid, 1,4,5,8-naphthalenetetracarboxylic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.

[5] The polishing liquid as described in any one of [2] to [4], further comprising an anionic surfactant.

[6] The polishing liquid as described in [5], in which a mass ratio of a content of the passivation film forming agent to a content of the anionic surfactant is more than 0.01 and less than 150.

[7] The polishing liquid as described in [5] or [6], in which a value of a difference obtained by subtracting a C log P value of the passivation film forming agent from a C log P value of the anionic surfactant is more than 2.00 and less than 8.00.

[8] The polishing liquid as described in any one of [5] to [7], in which a value of a difference obtained by subtracting a C log P value of the passivation film forming agent from a C log P value of the anionic surfactant is 2.50 to 6.00.

[9] The polishing liquid as described in any one of [1] to [8], further comprising one or more organic acids selected from the group consisting of glycine, alanine, sarcosine, iminodiacetic acid, polycarboxylic acid, and polyphosphonic acid.

[10] The polishing liquid as described in any one of [1] to [9], further comprising a nitrogen-containing aromatic heterocyclic compound other than the compounds represented by General Formulae (I) to (V).

[11] The polishing liquid as described in any one of [1] to [10], further comprising a polymer compound.

[12] The polishing liquid as described in any one of [1] to [11], further comprising a cationic compound.

[13] The polishing liquid as described in any one of [1] to [12], in which a mass ratio of a content of the nitrogen-containing aromatic heterocyclic compound (1) to a content of the nitrogen-containing aromatic heterocyclic compound (2) is 30 to 15,000.

[14] The polishing liquid as described in any one of [1] to [13], in which a pH of the polishing liquid is 2.0 to 12.0.

[15] The polishing liquid as described in any one of [1] to [14], further comprising an organic solvent.

[16] The polishing liquid as described in any one of [1] to [15], in which a content of the colloidal silica is 10% by mass or less with respect to a total mass of the polishing liquid, and, an average primary particle diameter of the colloidal silica is 60 nm or less.

[17] The polishing liquid as described in any one of [1] to [16], in which a concentration of solid contents is 5% by mass or more, and the polishing liquid is used after 2-times or more dilution on a mass basis.

[18] A chemical mechanical polishing method comprising:

a step of obtaining an object to be polished, which has been polished, by bringing a surface to be polished of an object to be polished into contact with a polishing pad while supplying the polishing liquid as described in any one of [1] to [16] to the polishing pad attached to a polishing platen, and relatively moving the object to be polished and the polishing pad to polish the surface to be polished.

[19] The chemical mechanical polishing method as described in [18], in which a polishing pressure is 0.5 to 3.0 psi.

[20] The chemical mechanical polishing method as described in [18] or [19], in which a supply rate of the polishing liquid supplied to the polishing pad is 0.14 to 0.35 ml/(min·cm$^2$).

[21] The chemical mechanical polishing method as described in any one of [18] to [20], in which the object to be polished has at least a first layer containing cobalt and a second layer other than the first layer, and the second layer includes one or more materials selected from the group consisting of tantalum, tantalum nitride, titanium nitride, silicon nitride, tetraethoxysilane, silicon oxycarbide, and silicon carbide.

[22] The chemical mechanical polishing method as described in any one of [18] to [21], further comprising a step of cleaning the object to be polished, which has been polished, with an alkaline cleaning liquid after the step of obtaining the object to be polished, which has been polished.

[23] A polishing liquid used for chemical mechanical polishing of an object to be polished, the polishing liquid comprising:

abrasive grains;

a nitrogen-containing aromatic heterocyclic compound; and hydrogen peroxide, in which at least a nitrogen-containing aromatic heterocyclic compound (1) and a nitrogen-containing aromatic heterocyclic compound (2) different from the nitrogen-containing aromatic heterocyclic compound (1) are included as the nitrogen-containing aromatic heterocyclic compound, and the nitrogen-containing aromatic heterocyclic compound (1) and the nitrogen-containing aromatic heterocyclic compound (2) are two selected from the group consisting of a compound represented by General Formula (I) which will be described later, a compound represented by General Formula (II) which will be described later, and a compound represented by General Formula (III) which will be described later, or two selected from the group consisting of a compound represented by General Formula (IV) which will be described later and a compound represented by General Formula (V) which will be described later.

According to the present invention, it is possible to provide a polishing liquid which reduces the occurrence of dishing on a surface to be polished of an object to be polished having a cobalt-containing film after polishing in a case where the polishing liquid is applied to CMP of the object to be polished.

In addition, it is also possible to provide a chemical mechanical polishing method using the polishing liquid.

DESCRIPTION OF THE PREFERRED EMBODIMENTS

Figure 1:
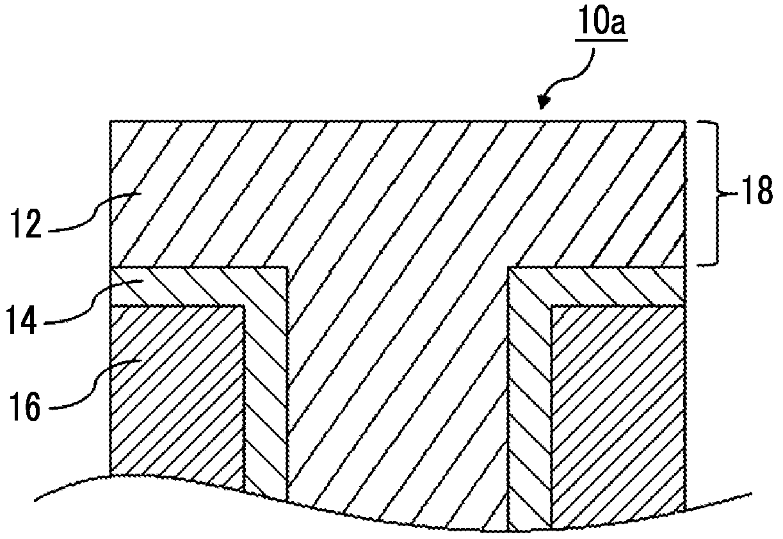
FIG. 1 is a schematic view showing an example of an object to be polished for which a chemical mechanical polishing method is carried out.

Hereinafter, the present invention will be described in detail.

Descriptions on the configuration requirements which will be described later are made based on representative embodiments of the present invention in some cases, but it should not be construed that the present invention is limited to such embodiments.

In addition, in the present specification, a numerical value range expressed using "to" means a range that includes the preceding and succeeding numerical values of "to" as the lower limit value and the upper limit value, respectively.

Incidentally, in the present invention, "ppm" means "parts-per-million ($10^{-6}$)", "ppb" means "parts-per-billion ($10^{-9}$)", and "ppt" means "parts-per-trillion ($10^{-12}$)".

In the present specification, the C log P value is a value determined by calculation of a common logarithm log P of a partition coefficient P between 1-octanol and water. With regard to a method or software used for calculation of the C log P value, a known method or software can be used, but in the present invention, a C log P program incorporated into ChemBioDraw Ultra 12.0 from Cambridge Soft is used unless otherwise specified.

In the present specification, the pH can be measured by a pH meter, and a measurement temperature is 25° C. Incidentally, a product name, "LAQUA Series" (manufactured by HORIBA, Ltd.), can be used for the pH meter.

In the present specification, psi means a pound-force per square inch; 1 psi=6,894.76 Pa.

[Polishing Liquid]

The polishing liquid of an embodiment of the present invention (hereinafter also referred to as "the present polishing liquid") is a polishing liquid used for chemical mechanical polishing (CMP) of an object to be polished (preferably an object to be polished having a cobalt-containing film), the polishing liquid including abrasive grains (preferably colloidal silica); a nitrogen-containing aromatic heterocyclic compound; and hydrogen peroxide, in which at least a nitrogen-containing aromatic heterocyclic compound (1) and a nitrogen-containing aromatic heterocyclic compound (2) different from the nitrogen-containing aromatic heterocyclic compound (1) are included as the nitrogen-containing aromatic heterocyclic compound, and the nitrogen-containing aromatic heterocyclic compound (1) and the nitrogen-containing aromatic heterocyclic compound (2) are two selected from the group consisting of a compound represented by General Formula (I) which will be described later, a compound represented by General Formula (II) which will be described later, and a compound represented by General Formula (III) which will be described later, or two selected from the group consisting of a compound represented by General Formula (IV) which will be described later and a compound represented by General Formula (V) which will be described later.

Hereinafter, in the polishing liquid, excellent performance of a reduction in the occurrence of dishing on a surface to be polished of an object to be polished is also simply referred to as an excellent dishing suppressing property, and is also expressed as follows: the effect of the present invention is excellent.

[Components]

Hereinafter, components that are included in the present polishing liquid and components that can be included in the present polishing liquid will be described.

In addition, each component which will be described below may be ionized in the present polishing liquid. The content of each component in the following description is obtained by converting the component which is present in the state of being ionized in the present polishing liquid is intended to mean a content on the assumption that the component is not ionized.

For example, in a case where a compound (ion) in which a carboxylic acid group (—COOH) in a compound represented by General Formula (1) which will be described later serves as a carboxylate anion ($—COO^-$) is included in the present polishing liquid, the polishing liquid is considered to include the compound represented by General Formula (1).

<Colloidal Silica (Abrasive Grains)>

The present polishing liquid includes colloidal silica (silica colloidal particles). The colloidal silica functions as abrasive grains for polishing an object to be polished.

In another aspect of the present invention, the present polishing liquid includes abrasive grains. Examples of the abrasive grains include inorganic abrasive grains such as silica, alumina, zirconia, ceria, titania, germania, and silicon carbide; and organic abrasive grains such as polystyrene, polyacryl, and polyvinyl chloride. Among those, the silica particles are preferable as the abrasive grains from the viewpoint that the dispersion stability in the polishing liquid is excellent and the number of scratches (polishing flaws) generated by CMP is small.

The silica particles are not particularly limited, and examples thereof include precipitated silica, fumed silica, and colloidal silica. Among those, the colloidal silica is more preferable.

The present polishing liquid is preferably a slurry.

An average primary particle diameter of the colloidal silica is preferably 60 nm or less, and more preferably 30 nm or less from the viewpoint that generation of defects on a surface to be polished can be further suppressed.

The lower limit value of the average primary particle diameter of the colloidal silica is preferably 1 nm or more, and more preferably 3 nm or more from the viewpoint that the aggregation of the colloidal silica is suppressed and the temporal stability of the present polishing liquid is thus improved.

An average primary particle diameter is obtained by measuring particle diameters (equivalent circle diameters) of any 1,000 primary particles selected from an image captured using a transmission electron microscope TEM2010 (pressurization voltage: 200 kV) manufactured by JEOL Ltd., and arithmetically averaging the values. Incidentally, the equivalent circle diameter is a diameter of a circle assuming a true circle having the same projected area as a projected area of a particle at the time of observation.

It should be noted that in a case where a commercially available product is used as the colloidal silica, a catalog value is preferentially adopted as the average primary particle diameter of the colloidal silica.

An average aspect ratio of the colloidal silica is preferably 1.5 to 2.0, more preferably 1.55 to 1.95, and still more preferably 1.6 to 1.9 from the viewpoint where a polishing power is improved.

The average aspect ratio of the colloidal silica is obtained by measuring a major diameter and a minor diameter for every arbitrary 100 particles observed with the above-mentioned transmission electron microscope to calculate aspect ratios (major diameter/minor diameter) of the respective particles, and arithmetically averaging the aspect ratios of the 100 particles. Incidentally, the major diameter of a particle means a length of the particle in a major axis direction, and the minor diameter of a particle means a length of the particle in a direction orthogonal to the major axis direction of the particle.

It should be noted that in a case where a commercially available product is used as the colloidal silica, a catalog value is preferentially adopted as the average aspect ratio of the colloidal silica.

A degree of association of the colloidal silica is preferably 1 to 3 from the viewpoint that the polishing speed is further increased.

In the present specification, the degree of association is determined by an equation: Degree of association=Average secondary particle diameter/Average primary particle diameter. An average secondary particle diameter corresponds to an average particle diameter (equivalent circle diameter) of secondary particles in an aggregated state, and can be determined by the same method as for the average primary particle diameter.

It should be noted that in a case where a commercially available product is used as the colloidal silica, a catalog value is preferentially adopted as the degree of association of the colloidal silica.

The colloidal silica may have a surface modifying group (a sulfonic acid group, a phosphonic acid group, and/or a carboxylic acid group, and the like) on the surface.

Incidentally, the group may be ionized in the polishing liquid.

A method for obtaining colloidal silica having a surface modifying group is not particularly limited, and examples thereof include the method described in JP2010-269985A.

As the colloidal silica, a commercially available product may be used, and examples thereof include PL1, PL3, PL7, PL10H, PL1D, PL07D, PL2D, and PL3D (all of which are product names, manufactured by Fuso Chemical Co., Ltd.).

The upper limit value of a content of the colloidal silica is preferably 15.0% by mass or less, more preferably 10.0% by mass or less, and still more preferably 5.0% by mass or less with respect to the total mass (100% by mass) of the present polishing liquid from the viewpoint that the effect of the present invention is more excellent. The lower limit value is preferably 0.01% by mass or more, and more preferably 0.05% by mass or more with respect to the total mass of the present polishing liquid.

Incidentally, in a case where the present polishing liquid is used for polishing and removing a bulk layer which will be described later, the upper limit value of the content of colloidal silica is preferably 0.5% by mass or less, and more preferably 0.25% by mass or less with respect to the total mass of the present polishing liquid.

In addition, in a case where the present polishing liquid is used for polishing and removing a barrier layer which will be described later, the lower limit value of the content of colloidal silica is preferably 1.0% by mass or more, and more preferably 2.0% by mass or more with respect to the total mass of the present polishing liquid.

The colloidal silica may be used alone or in combination of two or more kinds thereof. In a case where two or more kinds of the colloidal silica are used, a total content thereof is preferably within the range.

A suitable range of the content of the abrasive grains in the polishing liquid is the same as the suitable range of the content of the colloidal silica described above.

<Nitrogen-Containing Aromatic Heterocyclic Compound>

The present polishing liquid includes a nitrogen-containing aromatic heterocyclic compound. The nitrogen-containing aromatic heterocyclic compound is a compound having a heterocyclic structure having aromaticity in the molecule.

The present polishing liquid includes at least a nitrogen-containing aromatic heterocyclic compound (1) (hereinafter also simply referred to as a "compound (1)") and a nitrogen-containing aromatic heterocyclic compound (2) (hereinafter also simply referred to as a "compound (2)") different from the nitrogen-containing aromatic heterocyclic compound (1) as the nitrogen-containing aromatic heterocyclic compound.

The compound (1) and the compound (2) are two selected from the group consisting of a compound represented by General Formula (I), a compound represented by General Formula (II), and a compound represented by General Formula (III), or two selected from the group consisting of a compound represented by General Formula (IV) and a compound represented by General Formula (V).

The compounds represented by General Formulae (I) to (V) will be described below.

(Compound Represented by General Formula (I))

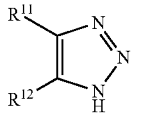

(I)

In General Formula (I), $R^{11}$ and $R^{12}$ each independently represent a hydrogen atom or a substituted or unsubstituted hydrocarbon group. In addition, $R^{11}$ and $R^{12}$ may be bonded to each other to form a ring.

In General Formula (I), examples of the hydrocarbon group represented by each of $R^{11}$ and $R^{12}$ include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 18 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

In addition, the hydrocarbon group represented by each of $R^{11}$ and $R^{12}$ may have a substituent. Examples of the substituent include an alkyl group (preferably having 1 to 12 carbon atoms, more preferably having 1 to 6 carbon atoms, and still more preferably having 1 to 3 carbon atoms), an aryl group (preferably having 6 to 18 carbon atoms, more preferably having 6 to 14 carbon atoms, and still more preferably having 6 to 10 carbon atoms), a hydroxyl group, a carboxyl group, and —$N(R_a)(R_b)$. $R_a$ and $R_b$ each independently represent a hydrogen atom or an organic group. As the organic group, an alkyl group (for example, having 1 to 12 carbon atoms, preferably having 1 to 6 carbon atoms, and more preferably having 1 to 4 carbon atoms), or a hydroxyalkyl group (for example, having 1 to 12 carbon atoms, preferably having 1 to 6 carbon atoms, and more preferably having 1 to 4 carbon atoms) is preferable.

The ring formed by bonding $R^{11}$ and $R^{12}$ to each other is not particularly limited, but is preferably an aromatic ring (which may be either a monocyclic ring or a polycyclic ring), and more preferably a benzene ring. Further, the ring formed by bonding $R^{11}$ and $R^{12}$ to each other may have a substituent. The substituent is not particularly limited, but examples thereof include those exemplified as the substituent of the hydrocarbon group represented by each of $R^{11}$ and $R^{12}$.

The compound represented by General Formula (I) preferably has a benzotriazole skeleton having a structure in which $R^{11}$ and $R^{12}$ are bonded to each other to form a benzene ring, and more preferably has a benzotriazole skeleton having a substituent on a benzene ring, which is formed by bonding $R^{11}$ and $R^{12}$.

Furthermore, in the present specification, the compound represented by General Formula (I) shall include a tautomer thereof.

(Compound Represented by General Formula (II))

(II)

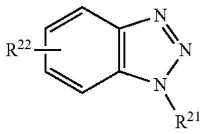

In General Formula (II), $R^{21}$ and $R^{22}$ independently represent a hydrogen atom, a hydroxyl group, or a substituted or unsubstituted hydrocarbon group. It should be noted that in a case where $R^{21}$ is the hydrogen atom, $R^{22}$ represents the substituted or unsubstituted hydrocarbon group.

In General Formula (II), the substituted or unsubstituted hydrocarbon group represented by each of $R^{21}$ and $R^{22}$ has the same definition as the substituted or unsubstituted hydrocarbon group represented by each of $R^{11}$ and $R^{12}$.

As the hydrocarbon group represented by $R^{21}$, among those, the alkyl group (preferably having 1 to 12 carbon atoms, more preferably having 1 to 6 carbon atoms, and still more preferably having 1 to 3 carbon atoms) or the aryl group (preferably having 6 to 18 carbon atoms, more preferably having 6 to 14 carbon atoms, and still more preferably having 6 to 10 carbon atoms) is preferable. Incidentally, the hydrocarbon group represented by $R^{21}$ may have a substituent. Examples of the substituent include those exemplified as the substituent of the hydrocarbon group represented by each of $R^{11}$ and $R^{12}$.

As the hydrocarbon group represented by $R^{22}$, the alkyl group (preferably having 1 to 12 carbon atoms, more preferably having 1 to 6 carbon atoms, still more preferably having 1 to 3 carbon atoms) is preferable. Incidentally, the hydrocarbon group represented by $R^{22}$ may have a substituent. Examples of the substituent include those exemplified as the substituent of the hydrocarbon represented by each of $R^{11}$ and $R^{12}$.

In addition, in a case where the present polishing liquid includes the compound represented by General Formula (I) as one of the compounds (1) and (2), and includes the compound represented by General Formula (II) as the other of the compounds (1) and (2), in which $R^{11}$ and $R^{12}$ in General Formula (I) are bonded to each other to form a benzene ring and the benzene ring has a substituent, $R_{22}$ in a case where $R^{21}$ is a hydrogen atom in the compound represented by General Formula (II) represents a group different from the substituent. At this time, it is preferable that the carbon number of $R^{22}$ is larger than that of the substituent.

(Compound Represented by General Formula (III))

(III)

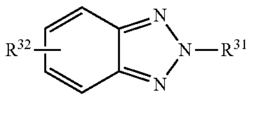

In General Formula (III), $R^{31}$ represents a substituted or unsubstituted hydrocarbon group.

In addition, $R^{32}$ represents a hydrogen atom or a substituted or unsubstituted hydrocarbon group.

In General Formula (III), the substituted or unsubstituted hydrocarbon group represented by $R^{31}$ has the same definition as the substituted or unsubstituted hydrocarbon group represented by $R^{21}$, and a suitable aspect thereof is also the same.

In addition, $R^{32}$ has the same definition as $R^{22}$ in General Formula (II), and a suitable aspect thereof is also the same.

(Compound Represented by General Formula (IV))

(IV)

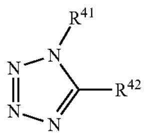

In General Formula (IV), $R^{41}$ represents a hydrogen atom. $R^{42}$ represents a hydrogen atom, a hydroxyl group, a mercapto group, or an amino group. $R^{42}$ is preferably the hydrogen atom or the amino group, and more preferably the hydrogen atom.

(Compound Represented by General Formula (V))

(V)

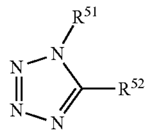

In General Formula (V), $R^{51}$ and $R^{52}$ each independently represent a hydrogen atom or a substituted or unsubstituted hydrocarbon group. It should be noted that at least one of $R^{51}$ or $R^{52}$ represents the substituted or unsubstituted hydrocarbon group.

The substituted or unsubstituted hydrocarbon group represented by each of $R^{51}$ and $R^{52}$ has the same definition as the substituted or unsubstituted hydrocarbon group represented by each of $R^{11}$ and $R^{12}$.

As the hydrocarbon group represented by each of $R^{51}$ and $R^{52}$, among those, the aryl group (preferably having 6 to 18 carbon atoms, more preferably having 6 to 14 carbon atoms, and still more preferably having 6 to 10 carbon atoms) which may be substituted with an alkyl group (preferably having 1 to 12 carbon atoms, more preferably having 1 to 6 carbon atoms, and still more preferably having 1 to 3 carbon atoms) is preferable.

Specific examples of the nitrogen-containing aromatic heterocyclic compound are shown below, but the present invention is not limited thereto.

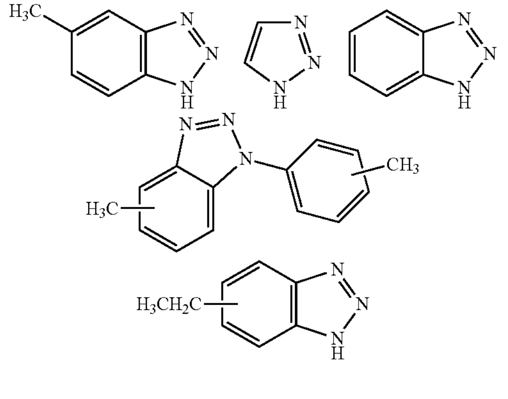

-continued

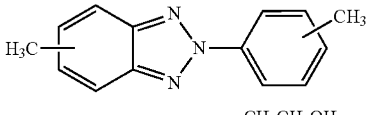

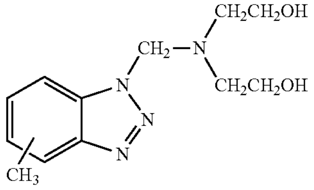

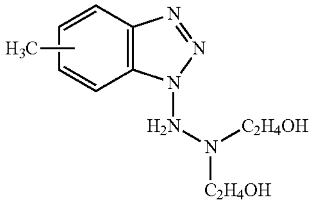

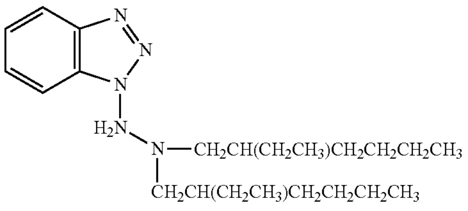

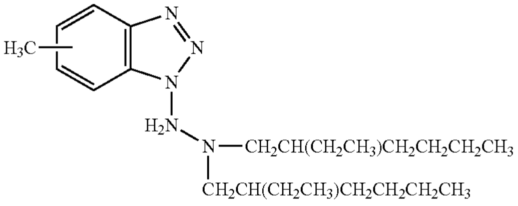

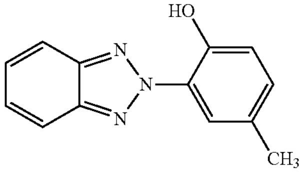

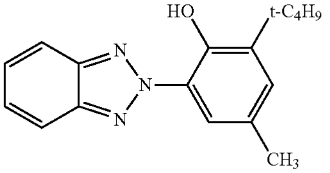

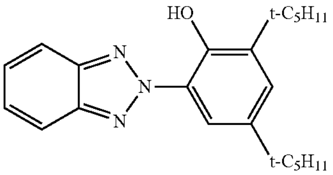

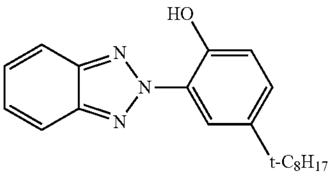

-continued

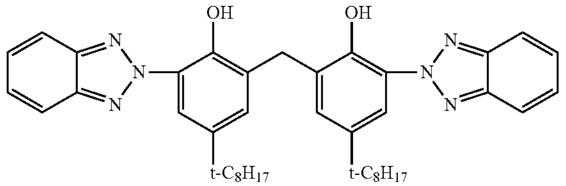

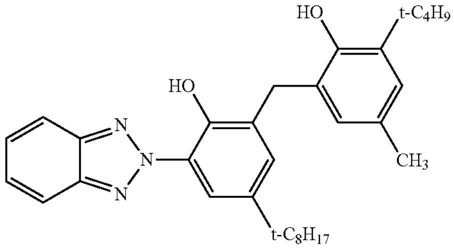

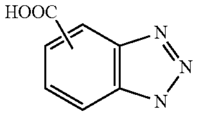

In addition, examples of the compound represented by General Formula (I) or General Formula (II) and having a benzotriazole skeleton include benzotriazole, 5-methyl-1H-benzotriazole, 5-aminobenzotriazole, 1-hydroxybenzotriazole, 5,6-dimethylbenzotriazole, 1-[N,N-bis(hydroxyethyl) aminoethyl]benzotriazole, 1-(1,2-dicarboxyethyl) benzotriazole, tolyltriazole, 1-[N,N-bis(2-ethylhexyl) aminomethyl]benzotriazole, 1-[N,N-bis(2-ethylhexyl) aminomethyl]methylbenzotriazole, 2,2'-{[(methyl-1H-benzotriazol-1-yl)methyl]imino}bisethanol, and carboxybenzotriazole.

Examples of suitable aspects of the present polishing liquid include an aspect in which the compound (1) is at least one selected from the group consisting of the compound represented by General Formula (I), the compound represented by General Formula (II), and the compound represented by General Formula (IV).

Examples of more suitable aspects of the present polishing liquid include an aspect in which the compound (1) is the compound represented by General Formula (I) or the compound represented by General Formula (II), an aspect in which the compound (2) is the compound represented by General Formula (I), the compound represented by General Formula (II), or the compound represented by General Formula (III), and an aspect in which the compound (1) is the compound represented by General Formula (IV) and the compound (2) is the compound represented by General Formula (V).

In a case where the compound (1) is the compound represented by General Formula (I) or the compound represented by General Formula (II), the compound (1) is preferably benzotriazole, 5-methyl-1H-benzotriazole, 5-aminobenzotriazole, 1-hydroxybenzotriazole, or 5,6-dimethylbenzotriazole, and more preferably benzotriazole, 5-methyl-1H-benzotriazole, or 1-hydroxybenzotriazole.

In addition, in a case where the compound (1) is the compound represented by General Formula (I) or the compound represented by General Formula (II), it is preferable that the compound (2) is the compound represented by General Formula (II), in which $R^{21}$ represents a hydroxyl group or a substituted or unsubstituted aryl group (more preferably a phenyl group which may be substituted with an alkyl group) and $R^{22}$ represents an alkyl group, or the compound represented by General Formula (III), in which $R^{31}$ is a substituted or unsubstituted aryl group (more preferably a phenyl group which may be substituted with an alkyl group) and $R^{32}$ represents an alkyl group.

In a case where the compound (1) is the compound represented by General Formula (IV), the compound (1) is preferably tetrazole or 5-aminotetrazole, and more preferably tetrazole.

In a case where the compound (1) is the compound represented by General Formula (IV), it is preferable that the compound (2) is 1-alkyl-substituted phenyltetrazole (tetrazole in which a phenyl group substituted with an alkyl group is substituted at the 1-position) or 5-alkyl-substituted phenyltetrazole (tetrazole in which a phenyl group substituted with an alkyl group is substituted at the 5-position).

The compounds (1) may be used alone or in combination of two or more kinds thereof. In addition, the compounds (2) may be used alone or in combination of two or more kinds thereof.

A mass ratio (content of the compound (1)/content of the compound (2)) (a total content of the compounds (1) in a case where a plurality of the compounds (1) are present) of the content of the compound (1) to the content of the compound (2) (a total content of the compounds (2) in a case where a plurality of the compounds (2) are present) in the present polishing liquid is preferably 1 or more, more preferably 5 or more, still more preferably 30 or more, and particularly preferably 100 or more from the viewpoint that the effect of the present invention is more excellent. The upper limit of the mass ratio is not particularly limited, but is preferably 100,000 or less, more preferably 30,000 or less, still more preferably 20,000 or less, particularly preferably 15,000 or less, and most preferably 3,000 or less from the viewpoint that the polishing speed is excellent.

The content of the compound (1) (a total content of the compounds (1) in a case where a plurality of the compounds (1) are present) in the present polishing liquid is preferably 0.0001% to 1% by mass, more preferably 0.0005% to 0.3% by mass, and still more preferably 0.003% to 0.1% by mass with respect to the total mass of the polishing liquid.

The content of the compound (2) (a total content of the compounds (2) in a case where a plurality of the compounds (2) are present) in the present polishing liquid is preferably 0.001 to 1,000 ppm by mass, more preferably 0.001 to 100 ppm by mass, still more preferably 0.005 to 3 ppm by ppm, and particularly preferably 0.01 to 1 ppm by mass with respect to the total mass of the polishing liquid.

(Nitrogen-Containing Aromatic Heterocyclic Compound (3))

The present polishing liquid preferably includes a nitrogen-containing aromatic heterocyclic compound (3) (hereinafter simply referred to as a "compound (3)") other than the compounds represented by General Formulae (I) to (V) from the viewpoint that the effect of the present invention is excellent. In addition, the present polishing liquid preferably includes the compound (3) from the viewpoint that the polishing speed is excellent in a case where the polishing liquid is used for polishing and removing a bulk layer.

Examples of the compound (3) include an azole compound, a pyridine compound, a pyrazine compound, a pyrimidine compound, and a piperazine compound, other than the compounds represented by General Formulae (I) to (V).

Examples of the azole compound other than the compounds represented by General Formulae (I) to (V) include an imidazole compound in which one of the atoms constituting an azole ring is a nitrogen atom, a pyrazole compound in which two of the atoms constituting an azole ring is a nitrogen atom, a thiazole compound in which one of the atoms constituting an azole ring is a nitrogen atom and the other one is a sulfur atom, and a 1,2,4-triazole compound having a 1,2,4-triazole ring structure.

All of these azole compounds may have substituents on the hetero-5-membered ring.

Specific examples of the 1,2,4-triazole compound include 1,2,4-triazole, 3-methyl-1,2,4-triazole, and 3-amino-1,2,4-triazole.

The pyridine compound is a compound having a hetero-6-membered ring (pyridine ring), including one nitrogen atom and having aromaticity.

The pyrazine compound is a compound having aromaticity and having a hetero-6-membered ring (pyrazine ring) including two nitrogen atoms located at the para positions, and the pyrimidine compound is a compound having aromaticity and having a hetero-6-membered ring (pyrimidine ring) including two nitrogen atoms located at the meta positions.

The piperazine compound is a compound having a hetero-6-membered ring (piperazine ring) in which the opposite —CH— group of a cyclohexane ring is substituted with a nitrogen atom.

In addition, the pyridine compound, the pyrazine compound, the pyrimidine compound, and the piperazine compound may each have a substituent on the hetero-6-membered ring.

The present polishing liquid preferably includes a 1,2,4-triazole compound as the compound (3), and more preferably includes 1,2,4-triazole, from the viewpoint that the effect of the present invention is more excellent.

A content of the compound (3) (a total content of the compounds (3) in a case where a plurality of the compounds (3) are present) in the present polishing liquid is preferably 0.001% to 10% by mass, more preferably 0.01% to 3% by mass, and still more preferably 0.1% to 1% by mass with respect to the total mass of the polishing liquid.

<Hydrogen Peroxide>

The present polishing liquid includes hydrogen peroxide ($H_2O_2$).

A content of hydrogen peroxide is preferably 0.1% to 10.0% by mass, more preferably 0.2% to 5.0% by mass, and still more preferably 0.5% to 3.0% by mass with respect to the total mass of the present polishing liquid.

<Water>

It is preferable that the present polishing liquid contains water. The water contained in the present polishing liquid is not particularly limited, and examples thereof include ion exchange water and pure water.

A content of water is preferably 90% to 99% by mass with respect to the total mass of the present polishing liquid.

<Organic Solvent>

It is also preferable that the present polishing liquid includes an organic solvent.

The organic solvent is preferably a water-soluble organic solvent.

Examples of the organic solvent include ketone-based solvents, ether-based solvents, alcohol-based solvents, glycol-based solvents, glycol ether-based solvents, and amide-based solvents.

More specific examples thereof include acetone, methyl ethyl ketone, tetrahydrofuran, dioxane, dimethylacetamide, N-methylpyrrolidone, dimethylsulfoxide, acetonitrile, methanol, ethanol, 1-propanol, 2-propanol, 1-butanol, ethylene glycol, propylene glycol, and ethoxyethanol.

Among those, ethylene glycol is preferable.

In a case where the present polishing liquid includes the organic solvent, a content of the organic solvent is preferably 0.001% to 10% by mass, more preferably 0.005% to 5% by mass, and still more preferably 0.01% to 1% by mass with respect to the total mass of the present polishing liquid from the viewpoint that a balance of the performance of the polishing liquid is excellent.

The organic solvents may be used alone or in combination of two or more kinds thereof. In a case where two or more kinds of the organic solvents are used in combination, a total content thereof is preferably within the range.

<Passivation Film Forming Agent>

It is preferable that the present polishing liquid includes a passivation film forming agent.

The present polishing liquid including the passivation film forming agent is preferable from the viewpoint that the polishing speed is excellent in a case where the present polishing liquid is used for polishing and removing a bulk layer, and the suppression of erosion (phenomenon in which portions other than a wiring line are partially scraped in a case where the wiring line is formed by CMP) is excellent in a case where the present polishing liquid is used for polishing and removing a barrier layer.

The passivation film forming agent used in the present polishing liquid is not particularly limited, but is preferably one or more passivation film forming agents selected from the group consisting of the compound represented by General Formula (1) and the compound represented by General Formula (2).

(1)

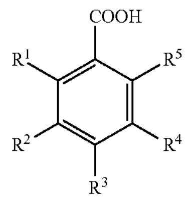

(2)

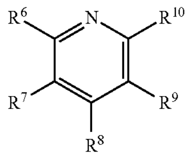

in General Formula (1), $R^1$ to $R^5$ each independently represent a hydrogen atom or a substituent.

Examples of the substituent include an alkyl group (which may be linear or branched, and preferably has 1 to 6 carbon atoms), a nitro group, an amino group, a hydroxyl group, and a carboxylic acid group.

Two adjacent groups in $R^1$ to $R^5$ may be bonded to each other to form a ring.

Examples of the ring formed by bonding two adjacent groups of $R^1$ to $R^5$ to each other include an aromatic ring (which may be a monocyclic ring or a polycyclic ring, and is preferably a benzene ring or a pyridine ring). The ring (preferably an aromatic ring, and more preferably a benzene ring or a pyridine ring) may further have a substituent.

In General Formula (2), $R^6$ to $R^{10}$ each independently represent a hydrogen atom or a substituent.

Examples of the substituent include an alkyl group (which may be linear or branched, and preferably has 1 to 6 carbon atoms), a nitro group, an amino group, a hydroxyl group, and a carboxylic acid group.

Two adjacent groups in $R^6$ to $R^{10}$ may be bonded to each other to form a ring.

Examples of the ring formed by bonding two adjacent groups of $R^6$ to $R^{10}$ to each other include an aromatic ring (which may be a monocyclic ring or a polycyclic ring, and is preferably a benzene ring or a pyridine ring). The ring (preferably an aromatic ring, and more preferably a benzene ring or a pyridine ring) may further have a substituent.

A C log P value of the passivation film forming agent used in the present polishing liquid is not particularly limited, but is preferably 1.0 or more, more preferably 1.0 to 6.0, and still more preferably 1.0 to 3.8.

The passivation film forming agent having a C log P value of 1.0 or more has an excellent polishing speed in a case where the present polishing liquid is used for polishing and removing the bulk layer, and has excellent suppression of erosion in a case where the present polishing liquid is used for polishing and removing the barrier layer.

The passivation film forming agent is preferably one or more selected from the group consisting of 4-methylphthalic acid, 4-nitrophthalic acid, salicylic acid, 4-methylsalicylic acid, anthranilic acid, 4-methylbenzoic acid, 4-tert-butylbenzoic acid, 4-propylbenzoic acid, 1,4,5,8-naphthalenetetracarboxylic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline, and from the effect of the present invention is more excellent, 1,4,5,8-naphthalenetetracarboxylic acid or 6-hydroxy-2-naphthalenecarboxylic acid is more preferable.

In addition, it is preferable that the present polishing liquid includes both the compound (3) and the passivation film forming agent from the viewpoint that in a case where the present polishing liquid is used for polishing and removing the bulk layer, the effect of the present invention is more excellent and a polishing speed is excellent.

A content of the passivation film forming agent is preferably 0.001% to 5.0% by mass, more preferably 0.01% to 1.0% by mass, and still more preferably 0.01% to 0.3% by mass with respect to the total mass of the present polishing liquid from the viewpoint that the effect of the present invention is more excellent.

The passivation film forming agents may be used alone or in combination of two or more kinds thereof. In a case where two or more kinds of the passivation film forming agents are used, a total content thereof is preferably within the range.

<Anionic Surfactant>

It is also preferable that the present polishing liquid includes an anionic surfactant.

In particular, in a case where the present polishing liquid is used for polishing and removing the barrier layer, it is preferable that the present polishing liquid includes an anionic surfactant from the viewpoint that the suppression of erosion is excellent.

In the present specification, the anionic surfactant is not particularly limited, but typically means an anionic compound having a hydrophilic group and a lipophilic group in the molecule, in which the hydrophilic group portion is dissociated in an aqueous solution to serve as an anion or have an anionic property. Here, the anionic surfactant may be present as an acid accompanied by a hydrogen atom, may be a dissociated anion, or may be a salt thereof. As long as the surfactant is anionic, it may be non-dissociative and includes an acid ester and the like.

The anionic surfactant is preferably an anionic surfactant having one or more anionic groups selected from the group consisting of a carboxylic acid group, a sulfonic acid group, a phosphoric acid group, a phosphonic acid group, a sulfuric acid ester group, a phosphoric acid ester group, and a group which is a salt thereof.

In other words, the anionic anion is preferably an anionic surfactant having one or more anions selected from the group consisting of a carboxylate anion (—$COO^-$), a sulfonate anion (—$SO_3^-$), a phosphate anion (—$OPO_3H^-$, —$OPO_3^{2-}$), a phosphonate anion (—$PO_3H^-$, —$PO_3^{2-}$), a sulfuric acid ester anion (—$OSO_3$), a phosphoric acid ester anion (*—O—P(═O)$O^-$—O—*, in which * represents a bonding position with an atom other than a hydrogen atom), in the present polishing liquid.

In addition, the anionic surfactant preferably has two or more of the anionic groups in the present polishing liquid. In this case, the two or more anionic groups which are present may be the same as or different from each other.

Examples of the anionic surfactant include a sulfonic acid compound, an alkyl sulfuric acid ester, an alkyl sulfonic acid, an alkylbenzenesulfonic acid (preferably having 8 to 20 carbon atoms), an alkylnaphthalenesulfonic acid, an alkyldiphenyl ether sulfonic acid, a polyoxyethylene alkyl ether carboxylic acid, a polyoxyethylene alkyl ether acetic acid, a polyoxyethylene alkyl ether propionic acid, an alkyl phosphate, and a salt thereof. Examples of the "salt" include an ammonium salt, a sodium salt, a potassium salt, a trimethylammonium salt, and a triethanolamine salt.

A C log P value of the anionic surfactant is preferably 1.00 to 15.00, and more preferably 2.50 to 10.00.

In a case where the present polishing liquid includes the anionic surfactant, a content of the anionic surfactant is preferably 0.0005% to 5.0% by mass, and more preferably 0.001% to 0.5% by mass with respect to the total mass of the present polishing liquid from the viewpoint that the effect of the present invention is more excellent.

The anionic surfactants may be used alone or in combination of two or more kinds thereof. In a case where two or more kinds of the anionic surfactants are used, a total content thereof is preferably within the range.

It is preferable that the present polishing liquid includes both the passivation film forming agent and the anionic surfactant from the viewpoint that the effect of the present invention is more excellent.

In a case where the present polishing liquid includes the passivation film forming agent and the anionic surfactant, a mass ratio (content of the passivation film forming agent/content of the anionic surfactant) of the content of the passivation film forming agent to the content of the anionic surfactant is preferably 500 or less, more preferably less than 300, still more preferably less than 200, and particularly preferably less than 150 from the viewpoint that the effect of the present invention is more excellent. The lower limit of the mass ratio of the content of the passivation film forming agent to the content of the anionic surfactant is not particularly limited, but is preferably 0.001 or more, and more preferably more than 0.01.

In addition, a value of a difference (C log P value of the anionic surfactant−C log P value of the passivation film forming agent) obtained by subtracting the C log P value of the passivation film forming agent from the C log P value of the anionic surfactant is preferably 1.00 to 12.00, more preferably more than 2.00 and less than 8.00, and still more preferably 2.50 to 6.00.

That is, with regard to the present polishing liquid, it is preferable to satisfy "C log P value of passivation film forming agent+1.00≤C log P value of anionic surfactant≤C log P value of passivation film forming agent+12.00", and It is more preferable to satisfy "C log P value of passivation film forming agent+2.00<C log P value of anionic surfactant<C log P value of passivation film forming agent+8.00".

In a case where the present polishing liquid includes two or more kinds of the passivation film forming agents and/or the anionic surfactants, it is preferable that a combination of at least one set of a passivation film forming agent and an anionic surfactant (preferably a combination of a passivation film forming agent with the highest content and an anionic surfactant with the highest content) satisfies the range of the values of the difference.

In addition, in a case where the present polishing liquid is used for polishing and removing the barrier layer, it is preferable that the present polishing liquid includes both the compound (3) and the anionic surfactant from the viewpoint that the effect of the present invention is more excellent.

<Organic Acid>

The present polishing liquid may include an organic acid.

The organic acid is preferably a compound different from the passivation film forming agent, and more specifically, it is preferable that the organic acid does not correspond to the compound represented by General Formula (1) and the compound represented by General Formula (2). In addition, the organic acid is preferably a compound different from the surfactant (particularly the anionic surfactant).

As the organic acid included in the present polishing liquid polishing liquid, one or more organic acids selected from the group consisting of glycine, alanine, sarcosine, iminodiacetic acid, polycarboxylic acid, and polyphosphonic acid are preferable from the viewpoint that the effects of the present invention are more excellent. Alanine may be either α-alanine (2-aminopropionic acid) or β-alanine (3-aminopropionic acid), and 3-alanine is preferable.

The polycarboxylic acid is a compound having two or more carboxylic acid groups in one molecule, and the polyphosphonic acid is a compound having two or more phosphonic acid groups in one molecule.

Examples of the polycarboxylic acid include citric acid, malonic acid, maleic acid, and succinic acid.

Examples of the polyphosphonic acid include etidronic acid and ethylenediaminetetramethylenephosphonic acid.

The organic acids may be used alone or in combination of two or more kinds thereof.

Examples of a combination of the two or more kinds used include a combination of glycine and alanine, a combination of glycine and sarcosine, a combination of citric acid and malonic acid, and a combination of malonic acid and ethylenediaminetetramethylenephosphonic acid.

In a case where two or more kinds of the organic acids are used, a mass ratio (content of the organic acid with the second highest content/content of the organic acid with the highest content) of an content of the organic acid with the second highest content to a content of the organic acid with the highest content is preferably 0.1 to 1.0, and more preferably 0.2 to 1.0. Incidentally, the content of the organic acid with the highest content may be substantially the same as the content of the organic acid with the second highest content.

From the viewpoint that the polishing speed is excellent, the present polishing liquid preferably includes one or more compounds (hereinafter also referred to as "specific compounds") selected from the group consisting of glycine, alanine, sarcosine, and iminodiacetic acid, and in particular, in a case where the polishing liquid is used for polishing and removing a bulk layer which will be described later, the present polishing liquid preferably includes the specific compound.

The lower limit value of the content of the specific compound is not particularly limited, but is preferably 0.1% by mass or more, and more preferably 0.6% by mass or more with respect to the total mass of the present polishing liquid from the viewpoint that the polishing speed is more excellent.

The upper limit value of the content is not particularly limited, but is preferably 10.0% by mass or less, and more preferably 4.0% by mass or less with respect to the total mass of the present polishing liquid from the viewpoint that the effect of the present invention is more excellent.

In a case where two or more kinds of the specific compounds are used, a total content thereof is preferably within the range.

A mass ratio (content of the specific compound/content of the compound (2)) of the content of the specific compound (a total content of the compounds in a case where a plurality of the specific compounds are present) to the content of the compound (2) (a total content of the compounds (2) in a case where a plurality of the compounds (2) are present) in the present polishing liquid is preferably 1,000 or more, more preferably 10,000 or more, and still more preferably 100,000 or more from the viewpoint that the polishing speed is more excellent. The upper limit of the mass ratio is not particularly limited, but is preferably 100,000,000 ($1\times10^8$) or less, more preferably 10,000,000 ($1\times10^7$) or less, and still more preferably 3,000,000 ($3\times10^6$) or less from the viewpoint that the effect of the present invention is more excellent.

It is preferable that the present polishing liquid includes one or more organic acids (hereinafter also referred to as "specific organic acids") selected from the group consisting of polycarboxylic acid and polyphosphonic acid from the viewpoint that the effect of the present invention is more excellent. In particular, in a case where the present polishing liquid having a pH of 7.8 to 10.5 is used for polishing and removing a barrier layer which will be described later, it is preferable that the present polishing liquid includes the specific organic acid from the viewpoints that the effect of the present invention is more excellent and the erosion can be further suppressed.

In this case, it is more preferable that two or more kinds of the specific organic acids are used. The combination of two or more kinds of the specific organic acids is as described above.

The content of the specific organic acid is preferably 0.001% to 5% by mass, and more preferably 0.1% to 1.5% by mass with respect to a total mass of the present polishing liquid.

In a case where two or more kinds of the specific organic acids are used, a total content thereof is preferably within the range.

A mass ratio (content of the specific organic acid/content of the compound (2)) of the content of the specific organic acid to the content of the compound (2) (a total content of the compounds (2) in a case where a plurality of the compounds (2) are present) in the present polishing liquid is preferably 400 or more, more preferably 1,000 or more, and still more preferably 10,000 or more from the viewpoint that the effect of the present invention is more excellent. The upper limit of the mass ratio is not particularly limited, but is preferably 10,000,000 or less, more preferably 1,000,000 or less, and still more preferably 500,000 or less from the viewpoint that the erosion can be further suppressed.

<Polymer Compound>

The present polishing liquid preferably includes a polymer compound, and more preferably includes an anionic polymer compound from the viewpoint that the effect of the present invention is more excellent.

In particular, in a case where the present polishing liquid having a pH of 2.0 to 4.5 is used for polishing and removing a barrier layer which will be described later, it is preferable that the present polishing liquid includes an anionic polymer compound.

Examples of the anionic polymer compound include a polymer having a monomer having a carboxyl group as a basic constitutional unit and a salt thereof, and a copolymer including them. More specific examples of the anionic polymer compound include a polyacrylic acid and a salt thereof, and a copolymer including them; a polymethacrylic acid and a salt thereof, and a copolymer including them; a polyamic acid and a salt thereof, and a copolymer including them; and polycarboxylic acids such as polymaleic acid, polyitaconic acid, polyfumaric acid, poly(p-styrenecarboxylic acid), and polyglioxylic acid, and a salt thereof, and a copolymer including them.

Among those, at least one selected from the group consisting of a copolymer including polyacrylic acid, polymethacrylic acid, polyacrylic acid and polymethacrylic acid, and a salt thereof is preferably included.

Incidentally, the anionic polymer compound may be ionized in the polishing liquid.

A weight-average molecular weight of the polymer compound is preferably 500 to 100,000, and more preferably 5,000 to 50,000.

The weight-average molecular weight of the polymer compound is a polystyrene-equivalent value obtained by a gel permeation chromatography (GPC) method. The GPC method is based on a method using HLC-8020GPC (manufactured by Tosoh Corporation), and using TSKgel SuperHZM-H, TSKgel SuperHZ4000, and TSKgel SuperHZ2000 (manufactured by Tosoh Corporation, 4.6 mm ID×15 cm) as columns and tetrahydrofuran (THF) as an eluent.

The lower limit value of the content of the polymer compound is preferably 0.01% by mass or more, and more preferably 0.1% by mass or more with respect to the total mass of the present polishing liquid from the viewpoint that the effect of the present invention is more excellent.

The upper limit value of the content of the polymer compound is preferably 10.0% by mass or less, more preferably 5.0% by mass or less, and still more preferably 3.0% by mass or less with respect to the total mass of the present polishing liquid from the viewpoint that the occurrence of defects on a surface to be polished can be further suppressed.

Furthermore, the polymer compounds may be used alone or in combination of two or more kinds thereof. In a case where two or more kinds of the polymer compounds are used in combination, a total content thereof is preferably within the range.

<Cationic Compound>

It is preferable that the present polishing liquid includes a cationic compound.

In particular, in a case where the present polishing liquid having a pH of 2.0 to 4.5 is used for polishing and removing a barrier layer which will be described later, it is preferable that the present polishing liquid includes the cationic compound from the viewpoint that the effect of the present invention is more excellent and the erosion can be further suppressed.

The central element of the cation (onium ion) included in the cationic compound is preferably a phosphorus atom or a nitrogen atom.

Examples of the cations having a nitrogen atom as the central element among the cations included in the cationic compound include ammonium such as tetramethylammonium, tetraethylammonium, tetrapropylammonium, tetrabutylammonium, tetrapentylammonium, tetraoctylammonium, ethyltrimethylammonium, and diethyldimethylammonium.

Examples of the cations having a phosphorus atom as the central element among the cations included in the cationic compound include phosphonium such as tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium.

The cation included in the cationic compound preferably has a symmetrical structure. Here, "having a symmetrical structure" means that the molecular structure corresponds to any of point symmetry, line symmetry, and rotational symmetry.

In addition, the cation included in the cationic compound is preferably a quaternary cation in which a hydrogen atom bonded to a central element is substituted with an atomic group other than the hydrogen atom. Examples of the quaternary cation include a quaternary ammonium cation and a quaternary phosphonium cation.

Examples of the anion constituting the cationic compound include a hydroxide ion, a chloride ion, a bromine ion, an iodide ion, and a fluorine ion, and the hydroxide ion is more preferable from the viewpoint that the occurrence of defects on a surface to be polished can be further suppressed.

The cationic compound may be ionized in the polishing liquid.

The cation included in the cationic compound is preferably a cation having a phosphorus atom or a nitrogen atom as a central element and 2 to 10 carbon atoms (preferably 3 to 8 carbon atoms, and more preferably 4 to 8 carbon atoms) bonded to the central element. As a result, the occurrence of defects on a surface to be polished can be further suppressed.

Here, specific examples of the group including 2 to 10 carbon atoms bonded to the central element include a linear, branched, or cyclic alkyl group, an aryl group which may be substituted with an alkyl group, a benzyl group, and an aralkyl group.

Specific examples of the cation having a phosphorus atom or a nitrogen atom as a central element and a group including 2 to 10 carbon atoms bonded to the central element include tetraethylammonium, tetrapropylammonium, tetrabutylammonium, tetrapentylammonium, tetraoctylammonium, tetraethylphosphonium, tetrapropylphosphonium, tetrabutylphosphonium, and tetraphenylphosphonium.

From the viewpoint that the occurrence of defects on a surface to be polished can be further suppressed, it is preferable that the cationic compound includes at least one selected from the group consisting of tetramethylammonium hydroxide (TMAH), tetraethylammonium hydroxide, tetrapropylammonium hydroxide, tetrabutylammonium hydroxide (TBAH), tetraoctylammonium hydroxide, 2-hydroxyethyltrimethylammonium hydroxide (choline), tetrabutylphosphonium hydroxide (TBPH), and tetrapropylphosphonium hydroxide (TPPH).

Among those, TBAH, TMAH, choline, TBPH, or TPPH is preferable, and TBAH is more preferable.

A content of the cationic compound is preferably more than 0.01% by mass, and more preferably 0.1% by mass or more with respect to the total mass of the present polishing liquid.

The upper limit value of the content of the cationic compound is preferably 5.0% by mass or less, and more preferably 3.0% by mass or less with respect to the total mass of the present polishing liquid.

The cationic compounds may be used alone or in combination of two or more kinds thereof. In a case where two or more kinds of the cationic compounds are used in combination, a total content thereof is preferably within the range.

<pH Adjuster>

In addition to the above-mentioned components, the present polishing liquid may include a pH adjuster for adjusting a pH to a predetermined range.

Examples of the pH adjuster for adjusting a pH to an acidic side include sulfuric acid, and examples of the pH adjuster for adjusting the pH to a basic side include tetramethylammonium hydroxide (TMAH), ammonia, and potassium hydroxide.

The pH adjuster may be an amount suitable for adjusting the pH to a predetermined pH.

The pH adjusters may be used alone or in combination of two or more kinds thereof.

<Other Components>

The present polishing liquid may include components (other components) other than the above-mentioned components as long as the above-mentioned effects of the present invention are not impaired.

Examples of other components include surfactants other than the above-mentioned surfactants, organic acids other than the above-mentioned organic acids, and particles other than colloidal silica.

[Physical Properties and the Like]

<pH>

A pH of the present polishing liquid is preferably 2.0 to 12.0.

In a case where the present polishing liquid is used for polishing and removing a bulk layer which will be described later, the pH of the present polishing liquid is preferably 5.5 or more; the pH is more preferably 6.0 or more from the viewpoint that the polishing speed is excellent; and the pH is still more preferably 6.8 or more from the viewpoint that the effect of the present invention and the polishing speed are more excellent. In a case where the present polishing liquid is used for polishing and removing the bulk layer, the pH of the present polishing liquid is preferably 8.0 or less; and the pH is more preferably 7.7 or less, and still more preferably 7.5 or less from the viewpoints that the effect of the present invention is more excellent and the polishing speed is excellent.

In addition, in a case where the present polishing liquid is used for polishing and removing a barrier layer which will be described later, the pH of the present polishing liquid is preferably 2.0 to 4.5 or 7.8 to 12.0.

The pH of the present polishing liquid is more preferably 8.0 or more from the viewpoint that the erosion suppressing property is excellent; and the pH is still more preferably 8.7 or more from the viewpoint that the effect of the present invention and the erosion suppressing property are more excellent. In addition, the pH is more preferably less than 10.5, and still more preferably 10.0 or less from the viewpoint that the effect of the present invention and the erosion suppressing property are more excellent.

On the other hand, the pH of the present polishing liquid is more preferably 2.2 or more from the viewpoint that the erosion suppressing property is excellent; and the pH is still more preferably 2.7 or more from the viewpoint that the effect of the present invention and the erosion suppressing property are more excellent. In addition, the pH is more preferably less than 4.0, and still more preferably 3.8 or less from the viewpoint that the effect of the present invention and the erosion suppressing property are more excellent.

<Ratio of Polishing Speed>

The present polishing liquid preferably has a particularly high polishing speed with respect to a cobalt-containing film.

In addition, the present polishing liquid preferably has a selectivity in a polishing speed, and the polishing speed is preferably slow except for a predetermined object to be polished (that is, a cobalt-containing film or the like).

For example, in a case where the object to be polished has a first layer which is a cobalt-containing film and a second layer (a barrier layer and/or an interlayer insulating film, and the like) other than a cobalt-containing film, a speed ratio (polishing speed of the first layer which is a cobalt-containing film/polishing speed of the second layer) of a polishing speed of the first layer which is a cobalt-containing film to a polishing speed of the second layer under the same polishing conditions is preferably more than 1 and 2,000 or less, and more preferably more than 20 and less than 1,000.

Incidentally, examples of the first layer include a cobalt-containing film which will be described later.

Furthermore, examples of the second layer include an interlayer insulating film which will be described later, and a barrier layer which will be described later. Specific examples of a materials constituting the second layer include tantalum (Ta), tantalum nitride (TaN), titanium nitride (TiN), titanium tungsten (TiW), tungsten (W), silicon nitride (SiN), tetraethoxysilane (TEOS), oxycarbide (SiOC), and silicon carbide (SiC), and one or more selected from the group consisting of Ta, TaN, TiN, SiN, TEOS, SiOC, and SiC are preferable.

[Method for Producing Polishing Liquid]

A method for producing the present polishing liquid is not particularly limited, and a known production method can be used.

For example, the present polishing liquid may be produced by mixing each of the above-mentioned components to have a predetermined concentration.

In order to remove impurities or coarse particles in the present polishing liquid, it is also preferable that raw materials used are subjected to a desalination treatment (filtration and the like) before mixing, or the mixture is subjected to a desalination treatment (filtration and the like.) after mixing the raw materials.

Moreover, the present polishing liquid adjusted to a high concentration (high-concentration polishing liquid) may be diluted to obtain the present polishing liquid having a desired formulation. The high-concentration polishing liquid is a mixture of which formulation is adjusted so that the present polishing liquid having a desired formulation can be produced by diluting with a solvent such as water.

The dilution ratio in a case of diluting the high-concentration polishing liquid is preferably 2 times or more, and more preferably 2 to 20 times, on a mass basis.

The concentration of solid contents of the high-concentration polishing liquid is preferably 5% by mass or more, and more preferably 5% to 50% by mass. It is preferable to dilute the high-concentration polishing liquid to obtain the present polishing liquid having a preferred concentration of solid contents (for example, 0.1% to 10% by mass, and more preferably 0.5% by mass or more and less than 5% by mass).

Incidentally, the solid contents are intended to be all components other than water, hydrogen peroxide, and the organic solvent in the present polishing liquid.

[Chemical Mechanical Polishing Method]

A chemical mechanical polishing method of an embodiment of the present invention (hereinafter also referred to as "the present CMP method") includes a step of obtaining an object to be polished, which has been polished, by bringing a surface to be polished of an object to be polished into contact with a polishing pad attached to a polishing platen while supplying the above-mentioned polishing liquid to the polishing pad, and relatively moving the object to be polished and the polishing pad to polish the surface to be polished.

<Object to be Polished>

An object to be polished to which the CMP method according to the embodiment can be applied is not particularly limited and includes an aspect in which the object to be polished has a film containing at least one metal selected from the group consisting of copper, an copper alloy, and cobalt as a wiring line metal element, and an aspect in which the object to be polished has a cobalt-containing film is preferable.

The cobalt-containing film only needs to include at least cobalt (Co) and may include other components. The state of cobalt in the cobalt-containing film is not particularly limited, and may be, for example, a simple substance or an alloy. Above all, the cobalt in the cobalt-containing film is preferably cobalt as the simple substance. A content of cobalt (preferably cobalt as a simple substance) in the cobalt-containing film is preferably 50% to 100% by mass, more preferably 80% to 100% by mass, and still more preferably 99% to 100% by mass with respect to a total mass of the cobalt-containing film.

An example of the object to be polished can be a substrate having a cobalt-containing film on the surface.

FIG. 1 is a schematic view showing an example of an object to be polished for which the present CMP method is carried out. FIG. 1 shows an upper part of a cross-section of the object to be polished.

An object 10*a* to be polished in FIG. 1 includes a substrate not shown in the drawing, an interlayer insulating film 16 having a groove (for example, a groove for a wiring line) arranged on the substrate, a barrier layer 14 arranged along the shape of the groove, and a cobalt-containing film 12 arranged so that the groove is filled therewith. The cobalt-containing film with which the groove is filled is arranged at a position higher than an opening of the groove to further overflow. Such a portion of the cobalt-containing film 12, which is formed at a position higher than the opening of the groove, is referred to as a bulk layer 18.

The present CMP method can be applied to a method of polishing a surface to be polished of the object 10*a* to be polished having the bulk layer 18, and removing the bulk layer 18. That is, the present polishing liquid can be used as a polishing liquid for a bulk.

Figure 2:
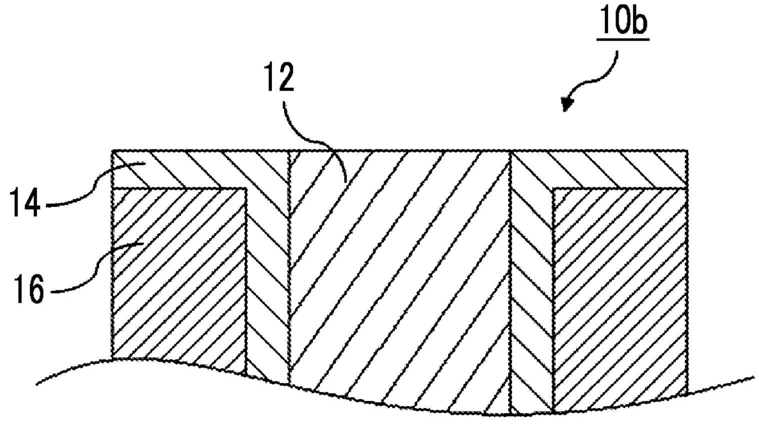
FIG. 2 is a schematic view showing another example of an object to be polished for which a chemical mechanical polishing method is carried out.

By polishing the surface to be treated, which is a surface of the bulk layer 18, and performing the polishing until the barrier layer 14 is exposed on the surface to be polished, the bulk layer 18 can be removed to obtain an object 10*b* to be polished shown in FIG. 2.

Furthermore, in the object 10*b* to be polished shown in FIG. 2, the bulk layer 18 is completely removed, but the polishing of the bulk layer 18 by the present CMP method may be completed before the bulk layer 18 is completely removed. That is, the polishing may be completed in the state where the bulk layer 18 partially or completely covers the barrier layer 14.

In addition, in the object 10*a* to be polished shown in FIG. 1, the barrier layer 14 is present between an interlayer insulating film 16 and a cobalt-containing film 12, but the present CMP method may be applied to the removal of a bulk layer included in an object to be polished having no barrier layer.

Other examples of the object to be polished include an object 10*b* to be polished shown in FIG. 2.

FIG. 2 is a schematic view showing another example of an object to be polished for which the present CMP method is carried out.

In the object 10*b* to be polished in FIG. 2, the bulk layer 18 is removed from the object 10*a* to be polished in FIG. 1, and thus, the barrier layer 14 and the cobalt-containing film 12 are exposed on the surface to be treated.

The present CMP method can be applied to a method in which the barrier layer 14 and the cobalt-containing film 12 exposed on the surface to be treated are polished at the same time, and the interlayer insulating film 16 is polished until it is exposed on a surface of the surface to be polished, thereby removing the barrier layer 14. That is, the present polishing liquid can be used as a polishing liquid for a barrier.

Figure 3:
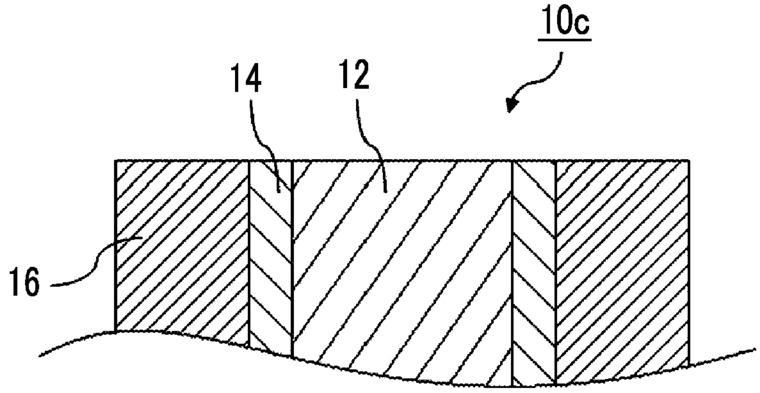
FIG. 3 is a schematic view showing an example of an object to be polished, which has been polished, obtained by carrying out a chemical mechanical polishing method.

In a case where the barrier layer 14 is removed from the object 10*b* to be polished by polishing, an object 10*c* to be polished, which has been polished, shown in FIG. 3 can be obtained.

Furthermore, even after the interlayer insulating film 16 is exposed on the surface to be polished, the polishing of the interlayer insulating film 16, the barrier layer 14 arranged along the shape of the grooves of the interlayer insulating film 16, and/or the cobalt-containing film 12 (wiring line) with which the grooves are filled may be intentionally or unavoidably continued.

In addition, in the object 10*b* to be polished in FIG. 2, the bulk layer is completely removed, but a part of the bulk layer may not be completely removed, and the bulk layer which has not been completely removed may partially or completely cover a surface to be treated of the object 10*b* to be polished. In the present CMP method, such a bulk layer which has not been completely removed may also be polished and removed.

In addition, in the object 10*c* to be polished, which has been polished, in FIG. 3, the barrier layer 14 on the interlayer insulating film 16 is completely removed, but the polishing may be completed before the barrier layer 14 on the interlayer insulating film 16 is completely removed. That is, the object to be polished, which has been polished, may be obtained by finishing the polishing in the state where the barrier layer 14 partially or completely covers the interlayer insulating film 16.

Examples of the interlayer insulating film 16 include an interlayer insulating film including one or more materials selected from a group consisting of silicon nitride (SiN), silicon oxide, silicon carbide (SiC), silicon carbide, silicon oxycarbide (SiOC), silicon oxynitride, and tetraethoxysilane (TEOS). Among those, silicon nitride (SiN), TEOS, silicon carbide (SiC), and silicon oxycarbide (SiOC) are preferable. In addition, the interlayer insulating film 16 may be formed of a plurality of films. Examples of the interlayer insulating film 16 formed of a plurality of films include an insulating film formed by combining a film including silicon oxide and a film including silicon oxycarbide.

Examples of the barrier layer 14 include a barrier layer including one or more materials selected from the group consisting of Ta, tantalum nitride (TaN), titanium nitride (TiN), titanium tungsten (TiW), W, and tungsten nitride (WN). Among those, Ta, TaN, or TiN is preferable.

Specific examples of the substrate include a semiconductor substrate consisting of a single layer and a semiconductor substrate consisting of multiple layers.

Specific examples of the material constituting the semiconductor substrate consisting of a single layer include Groups III to V compounds such as silicon, silicon germanium, and GaAs, or any combination thereof.

Specific examples of the semiconductor substrate consisting of multiple layers include a substrate in which an exposed integrated circuit structure such as interconnect features such as a metal wire and a dielectric material is arranged on the above-mentioned semiconductor substrate such as silicon.

Examples of a commercially available products of the object to be polished to which the present CMP method is applied include SEMATECH 754TEG (manufactured by SEMATECH Inc.).

<Polishing Device>

A known chemical mechanical polishing device (hereinafter also referred to as a "CMP device") can be used as a polishing device with which the present CMP method can be carried out.

Examples of the CMP device include a CMP device having a holder for holding an object to be polished having a surface to be polished, and a polishing platen to which a polishing pad is attached (to which a motor or the like with a rotation speed being changeable is attached).

<Polishing Pressure>

A polishing pressure in the present CMP method is preferably 0.1 to 5.0 psi, more preferably 0.5 to 3.0 psi, and still more preferably 1.0 to 3.0 psi from the viewpoint that generation of scratch-like defects of a surface to be polished can be suppressed and the surface to be polished after polishing is likely to be uniform. Furthermore, the polishing pressure means a pressure generated on a contact surface between the surface to be polished and the polishing pad.

<Rotation Speed of Polishing Platen>

A rotation speed of the polishing platen in the present CMP method is preferably 50 to 200 rpm, and more preferably 60 to 150 rpm.

Incidentally, in order to relatively move the object to be polished and the polishing pad, the holder may be rotated and/or rocked, the polishing platen may be rotated by planetary rotation, or a belt-shaped polishing pad may be moved linearly in one of longitudinal directions. Furthermore, the holder may be in any state of being fixed, rotating, or rocked. These polishing methods can be appropriately selected depending on a surface to be polished and/or a polishing device as long as the object to be polished and the polishing pad are relatively moved.

<Method for Supplying Polishing Liquid>

In the present CMP method, it is preferable to continuously supply the present polishing liquid to the polishing pad on the polishing platen by a device such as a pump while polishing a surface to be polished. Although an amount of the present polishing liquid to be supplied is not limited, it is preferable that a surface of the polishing pad is always covered with the present polishing liquid.

For example, a supply rate of the polishing liquid is preferably 0.05 to 0.75 ml/(min·$cm^2$), more preferably 0.14 to 0.35 ml/(min·$cm^2$), and still more preferably 0.21 to 0.35 ml/(min·$cm^2$) from the viewpoint that generation of scratch-like defects on a surface to be polished can be suppressed and the surface to be polished is likely to be uniform after polishing.

<Cleaning Step>

It is also preferable that the present CMP method has a cleaning step of cleaning the obtained object to be polished, which has been polished, after the step of obtaining the object to be polished, which has been polished.

Residues of polishing debris generated by polishing and/or residues based on the components included in the present polishing liquid, and the like can be removed by the cleaning step.

The cleaning liquid used in the cleaning step is not limited, and examples thereof include a cleaning liquid that is alkaline (alkaline cleaning liquid), a cleaning liquid that is acidic (acidic cleaning liquid), water, and an organic solvent, and among these, the alkaline cleaning liquid is preferable from the viewpoint that the alkaline cleaning liquid has a residue removing property and can suppress the surface roughness of a surface to be polished after washing (for example, a wiring line consisting of a cobalt-containing film exposed on the surface to be polished by the polishing step).

In addition, after the cleaning step, a post-cleaning step for removing the cleaning liquid adhering to the object to be polished, which has been polished, may be further carried out. Specific embodiments of the post-cleaning step in the present step include a method of further cleaning the object to be polished, which has been polished, after the cleaning step with a post-cleaning liquid such as an organic solvent and water.

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to Examples shown below. In addition, "%" means "% by mass" unless otherwise specified.

Example 1A

[Preparation of Polishing Liquid]

<Raw Materials>

The polishing liquids shown in Table 1-1 to Table 1-3 below were prepared using the following raw materials.

(Colloidal Silica)
- PL1 (product name, manufactured by Fuso Chemical Co., Ltd., colloidal silica, average primary particle diameter of 15 nm, degree of association of 2.7)

(Organic Acid)
- Glycine (Gly)

(Compound (1))
- 5-Methyl-1H-benzotriazole (5-MBTA, corresponding to the compound represented by General Formula (I))
- Benzotriazole (BTA, corresponding to the compound represented by General Formula (I))
- Tetrazole (corresponding to the compound represented by General Formula (IV))
- 1-Hydroxybenzotriazole (1-HBTA, corresponding to the compound represented by General Formula (II))

(Compound (2))
- Compound A: A compound represented by the following structural formula (corresponding to the compound represented by General Formula (II))
- Compound B: A compound represented by the following structural formula (corresponding to the compound represented by General Formula (III))
- Compound C: A compound represented by the following structural formula (corresponding to the compound represented by General Formula (II))
- Compound D: 1-Alkyl-substituted phenyltetrazole (tetrazole in which a phenyl group substituted with an alkyl group is substituted at the 1-position, corresponding to the compound represented by General Formula (V))
- Compound E: 5-Alkyl-substituted phenyltetrazole (tetrazole in which a phenyl group substituted with an alkyl group is substituted at the 5-position, corresponding to the compound represented by General Formula (V))

Compound A

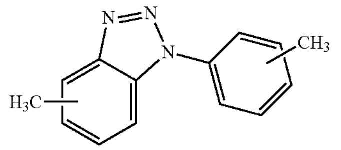

Compound B

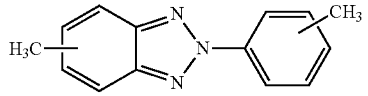

Compound C

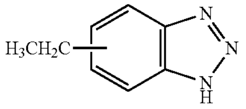

(Compound (3))
- 1,2,4-Tetrazole
- 5-Aminotetrazole (5-Ate)

(Passivation Film Forming Agent)
- Phthalic acid
- 4-Methylphthalic acid (4-Me phthalic acid)
- 4-Nitrophthalic acid
- Salicylic acid
- 4-Methylsalicylic acid (4-Me salicylic acid)
- Anthranilic acid
- 4-Methylbenzoic acid (4-Me benzoic acid)
- 4-tert-Butyl benzoic acid (4-TBu benzoic acid)
- 4-Propylbenzoic acid (4-Pr benzoic acid)
- 1,4,5,8-Naphthalenetetracarboxylic acid
- 6-Hydroxy-2-naphthalenecarboxylic acid
- 1-Hydroxy-2-naphthalenecarboxylic acid
- 3-Hydroxy-2-naphthalenecarboxylic acid (Anionic Surfactant)
- N-Lauroyl sarcosinate (N-LSAR)

($H_2O_2$)
- Hydrogen peroxide (Organic Solvent)
- Ethylene glycol (ETG)

(pH Adjuster)
- Sulfuric acid ($H_2SO_4$)
- Ammonia ($NH_3$)

(Water)
- Water (Ultrapure water)

<Preparation of Polishing Liquid>

The respective raw materials (or aqueous solutions thereof) were subjected to a filtration treatment through a high-density polyethylene filter. At this time, an aqueous solution of colloidal silica was filtered through a filter having a pore size of 0.1 μm, and the other raw materials (or aqueous solutions thereof) were filtered through a filter having a pore size of 0.02 μm. The content of the metal components in the raw materials (or aqueous solutions thereof) was reduced by a filtration treatment.

The respective raw materials (or aqueous solutions thereof) after the filtration treatments were mixed to prepare the polishing liquid of each of Examples or Comparative Examples shown in Table 1-1 to Table 1-3 below.

The components of the produced polishing liquid are shown in Table 1-1 to Table 1-3 below.

The "Amount" column in the tables indicates the content of each component with respect to the total mass of the polishing liquid.

The description of "%" and "ppm" indicates "% by mass" and "ppm by mass", respectively.

The content of each component in the tables indicates a content of each component as a compound. For example, hydrogen peroxide was added in the state of an aqueous hydrogen peroxide solution in the preparation of the polishing liquid, but the description of the content in the "Hydrogen peroxide" column in the tables indicates a content of hydrogen peroxide ($H_2O_2$) itself included in the polishing liquid, not that of the aqueous hydrogen peroxide solution added to the polishing liquid.

The content of the colloidal silica indicates a content of the silica colloidal particles themselves included in the polishing liquid.

The description of "Adjusted" as the content of the pH adjuster indicates that either $H_2SO_4$ or KOH is added in an amount so that the pH of a polishing liquid thus finally obtained is a value shown in the "pH" column.

The description of "Balance" as the amount of water to be added indicates that the component other than the components shown in the tables in the polishing liquid is water.

The "Ratio 1" column shows a mass ratio (content of the compound (1)/content of the compound (2)) of the content of the compound (1) to the content of the compound (2) in the polishing liquid.

The "Ratio 2" column shows a mass ratio (content of the organic acid/content of the compound (2)) of the content of the organic acid to the content of the compound (2) in the polishing liquid.

The "ΔC Log P" column shows a value of a difference (C log P value of the anionic surfactant−C log P value of the passivation film forming agent) obtained by subtracting the C log P value of the passivation film forming agent from the C log P value of the anionic surfactant.

The "Ratio 3" column shows a mass ratio (content of the passivation film forming agent/content of the anionic surfactant) of the content of the passivation film forming agent to the content of the anionic surfactant in the polishing liquid.

For example, the polishing liquid of Example 1 includes 0.10% by mass of PL1 as colloidal silica, 1.0% by mass of glycine as an organic acid, 0.003% by mass of 5-methylbenzotriazole as the compound (1), 0.01 ppm by mass of the compound A having the structural formula as the compound (2), 1.0% by mass of hydrogen peroxide, 0.05% by mass of ethylene glycol as an organic solvent, and a pH adjuster in an amount that brings the pH of the final polishing liquid to 7.2 as a whole, and the residual component is water.

[Tests]

The following evaluations were each performed using the obtained polishing liquids.

<Evaluation of Polishing Speed (RR)—1>

A wafer (diameter 12 inches (30.48 cm)) having a film consisting of Co on the surface was polished under the conditions that a polishing pressure was set to 2.0 psi and a supply rate of the polishing liquid was set to 0.28 ml/(min·cm$^2$), using FREX300SII (polishing device).

The film thickness before and after polishing was measured with a polishing time of 1 minute, a polishing speed RR (nm/min) was calculated from a difference in the film thickness, and the polishing speed was evaluated according to the following categories.

AAA: RR is 600 nm/min or more

AA: RR is 550 nm/min or more and less than 600 nm/min

A: RR is 500 nm/min or more and less than 550 nm/min

B: RR is 450 nm/min or more and less than 500 nm/min

C: RR is 400 nm/min or more and less than 550 nm/min

D: RR is less than 400 nm/min

<Evaluation of Dishing Suppressing Property—1>

A wafer was polished under the conditions that a polishing pressure was set to 2.0 psi and a supply rate of the polishing liquid was set to 0.28 ml/(min·cm$^2$), using FREX300SII (polishing device).

Incidentally, in the wafer, an interlayer insulating film consisting of silicon oxide was formed on a silicon substrate having a diameter of 12 inches (30.48 cm), and the interlayer insulating film was engraved with a groove having a line-and-space pattern consisting of a line of 10 μm and a space of 10 μm. A barrier layer (material: TiN, film thickness: 10 nm) was arranged along the shape of the groove, and the groove was filled with Co. Further, a bulk layer consisting of Co, having a film thickness of 150 to 300 nm, was formed on an upper part of a line-and-space part so that Co overflowed from the groove.

After the Co (bulk) of a non-wiring part was completely polished, polishing was further performed for 10 seconds. A level difference (height difference) between a reference surface (the highest position in the wafer after polishing) and the central portion of a line part (a portion in which each wiring line was formed) on the wafer after polishing was measured, and an average value of the level differences in the entire wafer was classified according to the following categories.

The level difference is dishing, and it can be evaluated that the smaller the level difference (an average value of the level differences) is, the more excellent the dishing suppressing property is.

AAA: The level difference is less than 20 nm

AA: The level difference is 20 nm or more and less than 30 nm

A: The level difference is 30 nm or more and less than 40 nm

B: The level difference is 40 nm or more and less than 50 nm

C: The level difference is 50 nm or more and less than 55 mu

D: The level difference is 55 nm or more

Table 1-1 to Table 1-3 below show the evaluation results of the tests performed using the polishing liquid of each of Examples or Comparative Examples.

TABLE 1

| | Colloidal silica | | Organic acid | | Compound (1) | | Compound (2) | | Compound (3) | |
|---|---|---|---|---|---|---|---|---|---|---|
| | Type | Amount (%) | Type | Amount (%) | Type | Amount (%) | Type | Amount (ppm) | Type | Amount (%) |
| Example 1 | PL1 | 0.10 | Gly | 1.0 | 5-MBTA | 0.003 | Compound A | 0.010 | | |
| Example 2 | PL1 | 0.10 | Gly | 1.0 | BTA | 0.003 | Compound B | 0.020 | | |
| Example 3 | PL1 | 0.10 | Gly | 1.0 | 5-MBTA | 0.003 | Compound C | 0.010 | | |
| Example 4 | PL1 | 0.10 | Gly | 1.0 | Tetrazole | 0.003 | Compound D | 0.010 | | |
| Example 5 | PL1 | 0.10 | Gly | 1.0 | Tetrazole | 0.003 | Compound E | 0.020 | | |
| Example 6 | PL1 | 0.10 | Gly | 1.0 | 5-MBTA | 0.003 | Compound A | 0.002 | | |
| | | | | | | | Compound B | 0.001 | | |
| | | | | | | | Compound C | 0.002 | | |
| Example 7 | PL1 | 0.10 | Gly | 1.0 | 5-MBTA | 0.020 | Compound A | 0.005 | 1,2,4-Triazole | 0.250 |
| | | | | | | | Compound B | 0.001 | | |
| | | | | | | | Compound C | 0.002 | | |
| Example 8 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 9 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 10 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 11 | PL1 | 0.10 | Gly | 1.0 | 5-MBTA | 0.0005 | Compound A | 0.100 | 1,2,4-Triazole | 0.250 |
| | | | | | | | Compound B | 0.100 | | |
| | | | | | | | Compound C | 0.100 | | |
| Example 12 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 13 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 14 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 15 | PL1 | 0.10 | Gly | 1.0 | 5-MBTA | 0.003 | Compound A | 0.100 | 1,2,4-Triazole | 0.250 |
| | | | | | | | Compound B | 0.100 | | |
| | | | | | | | Compound C | 0.100 | | |
| Example 16 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 17 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 18 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 19 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |
| Example 20 | PL1 | 0.10 | Gly | 1.0 | 5-MBTA | 0.003 | Compound A | 0.010 | 1,2,4-Triazole | 0.250 |
| | | | | | | | Compound B | 0.010 | | |
| | | | | | | | Compound C | 0.010 | | |

TABLE 2

| | | | Passivation film forming agent | | | Anionic surfactant | | | | |
|---|---|---|---|---|---|---|---|---|---|---|
| | Ratio 1 | Ratio 2 | Type | ClogP | Amount (%) | Type | ClogP | Amount (%) | ΔClogP | Ratio 3 |
| Example 1 | 3,000 | 1,000,000 | | | | | | | | |
| Example 2 | 1,500 | 500,000 | | | | | | | | |
| Example 3 | 3,000 | 1,000,000 | | | | | | | | |
| Example 4 | 3,000 | 1,000,000 | | | | | | | | |
| Example 5 | 1,500 | 500,000 | | | | | | | | |
| Example 6 | 6,000 | 2,000,000 | | | | | | | | |
| Example 7 | 25,000 | 125,0000 | | | | N-LSAR | 5.55 | 0.003 | | |
| Example 8 | 1,000 | 333,333 | Phthalic acid | 0.81 | 0.10 | | | | | |
| Example 9 | 1,000 | 333,333 | 4-Me phthalic acid | 1.27 | 0.10 | | | | | |
| Example 10 | 1,000 | 333,333 | 4-Nitrophthalic acid | 1 | 0.10 | | | | | |
| Example 11 | 17 | 33,333 | Salicylic acid | 2.06 | 0.10 | | | | | |
| Example 12 | 1,000 | 333,333 | 4-Me salicylic acid | 2.52 | 0.10 | | | | | |

TABLE 2-continued

| | Ratio 1 | Ratio 2 | Passivation film forming agent Type | ClogP | Amount (%) | Anionic surfactant Type | ClogP | Amount (%) | ΔClogP | Ratio 3 |
|---|---|---|---|---|---|---|---|---|---|---|
| Example 13 | 1,000 | 333,333 | Anthranilic acid | 1.21 | 0.10 | | | | | |
| Example 14 | 1,000 | 333,333 | 4-Me benzoic acid | 2.36 | 0.10 | | | | | |
| Example 15 | 100 | 33,333 | 4-tBu benzoic acid | 3.58 | 0.10 | | | | | |
| Example 16 | 1,000 | 333,333 | 4-Pr benzoic acid | 3.42 | 0.10 | | | | | |
| Example 17 | 1,000 | 333,333 | 1,4,5,8-Naphthalenetetracarboxylic acid | 1.37 | 0.10 | | | | | |
| Example 18 | 1,000 | 333,333 | 6-Hydroxy-2-naphthalenecarboxylic acid | 2.39 | 0.10 | | | | | |
| Example 19 | 1,000 | 333,333 | 1-Hydroxy-2-naphthalenecarboxylic acid | 3.29 | 0.10 | | | | | |
| Example 20 | 1,000 | 333,333 | 3-Hydroxy-2-naphthalenecarboxylic acid | 3.29 | 0.10 | | | | | |

TABLE 3

| | $H_2O_2$ Amount (%) | Organic solvent Type | Organic solvent Amount (%) | pH Adjuster Amount | Water Amount | pH | RR | Dishing suppressing property |
|---|---|---|---|---|---|---|---|---|
| Example 1 | 1.0 | ETG | 0.05 | Adjusted | Balance | 7.2 | A | A |
| Example 2 | 1.0 | ETG | 0.05 | Adjusted | Balance | 7.2 | A | A |
| Example 3 | 1.0 | ETG | 0.05 | Adjusted | Balance | 7.2 | A | A |
| Example 4 | 1.0 | ETG | 0.05 | Adjusted | Balance | 7.2 | A | A |
| Example 5 | 1.0 | ETG | 0.05 | Adjusted | Balance | 7.2 | A | A |
| Example 6 | 1.0 | ETG | 0.05 | Adjusted | Balance | 7.2 | A | A |
| Example 7 | 1.0 | ETG | 0.05 | Adjusted | Balance | 7.2 | B | AA |
| Example 8 | 1.0 | ETG | 0.05 | Adjusted | Balance | 7.2 | AA | AA |
| Example 9 | 1.0 | ETG | 0.05 | Adjusted | Balance | 7.2 | AA | AA |
| Example 10 | 1.0 | ETG | 0.05 | Adjusted | Balance | 7.2 | AA | AA |

TABLE 3-continued

| | $H_2O_2$ Amount (%) | Organic solvent Type | Organic solvent Amount (%) | pH Adjuster Amount | Water Amount | pH | RR | Dishing suppressing property |
|---|---|---|---|---|---|---|---|---|
| Example 11 | 1.0 | ETG | 0.05 | Adjusted | Balance | 7.2 | AA | A |
| Example 12 | 1.0 | ETG | 0.05 | Adjusted | Balance | 7.2 | AA | AA |
| Example 13 | 1.0 | ETG | 0.05 | Adjusted | Balance | 7.2 | AA | AA |
| Example 14 | 1.0 | ETG | 0.05 | Adjusted | Balance | 7.2 | AA | AA |
| Example 15 | 1.0 | ETG | 0.05 | Adjusted | Balance | 7.2 | AA | AA |
| Example 16 | 1.0 | ETG | 0.05 | Adjusted | Balance | 7.2 | AA | AA |
| Example 17 | 1.0 | ETG | 0.05 | Adjusted | Balance | 7.2 | AA | AAA |
| Example 18 | 1.0 | ETG | 0.05 | Adjusted | Balance | 7.2 | AA | AAA |
| Example 19 | 1.0 | ETG | 0.05 | Adjusted | Balance | 7.2 | AA | AA |
| Example 20 | 1.0 | ETG | 0.05 | Adjusted | Balance | 7.2 | AA | AA |

TABLE 4

| | Colloidal silica Type | Colloidal silica Amount (%) | Organic acid Type | Organic acid Amount (%) | Compound (1) Type | Compound (1) Amount (%) | Compound (2) Type | Compound (2) Amount (ppm) | Compound (3) Type | Compound (3) Amount (%) |
|---|---|---|---|---|---|---|---|---|---|---|
| Example 21 | PL1 | 0.10 | Gly | 1.0 | 5-MBTA | 0.003 | Compound A<br>Compound B<br>Compound C | 0.010<br>0.010<br>0.010 | | |
| Example 22 | PL1 | 0.10 | Gly | 1.0 | 5-MBTA | 0.003 | Compound A<br>Compound B<br>Compound C | 0.010<br>0.010<br>0.010 | | |
| Example 23 | PL1 | 0.10 | Gly | 1.0 | 5-MBTA | 0.003 | Compound A<br>Compound B<br>Compound C | 0.010<br>0.010<br>0.010 | | |
| Example 24 | PL1 | 0.10 | Gly | 1.0 | 5-MBTA | 0.003 | Compound A<br>Compound B<br>Compound C | 0.010<br>0.010<br>0.010 | | |
| Example 25 | PL1 | 0.10 | Gly | 1.0 | 5-MBTA | 0.003 | Compound A<br>Compound B<br>Compound C | 0.010<br>0.010<br>0.010 | | |
| Example 26 | PL1 | 0.10 | Gly | 1.0 | 5-MBTA | 0.003 | Compound A<br>Compound B<br>Compound C | 0.010<br>0.010<br>0.010 | | |
| Example 27 | PL1 | 0.10 | Gly | 1.0 | 5-MBTA | 0.003 | Compound A<br>Compound B<br>Compound C | 0.010<br>0.010<br>0.010 | | |

TABLE 4-continued

| | Colloidal silica | | Organic acid | | Compound (1) | | Compound (2) | | Compound (3) | |
|---|---|---|---|---|---|---|---|---|---|---|
| | Type | Amount (%) | Type | Amount (%) | Type | Amount (%) | Type | Amount (ppm) | Type | Amount (%) |
| Example 28 | PL1 | 0.10 | Gly | 1.0 | 5-MBTA | 0.003 | Compound A<br>Compound B<br>Compound C | 0.010<br>0.010<br>0.010 | | |
| Example 29 | PL1 | 0.10 | Gly | 1.0 | 5-MBTA | 0.001 | Compound A<br>Compound B<br>Compound C | 0.200<br>0.100<br>0.100 | | |
| Example 30 | PL1 | 0.10 | Gly | 1.0 | 5-MBTA | 0.003 | Compound A<br>Compound B<br>Compound C | 0.010<br>0.010<br>0.010 | | |
| Example 31 | PL1 | 0.10 | Gly | 1.0 | 5-MBTA | 0.003 | Compound A<br>Compound B<br>Compound C | 0.010<br>0.010<br>0.010 | | |
| Example 32 | PL1 | 0.10 | Gly | 1.0 | 5-MBTA | 0.050 | Compound A<br>Compound B<br>Compound C | 0.010<br>0.010<br>0.010 | | |
| Example 33 | PL1 | 0.10 | Gly | 1.0 | 5-MBTA | 0.003 | Compound A<br>Compound B<br>Compound C | 0.010<br>0.010<br>0.010 | | |
| Example 34 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 35 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 36 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 37 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |

TABLE 5

| | | | Passivation film forming agent | | | Anionic surfactant | | | | |
|---|---|---|---|---|---|---|---|---|---|---|
| | Ratio 1 | Ratio 2 | Type | ClogP | Amount (%) | Type | ClogP | Amount (%) | ΔClogP | Ratio 3 |
| Example 21 | 1,000 | 333,333 | Phthalic acid | 0.81 | 0.10 | N-LSAR | 5.55 | 0.002 | 4.74 | 50.0 |
| Example 22 | 1,000 | 333,333 | 4-Me phthalic acid | 1.27 | 0.10 | N-LSAR | 5.55 | 0.002 | 4.28 | 50.0 |
| Example 23 | 1,000 | 333,333 | 4-Nitrophthalic acid | 1 | 0.10 | N-LSAR | 5.55 | 0.002 | 4.55 | 50.0 |
| Example 24 | 1,000 | 333,333 | Salicylic acid | 2.06 | 0.10 | N-LSAR | 5.55 | 0.002 | 3.49 | 50.0 |
| Example 25 | 1,000 | 333,333 | 4-Me salicylic acid | 2.52 | 0.10 | N-LSAR | 5.55 | 0.002 | 3.03 | 50.0 |
| Example 26 | 1,000 | 333,333 | Anthranilic acid | 1.21 | 0.10 | N-LSAR | 5.55 | 0.002 | 4.34 | 50.0 |
| Example 27 | 1,000 | 333,333 | 4-Me benzoic acid | 2.36 | 0.10 | N-LSAR | 5.55 | 0.002 | 3.19 | 50.0 |
| Example 28 | 1,000 | 333,333 | 4-tBu benzoic acid | 3.58 | 0.10 | N-LSAR | 5.55 | 0.002 | 1.97 | 50.0 |
| Example 29 | 25 | 25,000 | 4-Pr benzoic acid | 3.42 | 0.10 | N-LSAR | 5.55 | 0.002 | 2.13 | 50.0 |
| Example 30 | 1,000 | 333,333 | 1,4,5,8-Naphthalenetetracarboxylic acid | 1.37 | 0.10 | N-LSAR | 5.55 | 0.002 | 4.18 | 50.0 |
| Example 31 | 1,000 | 333,333 | 6-Hydroxy-2-naphthalenecarboxylic acid | 2.39 | 0.10 | N-LSAR | 5.55 | 0.002 | 3.16 | 50.0 |
| Example 32 | 16,667 | 333,333 | 1-Hydroxy-2-naphthalenecarboxylic acid | 3.29 | 0.10 | N-LSAR | 5.55 | 0.002 | 2.26 | 50.0 |
| Example 33 | 1,000 | 333,333 | 3-Hydroxy-2-naphthalenecarboxylic acid | 3.29 | 0.10 | N-LSAR | 5.55 | 0.002 | 2.26 | 50.0 |
| Example 34 | 1,000 | 333,333 | 4-Me phthalic acid | 1.27 | 0.10 | N-LSAR | 5.55 | 0.002 | 4.28 | 50.0 |
| Example 35 | 1,000 | 333,333 | 4-Me phthalic acid | 1.27 | 0.10 | N-LSAR | 5.55 | 0.001 | 4.28 | 125.0 |
| Example 36 | 1,000 | 333,333 | 4-Me phthalic acid | 1.27 | 0.10 | N-LSAR | 5.55 | 0.010 | 4.28 | 10.0 |
| Example 37 | 1,000 | 333,333 | 4-Me phthalic acid | 1.27 | 0.10 | N-LSAR | 5.55 | 0.025 | 4.28 | 4.0 |

TABLE 6

| | $H_2O_2$ | Organic solvent | | pH Adjuster | Water | | | Dishing suppressing property |
|---|---|---|---|---|---|---|---|---|
| | Amount (%) | Type | Amount (%) | Amount | Amount | pH | RR | |
| Example 21 | 1.0 | ETG | 0.05 | Adjusted | Balance | 7.2 | A | AA |
| Example 22 | 1.0 | ETG | 0.05 | Adjusted | Balance | 7.2 | AA | AA |
| Example 23 | 1.0 | ETG | 0.05 | Adjusted | Balance | 7.2 | AA | AA |
| Example 24 | 1.0 | ETG | 0.05 | Adjusted | Balance | 7.2 | AA | AA |
| Example 25 | 1.0 | ETG | 0.05 | Adjusted | Balance | 7.2 | AA | AA |
| Example 26 | 1.0 | ETG | 0.05 | Adjusted | Balance | 7.2 | AA | AA |
| Example 27 | 1.0 | ETG | 0.05 | Adjusted | Balance | 7.2 | AA | AA |
| Example 28 | 1.0 | ETG | 0.05 | Adjusted | Balance | 7.2 | A | AA |
| Example 29 | 1.0 | ETG | 0.05 | Adjusted | Balance | 7.2 | A | A |

TABLE 6-continued

| | $H_2O_2$ | Organic solvent | | pH Adjuster | Water | | | Dishing suppressing property |
|---|---|---|---|---|---|---|---|---|
| | Amount (%) | Type | Amount (%) | Amount | Amount | pH | RR | |
| Example 30 | 1.0 | ETG | 0.05 | Adjusted | Balance | 7.2 | AA | AAA |
| Example 31 | 1.0 | ETG | 0.05 | Adjusted | Balance | 7.2 | AA | AAA |
| Example 32 | 1.0 | ETG | 0.05 | Adjusted | Balance | 7.2 | B | AA |
| Example 33 | 1.0 | ETG | 0.05 | Adjusted | Balance | 7.2 | A | AA |
| Example 34 | 1.0 | ETG | 0.05 | Adjusted | Balance | 7.2 | AAA | AAA |
| Example 35 | 1.0 | ETG | 0.05 | Adjusted | Balance | 7.2 | AAA | AAA |
| Example 36 | 1.0 | ETG | 0.05 | Adjusted | Balance | 7.2 | AAA | AAA |
| Example 37 | 1.0 | ETG | 0.05 | Adjusted | Balance | 7.2 | AAA | AAA |

TABLE 7

| | Colloidal silica | | Organic acid | | Compound (1) | | Compound (2) | | Compound (3) | |
|---|---|---|---|---|---|---|---|---|---|---|
| | Type | Amount (%) | Type | Amount (%) | Type | Amount (%) | Type | Amount (ppm) | Type | Amount (%) |
| Example 38 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 39 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 40 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 41 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 42 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 43 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 44 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 45 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 46 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 47 | PL1 | 0.10 | Gly | 1.0 | 5-MBTA<br>1-HBTA | 0.003<br>0.010 | Compound A<br>Compound B<br>Compound C | 0.010<br>0.010<br>0.010 | 1,2,4-Triazole | 0.250 |
| Example 48 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 49 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 50 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 51 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |
| Example 52 | PL1 | 0.10 | Gly | 1.0 | 5-MBTA | 0.003 | Compound A<br>Compound B<br>Compound C | 0.010<br>0.010<br>0.010 | 1,2,4-Triazole | 0.250 |

TABLE 7-continued

| | Colloidal silica | | Organic acid | | Compound (1) | | Compound (2) | | Compound (3) | |
|---|---|---|---|---|---|---|---|---|---|---|
| | Type | Amount (%) | Type | Amount (%) | Type | Amount (%) | Type | Amount (ppm) | Type | Amount (%) |
| Comparative Example 1 | PL1 | 0.10 | Gly | 1.0 | 5-MBTA | 0.003 | | | | |
| Comparative Example 2 | PL1 | 0.10 | Gly | 1.0 | 1-HBTA | 0.003 | | | 5-Ate | 0.003 |

TABLE 8

| | | | Passivation film forming agent | | | Anionic surfactant | | | | |
|---|---|---|---|---|---|---|---|---|---|---|
| | Ratio 1 | Ratio 2 | Type | ClogP | Amount (%) | Type | ClogP | Amount (%) | ΔClogP | Ratio 3 |
| Example 38 | 1,000 | 333,333 | 4-Me phthalic acid | 1.27 | 0.10 | N-LSAR | 5.55 | 0.500 | 4.28 | 0.2 |
| Example 39 | 1,000 | 333,333 | 4-Me phthalic acid | 1.27 | 0.01 | N-LSAR | 5.55 | 0.002 | 4.28 | 5.0 |
| Example 40 | 1,000 | 333,333 | 4-Me phthalic acid | 1.27 | 0.05 | N-LSAR | 5.55 | 0.002 | 4.28 | 25.0 |
| Example 41 | 4,333 | 333,333 | 4-Me phthalic acid | 1.27 | 0.10 | N-LSAR | 5.55 | 0.002 | 4.28 | 50.0 |
| Example 42 | 4,333 | 333,333 | 4-Me phthalic acid | 1.27 | 0.10 | N-LSAR | 5.55 | 0.001 | 4.28 | 125.0 |
| Example 43 | 4,333 | 333,333 | 4-Me phthalic acid | 1.27 | 0.10 | N-LSAR | 5.55 | 0.010 | 4.28 | 10.0 |
| Example 44 | 4,333 | 333,333 | 4-Me phthalic acid | 1.27 | 0.10 | N-LSAR | 5.55 | 0.025 | 4.28 | 4.0 |
| Example 45 | 4,333 | 333,333 | 4-Me phthalic acid | 1.27 | 0.10 | N-LSAR | 5.55 | 0.500 | 4.28 | 0.2 |
| Example 46 | 4,333 | 333,333 | 4-Me phthalic acid | 1.27 | 0.01 | N-LSAR | 5.55 | 0.002 | 4.28 | 5.0 |
| Example 47 | 4,333 | 333,333 | 4-Me phthalic acid | 1.27 | 0.05 | N-LSAR | 5.55 | 0.002 | 4.28 | 25.0 |
| Example 48 | 1,000 | 333,333 | 4-Me phthalic acid | 1.27 | 0.40 | N-LSAR | 5.55 | 0.002 | 4.28 | 200.0 |
| Example 49 | 1,000 | 333,333 | 4-Me phthalic acid | 1.27 | 0.60 | N-LSAR | 5.55 | 0.002 | 4.28 | 300.0 |
| Example 50 | 1,000 | 333,333 | 4-Me phthalic acid | 1.27 | 0.10 | N-LSAR | 5.55 | 0.002 | 4.28 | 50.0 |
| Example 51 | 1,000 | 333,333 | 4-Me phthalic acid | 1.27 | 0.10 | N-LSAR | 5.55 | 0.002 | 4.28 | 50.0 |
| Example 52 | 1,000 | 333,333 | 4-Me phthalic acid | 1.27 | 0.10 | N-LSAR | 5.55 | 0.002 | 4.28 | 50.0 |
| Comparative Example 1 | | | | | | | | | | |
| Comparative Example 2 | | | | | | | | | | |

TABLE 9

| | $H_2O_2$ | Organic solvent | | pH Adjuster | | | | Dishing suppressing property |
|---|---|---|---|---|---|---|---|---|
| | Amount (%) | Type | Amount (%) | Amount | Amount | pH | RR | |
| Example 38 | 1.0 | ETG | 0.05 | Adjusted | Balance | 7.2 | AAA | AAA |
| Example 39 | 1.0 | ETG | 0.05 | Adjusted | Balance | 7.2 | AAA | AAA |
| Example 40 | 1.0 | ETG | 0.05 | Adjusted | Balance | 7.2 | AAA | AAA |
| Example 41 | 1.0 | ETG | 0.05 | Adjusted | Balance | 7.2 | AAA | AAA |
| Example 42 | 1.0 | ETG | 0.05 | Adjusted | Balance | 7.2 | AAA | AAA |
| Example 43 | 1.0 | ETG | 0.05 | Adjusted | Balance | 7.2 | AAA | AAA |
| Example 44 | 1.0 | ETG | 0.05 | Adjusted | Balance | 7.2 | AAA | AAA |
| Example 45 | 1.0 | ETG | 0.05 | Adjusted | Balance | 7.2 | AAA | AAA |
| Example 46 | 1.0 | ETG | 0.05 | Adjusted | Balance | 7.2 | AAA | AAA |
| Example 47 | 1.0 | ETG | 0.05 | Adjusted | Balance | 7.2 | AAA | AAA |
| Example 48 | 1.0 | ETG | 0.05 | Adjusted | Balance | 7.2 | AA | AA |
| Example 49 | 1.0 | ETG | 0.05 | Adjusted | Balance | 7.2 | AA | A |
| Example 50 | 1.0 | ETG | 0.05 | Adjusted | Balance | 5.8 | A | AA |

TABLE 9-continued

| | $H_2O_2$ | Organic solvent | | pH Adjuster | | | | Dishing suppressing property |
|---|---|---|---|---|---|---|---|---|
| | Amount (%) | Type | Amount (%) | Amount | Amount | pH | RR | |
| Example 51 | 1.0 | ETG | 0.05 | Adjusted | Balance | 6.5 | AA | AA |
| Example 52 | 1.0 | ETG | 0.05 | Adjusted | Balance | 7.8 | AA | AA |
| Comparative Example 1 | 1.0 | ETG | 0.05 | Adjusted | Balance | 7.2 | A | D |
| Comparative Example 2 | 1.0 | ETG | 0.05 | Adjusted | Balance | 7.2 | A | D |

From the results shown in the tables, it was confirmed that desired results could be obtained in a case of using the present polishing liquid.

Above all, it was confirmed that in a case where the mass ratio (ratio 1) of the content of the compound (1) to the content of the compound (2) is 30 or more, the effect of the present invention is more excellent (see the comparison of the results of Examples 11 and 15, and the like).

In addition, it was confirmed that in a case where the mass ratio (ratio 1) of the content of the compound (1) to the content of the compound (2) is 15,000 or less, the polishing speed is excellent (see the comparison of the results of Examples 21 to 28 and 30 to 33, and the like).

It was confirmed that in a case where the present polishing liquid includes both the compound (3) and an anionic surfactant, the effect of the present invention is more excellent (see the comparison of the results of Examples 6 and 7, and the like).

It was confirmed that in a case where the present polishing liquid includes both the compound (3) and a passivation film forming agent, the effect of the present invention and the polishing speed are more excellent (see the comparison of the results of Examples 6 and 8 to 20, and the like).

It was confirmed that in a case where the present polishing liquid includes 1,4,5,8-naphthalenetetracarboxylic acid or 6-hydroxy-2-naphthalenecarboxylic acid as a passivation film forming agent, the effect of the present invention is more excellent, as compared with a case where the present polishing liquid includes other passivation film forming agents (see the comparison of the results of Examples 8 to 20, and the like).

It was confirmed that in a case where the present polishing liquid includes a passivation film forming agent having a C log P value of 1.0 or more, the polishing speed is more excellent, as compared with a case where the present polishing liquid includes a passivation film forming agent having a C log P value of less than 1.0 (see the comparison of the results of Examples 21 and 23, and the like).

It was confirmed that in a case where the present polishing liquid includes both a passivation film forming agent and an anionic surfactant, the effect of the present invention is more excellent (see the comparison of the results of Examples 6 and 21 to 33, and the like).

Above all, it was confirmed that in a case where a difference value (ΔC log P value) obtained by subtracting the C log P value of the passivation film forming agent from the C log P value of the anionic surfactant is 2.50 or more, the polishing speed is excellent (see the comparison of the results of Examples 22 to 33, and the like).

In addition, it was confirmed that in a case where the mass ratio (ratio 3) of the content of the passivation film forming agent to the content of the anionic surfactant is less than 300, the effect of the present invention and the polishing speed are more excellent, and in a case where the ratio 3 is less than 200, the effect of the present invention is more excellent (see the comparison of the results of Examples 42, 48, and 49, and the like).

It was confirmed that in a case where the pH of the present polishing liquid is 6.0 or more, a polishing speed is excellent; and in a case where the pH of the present polishing liquid is 6.8 or more, the effect of the present invention and the polishing speed are more excellent (see the comparison of the results of Examples 34, 50, and 51, and the like).

In addition, it was confirmed that in a case where the pH of the present polishing liquid is 7.7 or less, the effect of the present invention and the polishing speed are more excellent (see the comparison of the results of Examples 34 and 52, and the like).

Example 1B

Further, the following tests were performed while changing a polishing pressure (a contact pressure for contacting the surface to be polished and the polishing pad), using the polishing liquid of each of Examples 34 to 40 described above.

[Tests]

<Evaluation of Scratch Suppressing Property—1>

The same wafer as used in <Evaluation of Dishing Suppressing Property—1> described above was polished at a supply rate of the polishing liquid set to 0.28 ml/(min·$cm^2$) under the conditions where the polishing pressure was set as shown in Table 2 below, using FREX300SII (polishing device). After the Co (bulk) of a non-wiring part was completely polished, polishing was further performed for 10 seconds. Then, the wafer was cleaned with a cleaning liquid (pCMP liquid) (alkaline cleaning liquid: CL9010 (manufactured by Fujifilm Electronics Materials Co., Ltd.)) for 1 minute in a cleaning unit, further subjected to isopropanol (IPA) cleaning for 30 minutes, and then subjected to a drying treatment.

The obtained wafer was measured by a defect detection device, coordinates where defects having a major diameter of 0.06 μm or more were present were identified, and then the types of the defects at the identified coordinates were classified. The number of scratches (scratch-like defects) detected on the wafer was classified according to the following categories.

It can be evaluated that the smaller the number of the scratches is, the more excellent the scratch suppressing property is.

AAA: The number of the scratches is 1 or less

AA: The number of the scratches is 2 or 3

A: The number of the scratches is 4 or 5

B: The number of the scratches is 6 to 10

C: The number of the scratches is 11 to 15

D: The number of the scratches is 16 or more

<Evaluation of Uniformity—1>

A polished wafer was obtained according to the method described in <Evaluation of Dishing Suppressing Property—1>, except that the line-and-space of the wafer used in the test was configured to have a line of 9 μm and a space of 1 μm, and the polishing pressure was changed as shown in Table 2.

For the wafer after polishing, a level difference of each of a chip formed in the vicinity of the center of the polished surface and a chip formed in the vicinity of the edge of the polished surface was measured, and a difference between the level difference measured in the vicinity of the center and the level difference in the vicinity of the edge was classified according to the following categories.

Furthermore, the level difference as mentioned herein is a total value of the erosion value (height difference between the reference surface and the central portion of the space part) and the dishing value (height difference between the reference surface and the central portion of the line part).

It can be evaluated that the smaller the difference between the level differences is, the more excellent the uniformity is.

AAA: The difference in the level difference is less than 3 nm

AA: The difference in the level difference is 3 nm or more and less than 5 mu

A: The difference in the level difference is 5 nm or more and less than 8 nm

B: The difference in the level difference is 8 nm or more and less than 10 nm

C: The difference in the level difference is 10 nm or more

The evaluation results of the tests performed while changing the contact pressure are shown below.

TABLE 10

| | | Polishing pressure (psi) | | | | | |
|---|---|---|---|---|---|---|---|
| | | 0.25 | 0.5 | 1 | 2 | 3 | 3.5 |
| Example 34 | Scratch suppressing property | AA | AAA | AAA | AAA | AAA | C |
| | Uniformity | C | AA | AAA | AAA | AAA | B |
| Example 35 | Scratch suppressing property | AA | AAA | AAA | AAA | AAA | C |
| | Uniformity | C | AA | AAA | AAA | AAA | B |
| Example 36 | Scratch suppressing property | AA | AAA | AAA | AAA | AAA | C |
| | Uniformity | C | AA | AAA | AAA | AAA | B |
| Example 37 | Scratch suppressing property | AA | AAA | AAA | AAA | AAA | C |
| | Uniformity | C | AA | AAA | AAA | AAA | B |
| Example 38 | Scratch suppressing property | AA | AAA | AAA | AAA | AAA | C |
| | Uniformity | C | AA | AAA | AAA | AAA | B |
| Example 39 | Scratch suppressing property | AA | AAA | AAA | AAA | AAA | C |
| | Uniformity | C | AA | AAA | AAA | AAA | B |
| Example 40 | Scratch suppressing property | AA | AAA | AAA | AAA | AAA | C |
| | Uniformity | C | AA | AAA | AAA | AAA | B |

As shown in the table, it was confirmed that the polishing pressure is preferably 0.5 to 3.0 psi, and more preferably 1.0 to 3.0 psi.

Example 1C

Further, the following tests were performed while changing the following supply rate of the polishing liquid (supply amount of polishing liquid supplied to the polishing pad during polishing), using the polishing liquid of each of Examples 34 to 40 described above.

[Tests]

<Evaluation of Scratch Suppressing Property—2>

Evaluation of the scratch suppressing property was performed in the same manner as in <Evaluation of Scratch Suppressing Property—1>, except that the supply rate of the polishing liquid was changed as shown in Table 3 and the polishing pressure was fixed at 2.0 psi.

<Evaluation of Uniformity—2>

In addition, evaluation of the uniformity was performed in the same manner as in <Evaluation of Uniformity—1>, except that the supply rate of the polishing liquid was changed as shown in Table 3 and the polishing pressure was fixed at 2.0 psi.

The evaluation results of the tests performed while changing the supply rate of the polishing liquid are shown below.

TABLE 11

| | | Supply rate (ml/(min · cm$^2$)) of polishing liquid | | | | | |
|---|---|---|---|---|---|---|---|
| | | 0.1 | 0.14 | 0.21 | 0.28 | 0.35 | 0.4 |
| Example 34 | Scratch suppressing property | C | AAA | AAA | AAA | AAA | AA |
| | Uniformity | B | AA | AAA | AAA | AAA | C |
| Example 35 | Scratch suppressing property | C | AAA | AAA | AAA | AAA | AA |
| | Uniformity | B | AA | AAA | AAA | AAA | C |
| Example 36 | Scratch suppressing property | C | AAA | AAA | AAA | AAA | AA |
| | Uniformity | B | AA | AAA | AAA | AAA | C |
| Example 37 | Scratch suppressing property | C | AAA | AAA | AAA | AAA | AA |
| | Uniformity | B | AA | AAA | AAA | AAA | C |

TABLE 11-continued

| | | Supply rate (ml/(min · cm$^2$)) of polishing liquid | | | | | |
|---|---|---|---|---|---|---|---|
| | | 0.1 | 0.14 | 0.21 | 0.28 | 0.35 | 0.4 |
| Example 38 | Scratch suppressing property | C | AAA | AAA | AAA | AAA | AA |
| | Uniformity | B | AA | AAA | AAA | AAA | C |
| Example 39 | Scratch suppressing property | C | AAA | AAA | AAA | AAA | AA |
| | Uniformity | B | AA | AAA | AAA | AAA | C |
| Example 40 | Scratch suppressing property | C | AAA | AAA | AAA | AAA | AA |
| | Uniformity | B | AA | AAA | AAA | AAA | C |

As shown in the table, it was confirmed that the supply rate of the polishing liquid is preferably 0.14 to 0.35 ml/(min·cm$^2$), and more preferably 0.21 to 0.35 ml/(min·cm$^2$).

Example 1D

Further, the following tests were performed while changing the type of the cleaning liquid (pCMP liquid), using the polishing liquid of each of Examples 34 to 40 described above.

[Tests]

<Evaluation of Residue Suppressing Property—1>

A wafer was treated in the same manner as in <Evaluation of Scratch Suppressing Property—1>, except that the polishing pressure was fixed at 2.0 psi and the type of the cleaning liquid to be used was changed as shown in Table 4.

The obtained wafer was measured by a defect detection device, coordinates where defects having a major diameter of 0.06 μm or more were present were identified, and then the types of the defects at the identified coordinates were classified. The number of residues (residue-based defects) detected on the wafer was classified according to the following categories.

It can be evaluated that the smaller the number of the residues is, the more excellent the residue suppressing property is.

AAA: The number of the residues is less than 200

AA: The number of the residues is 200 or more and less than 350

A: The number of the residues is 350 or more and less than 500

B: The number of the residues is 500 or more and less than 750

C: The number of the residues is 750 or more and less than 1,000

D: The number of the residues is 1,000 or more

<Evaluation of Corrosion Suppressing Property—1>

A wafer was treated in the same manner as in <Evaluation of Residue Suppressing Property—1> described above.

The surface roughness (Ra) on the Co wiring line (wiring line with a width of 100 μm) exposed on a surface in the surface to be polished in the obtained wafer was measured with an atomic force microscope (AFM) at N=3, and average Ra's were classified according to the following categories.

It can be evaluated that the smaller Ra is, the more excellent the corrosion suppressing property is.

AAA: Ra of the measured area of 5 μm is less than 1.0 nm

AA: Ra of the measured area of 5 μm is 1.0 nm or more and less than 1.5 nm

A: Ra of the measured area of 5 μm is 1.5 nm or more and less than 2.0 nm

B: Ra of the measured area of 5 μm is 2.0 nm or more and less than 2.5 nm

C: Ra of the measured area of 5 μm is 2.5 nm or more and less than 3.0 nm

D: Ra of the measured area of 5 μm is 3.0 nm or more

The evaluation results of the tests performed while changing the type of the cleaning liquid are shown below.

TABLE 12

| | | Cleaning liquid | | |
|---|---|---|---|---|
| | | DIW | Acidic | Alkaline |
| Example 34 | Residue suppressing property | C | B | AAA |
| | Corrosion suppressing property | AAA | C | AAA |
| Example 35 | Residue suppressing property | C | B | AAA |
| | Corrosion suppressing property | AAA | C | AAA |
| Example 36 | Residue suppressing property | C | B | AAA |
| | Corrosion suppressing property | AAA | C | AAA |
| Example 37 | Residue suppressing property | C | B | AAA |
| | Corrosion suppressing property | AAA | C | AAA |
| Example 38 | Residue suppressing property | C | B | AAA |
| | Corrosion suppressing property | AAA | C | AAA |
| Example 39 | Residue suppressing property | C | B | AAA |
| | Corrosion suppressing property | AAA | C | AAA |
| Example 40 | Residue suppressing property | C | B | AAA |
| | Corrosion suppressing property | AAA | C | AAA |

DIW: Water

Acidic: CLEAN100 (manufactured by Fujifilm Electronics Materials Co., Ltd.: acidic cleaning liquid)

Alkaline: CL9010 (manufactured by Fujifilm Electronics Materials Co., Ltd.: alkaline cleaning liquid)

As shown in the table, it was confirmed that the alkaline cleaning liquid is preferable as the cleaning liquid.

Example 1E

Further, the following tests were performed while changing the type of the object to be polished, using the polishing liquid of each of Examples 34 to 40 described above.

[Tests]

<Evaluation of Polishing Speed (RR)—2>

The polishing speed was evaluated in the same manner as in <Evaluation of Polishing Speed (RR)> described above, except that the film included on a surface of the wafer was changed from a film consisting of Co to a film consisting of TiN, Ta, TaN, SiN, or SiC.

The evaluation results are shown below.

The speed ratio (polishing speed of Co or Cu/polishing speed of TiN, Ta, TaN, SiN, or SiC) of the polishing speed of Co or Cu to the polishing speed of TiN, Ta, TaN, SiN, or SiC was in the range of more than 20 and less than 1,000 in any case.

TABLE 13

| | Object to be polished | | | | | |
|---|---|---|---|---|---|---|
| | Co | TiN | Ta | TaN | SiN | SiC |
| Example 34 | AAA | <1 nm/min | <1 nm/min | <1 nm/min | <1 nm/min | <1 nm/min |
| Example 35 | AAA | <1 nm/min | <1 nm/min | <1 nm/min | <1 nm/min | <1 nm/min |
| Example 36 | AAA | <1 nm/min | <1 nm/min | <1 nm/min | <1 nm/min | <1 nm/min |
| Example 37 | AAA | <1 nm/min | <1 nm/min | <1 nm/min | <1 nm/min | <1 nm/min |
| Example 38 | AAA | <1 nm/min | <1 nm/min | <1 nm/min | <1 nm/min | <1 nm/min |
| Example 39 | AAA | <1 nm/min | <1 nm/min | <1 nm/min | <1 nm/min | <1 nm/min |
| Example 40 | AAA | <1 nm/min | <1 nm/min | <1 nm/min | <1 nm/min | <1 nm/min |

As shown in the table, it was confirmed that the polishing speeds (RR) for TiN, Ta, TaN, SiN, and SiC were each less than 1 nm/min, and the polishing selectivities were good.

Example 2A

[Preparation of Polishing Liquid]

<Raw Materials>

The polishing liquids shown in Table 6-1 to Table 6-4 below were prepared using the raw materials used for preparing the polishing liquid in Example 1A described above and the following raw materials.

(Organic Acid)

Malonic acid

Citric acid (CA)

(pH Adjuster)

Potassium hydroxide (KOH)

<Preparation of Polishing Liquid>

In the same manner as in <Preparation of Polishing Liquid> in Example 1A described above, the respective raw materials (or aqueous solutions thereof) were filtered, and the respective raw materials (or aqueous solutions thereof) after the filtration treatment were mixed to prepare the polishing liquid of each of Examples or Comparative Examples shown in Table 6-1 to Table 6-4 below.

The components of the produced polishing liquid are shown in Table 6-1 to Table 6-4 below.

In Table 6-1 to Table 6-4, the "Amount" column, the "%" column, the "ppm" column, the description in the "Adjusted" as the content of the pH adjuster, the description in the "Balance" as the amount of water to be added, the "ΔC log P" column, and the "Ratio 1", "Ratio 2", and "Ratio 3" columns all show the same items as those described in each of the columns in the tables in Example 1A described above.

For example, the polishing liquid of Example 101 includes 4.50% by mass of PL1 as colloidal silica, 0.005% by mass of 5-methylbenzotriazole as the compound (1), 0.03 ppm by mass of the compound A having the structural formula as the compound (2), 1.0% by mass of hydrogen peroxide, 0.05% by mass of ethylene glycol as an organic solvent, and a pH adjuster in an amount that brings the pH of the final polishing liquid to 9.0 as a whole, and the residual component is water.

[Tests]

The following evaluations were each performed using the obtained polishing liquids.

<Evaluation of Dishing Suppressing Property—2>

The same wafer as used in <Evaluation of Dishing Suppressing Property—1> was polished under the conditions that a polishing pressure was set to 2.0 psi and a supply rate of the polishing liquid was set to 0.28 ml/(min·cm$^2$), using FREX300SII (polishing device).

First, Co (bulk) of the non-wiring part was completely polished using CSL5250C (trade name, manufactured by FUJIFILM Planar Solutions, LLC) as a polishing liquid, and then polishing was further performed for 10 seconds. Thereafter, polishing was performed for 1 minute under the same conditions, using each of the polishing liquids of Examples or Comparative Examples.

A level difference (height difference) between a reference surface (the highest position in the wafer after polishing) and the central portion of a line part (a portion in which each wiring line was formed) on the wafer after polishing was measured, and an average value of the level differences in the entire wafer was classified according to the following categories.

The level difference is dishing, and it can be evaluated that the smaller the level difference (an average value of the level differences) is, the more excellent the dishing suppressing property is.

AAA: The level difference is less than 1 nm

AA: The level difference is 1 nm or more and less than 3 nm

A: The level difference is 3 nm or more and less than 5 nm

B: The level difference is 5 nm or more and less than 8 nm

C: The level difference is 8 nm or more and less than 10 nm

D: The level difference is 10 nm or more

<Evaluation of Erosion Suppressing Property—1>

Wafer polishing and measurement of a level difference on a surface to be polished were performed in the same manner as in <Evaluation of Dishing Suppressing Property—2>, except that the line-and-space of the wafer used in the test was configured to have a line of 9 μm and a space of 1 μm.

A level difference (height difference) between a reference surface (the highest position in the wafer after polishing) and a central portion of the space part (a portion in which a barrier layer or an interlayer insulating film was exposed) on the wafer after polishing was measured, and an average value of the level differences in the entire wafer was classified according to the following categories.

The level difference is erosion, and it can be evaluated that the smaller the level difference (an average value of the level differences) is, the more excellent the erosion suppressing property is.

AAA: The level difference is less than 5 nm

AA: The level difference is 5 nm or more and less than 8 nm

A: Steps are 8 nm or more and less than 10 nm

B: The level difference is 10 nm or more and less than 12 nm

C: The level difference is 12 nm or more and less than 15 nm

D: The level difference is 15 nm or more

The tables below show the evaluation results of the tests performed using the polishing liquid of each of Examples or Comparative Examples.

TABLE 14

| | Colloidal silica | | Organic acid | | Compound (1) | | Compound (2) | | Compound (3) | |
|---|---|---|---|---|---|---|---|---|---|---|
| Table 6-1 | Type | Amount (%) | Type | Amount (%) | Type | Amount (%) | Type | Amount (ppm) | Type | Amount (ppm) |
| Example 101 | PL1 | 4.50 | | | 5-MBTA | 0.0050 | Compound A | 0.030 | | |
| Example 102 | PL1 | 4.50 | | | BTA | 0.0050 | Compound B | 0.050 | | |
| Example 103 | PL1 | 4.50 | | | 5-MBTA | 0.0050 | Compound C | 0.030 | | |
| Example 104 | PL1 | 4.50 | | | Tetrazole | 0.0050 | Compound D | 0.030 | | |
| Example 105 | PL1 | 4.50 | | | Tetrazole | 0.0050 | Compound E | 0.050 | | |
| Example 106 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 107 | PL1 | 4.50 | | | 5-MBTA | 0.0500 | Compound A | 0.020 | | |
| Example 108 | PL1 | 4.50 | | | 5-MBTA | 0.0005 | Compound A | 0.040 | | |
| Example 109 | PL1 | 4.50 | | | 5-MBTA | 0.0050 | Compound A | 0.002 | | |
| Example 110 | PL1 | 4.50 | | | 5-MBTA | 0.0025 | Compound A | 0.300 | | |
| Example 111 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 112 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 113 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 114 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 115 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 116 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 117 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 118 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 119 | PL1 | 4.50 | | | 5-MBTA | 0.0050 | Compound A | 0.030 | | |
| | | | | | | | Compound B | 0.030 | | |
| | | | | | | | Compound C | 0.030 | | |

TABLE 14-continued

| | Colloidal silica | | Organic acid | | Compound (1) | | Compound (2) | | Compound (3) | |
|---|---|---|---|---|---|---|---|---|---|---|
| Table 6-1 | Type | Amount (%) | Type | Amount (%) | Type | Amount (%) | Type | Amount (ppm) | Type | Amount (ppm) |
| Example 120 | PL1 | 4.50 | | | 5-MBTA | 0.0050 | Compound A<br>Compound B<br>Compound C | 0.030<br>0.030<br>0.030 | | |

TABLE 15

| | | | Passivation film forming agent | | | Anionic surfactant | | | | |
|---|---|---|---|---|---|---|---|---|---|---|
| Table 6-1 (continued) | Ratio 1 | Ratio 2 | Type | ClogP | Amount (%) | Type | ClogP | Amount (%) | ΔClogP | Ratio 3 |
| Example 101 | 1667 | | | | | | | | | |
| Example 102 | 1,000 | | | | | | | | | |
| Example 103 | 1667 | | | | | | | | | |
| Example 104 | 1667 | | | | | | | | | |
| Example 105 | 1,000 | | | | | | | | | |
| Example 106 | 556 | | | | | | | | | |
| Example 107 | 25,000 | | | | | | | | | |
| Example 108 | 125 | | | | | | | | | |
| Example 109 | 19608 | | | | | | | | | |
| Example 110 | 83 | | | | | | | | | |
| Example 111 | 556 | | | | | N-LSAR | 5.55 | 0.002 | | |
| Example 112 | 556 | | Phthalic acid | 0.81 | 0.10 | | | | | |
| Example 113 | 556 | | 4-Me phthalic acid | 1.27 | 0.10 | | | | | |
| Example 114 | 556 | | 4-Nitrophthalic acid | 1 | 0.10 | | | | | |
| Example 115 | 556 | | Salicylic acid | 2.06 | 0.10 | | | | | |
| Example 116 | 556 | | 4-Me salicylic acid | 2.52 | 0.10 | | | | | |
| Example 117 | 556 | | Anthranilic acid | 1.21 | 0.10 | | | | | |
| Example 118 | 556 | | 4-Me benzoic acid | 2.36 | 0.10 | | | | | |
| Example 119 | 556 | | 4-tBu benzoic acid | 3.58 | 0.10 | | | | | |
| Example 120 | 556 | | 4-Pr benzoic acid | 3.42 | 0.10 | | | | | |

TABLE 16

| | $H_2O_2$ | Organic solvent | | | | | Dishing | Erosion |
|---|---|---|---|---|---|---|---|---|
| Table 6-1 (continued) | Amount (%) | Type | Amount (%) | pH Adjuster Amount | Water Amount | pH | suppressing property | suppressing property |
| Example 101 | 1.0 | ETG | 0.05 | Adjusted | Balance | 9.0 | A | B |
| Example 102 | 1.0 | ETG | 0.05 | Adjusted | Balance | 9.0 | A | B |
| Example 103 | 1.0 | ETG | 0.05 | Adjusted | Balance | 9.0 | A | B |
| Example 104 | 1.0 | ETG | 0.05 | Adjusted | Balance | 9.0 | A | B |
| Example 105 | 1.0 | ETG | 0.05 | Adjusted | Balance | 9.0 | A | B |
| Example 106 | 1.0 | ETG | 0.05 | Adjusted | Balance | 9.0 | A | B |
| Example 107 | 1.0 | ETG | 0.05 | Adjusted | Balance | 9.0 | B | B |
| Example 108 | 1.0 | ETG | 0.05 | Adjusted | Balance | 9.0 | A | B |
| Example 109 | 1.0 | ETG | 0.05 | Adjusted | Balance | 9.0 | A | B |
| Example 110 | 1.0 | ETG | 0.05 | Adjusted | Balance | 9.0 | B | B |
| Example 111 | 1.0 | ETG | 0.05 | Adjusted | Balance | 9.0 | A | A |
| Example 112 | 1.0 | ETG | 0.05 | Adjusted | Balance | 9.0 | A | A |
| Example 113 | 1.0 | ETG | 0.05 | Adjusted | Balance | 9.0 | A | A |
| Example 114 | 1.0 | ETG | 0.05 | Adjusted | Balance | 9.0 | A | A |
| Example 115 | 1.0 | ETG | 0.05 | Adjusted | Balance | 9.0 | A | A |
| Example 116 | 1.0 | ETG | 0.05 | Adjusted | Balance | 9.0 | A | A |
| Example 117 | 1.0 | ETG | 0.05 | Adjusted | Balance | 9.0 | A | A |
| Example 118 | 1.0 | ETG | 0.05 | Adjusted | Balance | 9.0 | A | A |
| Example 119 | 1.0 | ETG | 0.05 | Adjusted | Balance | 9.0 | A | A |
| Example 120 | 1.0 | ETG | 0.05 | Adjusted | Balance | 9.0 | A | A |

TABLE 17

| Table 6-2 | Colloidal silica Type | Colloidal silica Amount (%) | Organic acid Type | Organic acid Amount (%) | Compound (1) Type | Compound (1) Amount (%) | Compound (2) Type | Compound (2) Amount (ppm) | Compound (3) Type | Compound (3) Amount (ppm) |
|---|---|---|---|---|---|---|---|---|---|---|
| Example 121 | PL1 | 4.50 | | | 5-MBTA | 0.0050 | Compound A<br>Compound B<br>Compound C | 0.030<br>0.030<br>0.030 | | |
| Example 122 | PL1 | 4.50 | | | 5-MBTA | 0.0050 | Compound A<br>Compound B<br>Compound C | 0.030<br>0.030<br>0.030 | | |
| Example 123 | PL1 | 4.50 | | | 5-MBTA | 0.0050 | Compound A<br>Compound B<br>Compound C | 0.030<br>0.030<br>0.030 | | |
| Example 124 | PL1 | 4.50 | | | 5-MBTA | 0.0050 | Compound A<br>Compound B<br>Compound C | 0.030<br>0.030<br>0.030 | | |
| Example 125 | PL1 | 4.50 | | | 5-MBTA | 0.0050 | Compound A<br>Compound B<br>Compound C | 0.030<br>0.030<br>0.030 | | |
| Example 126 | PL1 | 4.50 | | | 5-MBTA | 0.0050 | Compound A<br>Compound B<br>Compound C | 0.030<br>0.030<br>0.030 | | |
| Example 127 | PL1 | 4.50 | | | 5-MBTA | 0.0050 | Compound A<br>Compound B<br>Compound C | 0.030<br>0.030<br>0.030 | | |
| Example 128 | PL1 | 4.50 | | | 5-MBTA | 0.0050 | Compound A<br>Compound B<br>Compound C | 0.030<br>0.030<br>0.030 | | |
| Example 129 | PL1 | 4.50 | | | 5-MBTA | 0.0050 | Compound A<br>Compound B<br>Compound C | 0.030<br>0.030<br>0.030 | | |
| Example 130 | PL1 | 4.50 | | | 5-MBTA | 0.0050 | Compound A<br>Compound B<br>Compound C | 0.030<br>0.030<br>0.030 | | |
| Example 131 | PL1 | 4.50 | | | 5-MBTA | 0.0050 | Compound A<br>Compound B<br>Compound C | 0.030<br>0.030<br>0.030 | | |
| Example 132 | PL1 | 4.50 | | | 5-MBTA | 0.0050 | Compound A<br>Compound B<br>Compound C | 0.030<br>0.030<br>0.030 | | |
| Example 133 | PL1 | 4.50 | | | 5-MBTA | 0.0050 | Compound A<br>Compound B<br>Compound C | 0.030<br>0.030<br>0.030 | | |
| Example 134 | PL1 | 4.50 | | | 5-MBTA | 0.0050 | Compound A<br>Compound B<br>Compound C | 0.030<br>0.030<br>0.030 | | |
| Example 135 | PL1 | 4.50 | | | 5-MBTA | 0.0050 | Compound A<br>Compound B<br>Compound C | 0.030<br>0.030<br>0.030 | | |
| Example 136 | PL1 | 4.50 | | | 5-MBTA | 0.0050 | Compound A<br>Compound B<br>Compound C | 0.030<br>0.030<br>0.030 | | |

TABLE 18

| Table 6-2 (continued) | Ratio 1 | Ratio 2 | Passivation film forming agent Type | Passivation film forming agent ClogP | Passivation film forming agent Amount (%) | Anionic surfactant Type | Anionic surfactant ClogP | Anionic surfactant Amount (%) | ΔClogP | Ratio 3 |
|---|---|---|---|---|---|---|---|---|---|---|
| Example 121 | 556 | | 1,4,5,8-Naphthalenetetracarboxylic acid | 1.37 | 0.10 | | | | | |
| Example 122 | 556 | | 6-Hydroxy-2-naphthalenecarboxylic acid | 2.39 | 0.10 | | | | | |
| Example 123 | 556 | | 1-Hydroxy-2-naphthalenecarboxylic acid | 3.29 | 0.10 | | | | | |
| Example 124 | 556 | | 3-Hydroxy-2-naphthalenecarboxylic acid | 3.29 | 0.10 | | | | | |
| Example 125 | 556 | | Phthalic acid | 0.81 | 0.10 | N-LSAR | 5.55 | 0.002 | 4.74 | 50.0 |
| Example 126 | 556 | | 4-Me phthalic acid | 1.27 | 0.10 | N-LSAR | 5.55 | 0.002 | 4.28 | 50.0 |
| Example 127 | 556 | | 4-Nitrophthalic acid | 1 | 0.10 | N-LSAR | 5.55 | 0.002 | 4.55 | 50.0 |
| Example 128 | 556 | | Salicylic acid | 2.06 | 0.10 | N-LSAR | 5.55 | 0.002 | 3.49 | 50.0 |
| Example 129 | 556 | | 4-Me salicylic acid | 2.52 | 0.10 | N-LSAR | 5.55 | 0.002 | 3.03 | 50.0 |
| Example 130 | 556 | | Anthranilic acid | 1.21 | 0.10 | N-LSAR | 5.55 | 0.002 | 4.34 | 50.0 |
| Example 131 | 556 | | 4-Me benzoic acid | 2.36 | 0.10 | N-LSAR | 5.55 | 0.002 | 3.19 | 50.0 |
| Example 132 | 556 | | 4-tBu benzoic acid | 3.58 | 0.10 | N-LSAR | 5.55 | 0.002 | 1.97 | 50.0 |
| Example 133 | 556 | | 4-Pr benzoic acid | 3.42 | 0.10 | N-LSAR | 5.55 | 0.002 | 2.13 | 50.0 |

TABLE 18-continued

| Table 6-2 (continued) | Ratio 1 | Ratio 2 | Passivation film forming agent Type | ClogP | Amount (%) | Anionic surfactant Type | ClogP | Amount (%) | ΔClogP | Ratio 3 |
|---|---|---|---|---|---|---|---|---|---|---|
| Example 134 | 556 | | 1,4,5,8-Naphthalenetetracarboxylic acid | 1.37 | 0.10 | N-LSAR | 5.55 | 0.002 | 4.18 | 50.0 |
| Example 135 | 556 | | 6-Hydroxy-2-naphthalenecarboxylic acid | 2.39 | 0.10 | N-LSAR | 5.55 | 0.002 | 3.16 | 50.0 |
| Example 136 | 556 | | 1-Hydroxy-2-naphthalenecarboxylic acid | 3.29 | 0.10 | N-LSAR | 5.55 | 0.002 | 2.26 | 50.0 |

TABLE 19

| Table 6-2 (continued) | $H_2O_2$ Amount (%) | Organic solvent Type | Amount (%) | pH Adjuster Amount | Water Amount | pH | Dishing suppressing property | Erosion suppressing property |
|---|---|---|---|---|---|---|---|---|
| Example 121 | 1.0 | ETG | 0.05 | Adjusted | Balance | 9.0 | AA | A |
| Example 122 | 1.0 | ETG | 0.05 | Adjusted | Balance | 9.0 | AA | A |
| Example 123 | 1.0 | ETG | 0.05 | Adjusted | Balance | 9.0 | A | A |
| Example 124 | 1.0 | ETG | 0.05 | Adjusted | Balance | 9.0 | A | A |
| Example 125 | 1.0 | ETG | 0.05 | Adjusted | Balance | 9.0 | AA | A |
| Example 126 | 1.0 | ETG | 0.05 | Adjusted | Balance | 9.0 | AA | AA |
| Example 127 | 1.0 | ETG | 0.05 | Adjusted | Balance | 9.0 | AA | AA |
| Example 128 | 1.0 | ETG | 0.05 | Adjusted | Balance | 9.0 | AA | AA |
| Example 129 | 1.0 | ETG | 0.05 | Adjusted | Balance | 9.0 | AA | AA |
| Example 130 | 1.0 | ETG | 0.05 | Adjusted | Balance | 9.0 | AA | AA |
| Example 131 | 1.0 | ETG | 0.05 | Adjusted | Balance | 9.0 | AA | AA |
| Example 132 | 1.0 | ETG | 0.05 | Adjusted | Balance | 9.0 | AA | A |
| Example 133 | 1.0 | ETG | 0.05 | Adjusted | Balance | 9.0 | AA | A |
| Example 134 | 1.0 | ETG | 0.05 | Adjusted | Balance | 9.0 | AAA | AA |
| Example 135 | 1.0 | ETG | 0.05 | Adjusted | Balance | 9.0 | AAA | AA |
| Example 136 | 1.0 | ETG | 0.05 | Adjusted | Balance | 9.0 | AA | A |

TABLE 20

| Table 6-3 | Colloidal silica Type | Amount (%) | Organic acid Type | Amount (%) | Compound (1) Type | Amount (%) | Compound (2) Type | Amount (ppm) | Compound (3) Type | Amount (%) |
|---|---|---|---|---|---|---|---|---|---|---|
| Example 137 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 138 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 139 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 140 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 141 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 142 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 143 | PL1 | 4.50 | | | 5-MBTA | 0.0050 | Compound A | 0.030 | | |
| | | | | | | | Compound B | 0.030 | | |
| | | | | | | | Compound C | 0.030 | | |
| Example 144 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 145 | PL1 | 4.50 | Malonic acid | 0.300 | 5-MBTA | 0.0050 | Compound A | 0.003 | | |
| | | | CA | 0.200 | | | Compound B | 0.002 | | |
| | | | | | | | Compound C | 0.004 | | |
| Example 146 | PL1 | 4.50 | Malonic acid | 0.300 | 5-MBTA | 0.0050 | Compound A | 0.003 | | |
| | | | CA | 0.200 | | | Compound B | 0.0035 | | |
| | | | | | | | Compound C | 0.004 | | |
| Example 147 | PL1 | 4.50 | Malonic acid | 0.003 | 5-MBTA | 0.0050 | Compound A | 0.030 | | |
| | | | CA | 0.001 | | | Compound B | 0.030 | | |
| | | | | | | | Compound C | 0.030 | | |

TABLE 20-continued

| Table 6-3 | Colloidal silica | | Organic acid | | Compound (1) | | Compound (2) | | Compound (3) | |
|---|---|---|---|---|---|---|---|---|---|---|
| | Type | Amount (%) | Type | Amount (%) | Type | Amount (%) | Type | Amount (ppm) | Type | Amount (%) |
| Example 148 | PL1 | 4.50 | Malonic acid | 0.003 | 5-MBTA | 0.0050 | Compound A | 0.045 | | |
| | | | CA | 0.001 | | | Compound B | 0.030 | | |
| | | | | | | | Compound C | 0.030 | | |
| Example 149 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 150 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 151 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 152 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |

TABLE 21

| Table 6-3 (continued) | Ratio 1 | Ratio 2 | Passivation film forming agent Type | ClogP | Amount (%) | Anionic surfactant Type | ClogP | Amount (%) | ΔClogP | Ratio 3 |
|---|---|---|---|---|---|---|---|---|---|---|
| Example 137 | 556 | | 3-Hydroxy-2-naphthalene-carboxylic acid | 3.29 | 0.10 | N-LSAR | 5.55 | 0.002 | 2.26 | 50.0 |
| Example 138 | 556 | | 4-Me phthalic acid | 1.27 | 0.10 | N-LSAR | 5.55 | 0.001 | 4.28 | 125.0 |
| Example 139 | 556 | | 4-Me phthalic acid | 1.27 | 0.10 | N-LSAR | 5.55 | 0.010 | 4.28 | 10.0 |
| Example 140 | 556 | | 4-Me phthalic acid | 1.27 | 0.10 | N-LSAR | 5.55 | 0.025 | 4.28 | 4.0 |
| Example 141 | 556 | | 4-Me phthalic acid | 1.27 | 0.10 | N-LSAR | 5.55 | 0.500 | 4.28 | 0.2 |
| Example 142 | 556 | | 4-Me phthalic acid | 1.27 | 0.01 | N-LSAR | 5.55 | 0.002 | 4.28 | 5.0 |
| Example 143 | 556 | | 4-Me phthalic acid | 1.27 | 0.05 | N-LSAR | 5.55 | 0.002 | 4.28 | 25.0 |
| Example 144 | 556 | 44,444 | 4-Me phthalic acid | 1.27 | 0.10 | N-LSAR | 5.55 | 0.002 | 4.28 | 50.0 |
| Example 145 | 5,556 | 555,556 | 4-Me phthalic acid | 1.27 | 0.10 | N-LSAR | 5.55 | 0.002 | 4.28 | 50.0 |
| Example 146 | 4762 | 476,190 | 4-Me phthalic acid | 1.27 | 0.10 | N-LSAR | 5.55 | 0.002 | 4.28 | 50.0 |
| Example 147 | 556 | 444 | 4-Me phthalic acid | 1.27 | 0.10 | N-LSAR | 5.55 | 0.002 | 4.28 | 50.0 |
| Example 148 | 476 | 381 | 4-Me phthalic acid | 1.27 | 0.10 | N-LSAR | 5.55 | 0.002 | 4.28 | 50.0 |
| Example 149 | 556 | 44,444 | 4-Me phthalic acid | 1.27 | 0.10 | N-LSAR | 5.55 | 0.001 | 4.28 | 125.0 |
| Example 150 | 556 | 44,444 | 4-Me phthalic acid | 1.27 | 0.10 | N-LSAR | 5.55 | 0.010 | 4.28 | 10.0 |
| Example 151 | 556 | 44,444 | 4-Me phthalic acid | 1.27 | 0.10 | N-LSAR | 5.55 | 0.025 | 4.28 | 4.0 |
| Example 152 | 556 | 44,444 | 4-Me phthalic acid | 1.27 | 0.10 | N-LSAR | 5.55 | 0.500 | 4.28 | 0.2 |

TABLE 22

| Table 6-3 (continued) | $H_2O_2$ Amount (%) | Organic solvent Type | Organic solvent Amount (%) | pH Adjuster Amount | Water Amount | pH | Dishing suppressing property | Erosion suppressing property |
|---|---|---|---|---|---|---|---|---|
| Example 137 | 1.0 | ETG | 0.05 | Adjusted | Balance | 9.0 | AA | A |
| Example 138 | 1.0 | ETG | 0.05 | Adjusted | Balance | 9.0 | AA | AA |
| Example 139 | 1.0 | ETG | 0.05 | Adjusted | Balance | 9.0 | AA | AA |
| Example 140 | 1.0 | ETG | 0.05 | Adjusted | Balance | 9.0 | AA | AA |
| Example 141 | 1.0 | ETG | 0.05 | Adjusted | Balance | 9.0 | AA | AA |
| Example 142 | 1.0 | ETG | 0.05 | Adjusted | Balance | 9.0 | AA | AA |
| Example 143 | 1.0 | ETG | 0.05 | Adjusted | Balance | 9.0 | AA | AA |
| Example 144 | 1.0 | ETG | 0.05 | Adjusted | Balance | 9.0 | AAA | AAA |
| Example 145 | 1.0 | ETG | 0.05 | Adjusted | Balance | 9.0 | AA | AA |
| Example 146 | 1.0 | ETG | 0.05 | Adjusted | Balance | 9.0 | AAA | AAA |
| Example 147 | 1.0 | ETG | 0.05 | Adjusted | Balance | 9.0 | AAA | AAA |
| Example 148 | 1.0 | ETG | 0.05 | Adjusted | Balance | 9.0 | AA | AA |
| Example 149 | 1.0 | ETG | 0.05 | Adjusted | Balance | 9.0 | AAA | AAA |
| Example 150 | 1.0 | ETG | 0.05 | Adjusted | Balance | 9.0 | AAA | AAA |
| Example 151 | 1.0 | ETG | 0.05 | Adjusted | Balance | 9.0 | AAA | AAA |
| Example 152 | 1.0 | ETG | 0.05 | Adjusted | Balance | 9.0 | AAA | AAA |

TABLE 23

| Table 6-4 | Colloidal silica Type | Colloidal silica Amount (%) | Organic acid Type | Organic acid Amount (%) | Compound (1) Type | Compound (1) Amount (%) | Compound (2) Type | Compound (2) Amount (ppm) | Compound (3) Type | Compound (3) Amount (%) |
|---|---|---|---|---|---|---|---|---|---|---|
| Example 153 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 154 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 155 | PL1 | 4.50 | Malonic acid | 0.300 | 5-MBTA1-HBTA | 0.0050 | Compound A | 0.030 | | |
| | | | CA | 0.100 | | 0.0200 | Compound B | 0.030 | | |
| | | | | | | | Compound C | 0.030 | | |
| Example 156 | PL1 | 4.50 | Malonic acid | 0.300 | 5-MBTA1-HBTA | 0.0050 | Compound A | 0.030 | | |
| | | | CA | 0.100 | | 0.0200 | Compound B | 0.030 | | |
| | | | | | | | Compound C | 0.030 | | |
| Example 157 | PL1 | 4.50 | Malonic acid | 0.300 | 5-MBTA1-HBTA | 0.0050 | Compound A | 0.030 | | |
| | | | CA | 0.100 | | 0.0200 | Compound B | 0.030 | | |
| | | | | | | | Compound C | 0.030 | | |
| Example 158 | PL1 | 4.50 | Malonic acid | 0.300 | 5-MBTA1-HBTA | 0.0050 | Compound A | 0.030 | | |
| | | | CA | 0.100 | | 0.0200 | Compound B | 0.030 | | |
| | | | | | | | Compound C | 0.030 | | |
| Example 159 | PL1 | 4.50 | Malonic acid | 0.300 | 5-MBTA1-HBTA | 0.0050 | Compound A | 0.030 | | |
| | | | CA | 0.100 | | 0.0200 | Compound B | 0.030 | | |
| | | | | | | | Compound C | 0.030 | | |
| Example 160 | PL1 | 4.50 | Malonic acid | 0.300 | 5-MBTA1-HBTA | 0.0050 | Compound A | 0.030 | | |
| | | | CA | 0.100 | | 0.0200 | Compound B | 0.030 | | |
| | | | | | | | Compound C | 0.030 | | |
| Example 161 | PL1 | 4.50 | Malonic acid | 0.300 | 5-MBTAI-HBTA | 0.0050 | Compound A | 0.030 | | |
| | | | CA | 0.100 | | 0.0200 | Compound B | 0.030 | | |
| | | | | | | | Compound C | 0.030 | | |
| Example 162 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 163 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 164 | PLI | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 165 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Example 166 | PL1 | 4.50 | Malonic acid | 0.300 | 5-MBTA | 0.0050 | Compound A | 0.030 | | |
| | | | CA | 0.100 | | | Compound B | 0.030 | | |
| | | | | | | | Compound C | 0.030 | | |
| Comparative Example 101 | PL1 | 4.50 | Malonic acid | 0.300 | 5-MBTA | 0.0050 | | | | |
| | | | CA | 0.100 | | | | | | |
| Comparative Example 102 | PL1 | 4.50 | Malonic acid | 0.300 | 1-HBTA | 0.0030 | | | 5-Ate | 0.003 |
| | | | CA | 0.100 | | | | | | |

TABLE 24

| Table 6-4 (continued) | Ratio 1 | Ratio 2 | Passivation film forming agent Type | Passivation film forming agent ClogP | Passivation film forming agent Amount (%) | Anionic surfactant Type | Anionic surfactant ClogP | Anionic surfactant Amount (%) | ΔClogP | Ratio 3 |
|---|---|---|---|---|---|---|---|---|---|---|
| Example 153 | 556 | 44,444 | 4-Me phthalic acid | 1.27 | 0.01 | N-LSAR | 5.55 | 0.002 | 4.28 | 5.0 |
| Example 154 | 556 | 44,444 | 4-Me phthalic acid | 1.27 | 0.05 | N-LSAR | 5.55 | 0.002 | 4.28 | 25.0 |
| Example 155 | 2778 | 44,444 | 4-Me phthalic acid | 1.27 | 0.10 | N-LSAR | 5.55 | 0.002 | 4.28 | 50.0 |
| Example 156 | 2778 | 44,444 | 4-Me phthalic acid | 1.27 | 0.10 | N-LSAR | 5.55 | 0.001 | 4.28 | 125.0 |
| Example 157 | 2778 | 44,444 | 4-Me phthalic acid | 1.27 | 0.10 | N-LSAR | 5.55 | 0.010 | 4.28 | 10.0 |
| Example 158 | 2778 | 44,444 | 4-Me phthalic acid | 1.27 | 0.10 | N-LSAR | 5.55 | 0.025 | 4.28 | 4.0 |
| Example 159 | 2778 | 44,444 | 4-Me phthalic acid | 1.27 | 0.10 | N-LSAR | 5.55 | 0.500 | 4.28 | 0.2 |
| Example 160 | 2778 | 44,444 | 4-Me phthalic acid | 1.27 | 0.01 | N-LSAR | 5.55 | 0.002 | 4.28 | 5.0 |
| Example 161 | 2778 | 44,444 | 4-Me phthalic acid | 1.27 | 0.05 | N-LSAR | 5.55 | 0.002 | 4.28 | 25.0 |
| Example 162 | 556 | 44,444 | 4-Me phthalic acid | 1.27 | 0.40 | N-LSAR | 5.55 | 0.002 | 4.28 | 200.0 |
| Example 163 | 556 | 44,444 | 4-Me phthalic acid | 1.27 | 0.60 | N-LSAR | 5.55 | 0.002 | 4.28 | 300.0 |
| Example 164 | 556 | 44,444 | 4-Me phthalic acid | 1.27 | 0.10 | N-LSAR | 5.55 | 0.002 | 4.28 | 50.0 |

TABLE 24-continued

| Table 6-4 (continued) | Ratio 1 | Ratio 2 | Passivation film forming agent Type | ClogP | Amount (%) | Anionic surfactant Type | ClogP | Amount (%) | ΔClogP | Ratio 3 |
|---|---|---|---|---|---|---|---|---|---|---|
| Example 165 | 556 | 44,444 | 4-Me phthalic acid | 1.27 | 0.10 | N-LSAR | 5.55 | 0.002 | 4.28 | 50.0 |
| Example 166 | 556 | 44,444 | 4-Me phthalic acid | 1.27 | 0.10 | N-LSAR | 5.55 | 0.002 | 4.28 | 50.0 |
| Comparative Example 101 | | | | | | | | | | |
| Comparative Example 102 | | | | | | | | | | |

TABLE 25

| Table 6-4 (continued) | $H_2O_2$ Amount (%) | Organic solvent Type | Organic solvent Amount (%) | pH Adjuster Amount | Water Amount | pH | Dishing suppressing property | Erosion suppressing property |
|---|---|---|---|---|---|---|---|---|
| Example 153 | 1.0 | ETG | 0.05 | Adjusted | Balance | 9.0 | AAA | AAA |
| Example 154 | 1.0 | ETG | 0.05 | Adjusted | Balance | 9.0 | AAA | AAA |
| Example 155 | 1.0 | ETG | 0.05 | Adjusted | Balance | 9.0 | AAA | AAA |
| Example 156 | 1.0 | ETG | 0.05 | Adjusted | Balance | 9.0 | AAA | AAA |
| Example 157 | 1.0 | ETG | 0.05 | Adjusted | Balance | 9.0 | AAA | AAA |
| Example 158 | 1.0 | ETG | 0.05 | Adjusted | Balance | 9.0 | AAA | AAA |
| Example 159 | 1.0 | ETG | 0.05 | Adjusted | Balance | 9.0 | AAA | AAA |
| Example 160 | 1.0 | ETG | 0.05 | Adjusted | Balance | 9.0 | AAA | AAA |
| Example 161 | 1.0 | ETG | 0.05 | Adjusted | Balance | 9.0 | AAA | AAA |
| Example 162 | 1.0 | ETG | 0.05 | Adjusted | Balance | 9.0 | AA | AA |
| Example 163 | 1.0 | ETG | 0.05 | Adjusted | Balance | 9.0 | A | AA |
| Example 164 | 1.0 | ETG | 0.05 | Adjusted | Balance | 7.8 | AA | A |
| Example 165 | 1.0 | ETG | 0.05 | Adjusted | Balance | 8.5 | AA | AA |
| Example 166 | 1.0 | ETG | 0.05 | Adjusted | Balance | 10.5 | AA | A |
| Comparative Example 101 | 1.0 | ETG | 0.05 | Adjusted | Balance | 9.0 | D | D |
| Comparative Example 102 | 1.0 | ETG | 0.05 | Adjusted | Balance | 9.0 | D | D |

From the results shown in the tables, it was confirmed that desired results could be obtained in a case of using the present polishing liquid.

Above all, it was confirmed that in a case where the mass ratio (ratio 1) of the content of the compound (1) to the content of the compound (2) is 100 or more, the effect of the present invention is more excellent (see the comparison of the results of Examples 108 and 110, and the like).

In addition, it was confirmed that in a case where the mass ratio (ratio 1) of the content of the compound (1) to the content of the compound (2) is 20,000 or less, the effect of the present invention is more excellent (see the comparison of the results of Examples 107 and 109, and the like).

It was confirmed that in a case where the present polishing liquid includes an anionic surfactant, the erosion suppressing property is excellent (see the comparison of the results of Examples 106 and 111, and the like).

It was confirmed that in a case where the present polishing liquid includes a passivation film forming agent, the erosion suppressing property is excellent (see the comparison of the results of Examples 106 and 112 to 124, and the like).

Above all, it was confirmed that in a case where the present polishing liquid includes 1,4,5,8-naphthalenetetracarboxylic acid or 6-hydroxy-2-naphthalenecarboxylic acid as a passivation film forming agent, the effect of the present invention is more excellent, as compared with a case where the present polishing liquid includes other passivation film forming agents (see the comparison of the results of Examples 112 to 124, and the like).

In addition, it was confirmed that in a case where the present polishing liquid includes a passivation film forming agent having a C log P value of 1.0 or more, the erosion suppressing property is more excellent, as compared with a case where the present polishing liquid includes a passivation film forming agent having a C log P value of less than 1.0 (see the comparison of the results of Examples 125 and 127, and the like).

It was confirmed that in a case where the present polishing liquid includes both a passivation film forming agent and an anionic surfactant, the effect of the present invention is more excellent (see the comparison of the results of Examples 111 to 137, and the like).

Above all, it was confirmed that in a case where a difference value (AC log P value) obtained by subtracting the C log P value of the passivation film forming agent from the C log P value of the anionic surfactant is 2.50 or more, the erosion suppressing property is excellent (see the comparison of the results of Examples 126 to 137, and the like).

In addition, it was confirmed that in a case where the mass ratio (ratio 3) of the content of the passivation film forming agent to the content of the anionic surfactant is less than 300, the effect of the present invention is more excellent, and in a case where the ratio 3 is less than 200, the effect of the present invention is further excellent and the erosion suppressing property is more excellent (see the comparison of the results of Examples 149, 162, and 163, and the like).

It was confirmed that in a case where the present polishing liquid includes an organic acid, the effect of the present invention is more excellent and the erosion suppressing property is excellent (see the comparison of the results of Examples 126, 138 to 144, and 149 to 154, and the like).

Above all, it was confirmed that in a case where the mass ratio (ratio 2) of the content of the organic acid to the content of the compound (2) in the polishing liquid is 400 or more, the effect of the present invention is more excellent (see the comparison of the results of Examples 147 and 148, and the like).

In addition, it was confirmed that in a case where the mass ratio (ratio 1) of the content of the compound (1) to the content of the compound (2) is 20,000 or less, the effect of the present invention is more excellent (see the comparison of the results of Examples 145 and 146, and the like).

It was confirmed that in a case where the pH of the present polishing liquid is 8.0 or more, the erosion suppressing property is excellent; and in a case where the pH of the polishing liquid is 8.7 or more, the effect of the present invention and the erosion suppressing property are more excellent (see the comparison of the results in Examples 144, 164, and 165, and the like).

In addition, it was confirmed that in a case where the pH of the present polishing liquid is less than 10.5, the effect of the present invention and the erosion suppressing property are more excellent (see the comparison of the results of Examples 144 and 166, and the like).

Example 2B

Further, the following tests were performed while changing a polishing pressure (a contact pressure for contacting the surface to be polished and the polishing pad), using the polishing liquid of each of Examples 144, 146, 147, and 149 to 152 described above.

[Tests]

<Evaluation of Scratch Suppressing Property—3>

The same wafer as used in <Evaluation of Dishing Suppressing Property—1> described above was polished under the conditions where a supply rate of the polishing liquid was fixed at 0.28 ml/(min·cm$^2$) and a polishing pressure was set as shown in Table 7 below, using a FREX300SII (polishing device).

First, Co (bulk) of the non-wiring part was completely polished using CSL5250C (trade name, manufactured by FUJIFILM Planar Solutions, LLC), and then polishing was further performed for 10 seconds. Thereafter, polishing was performed for 1 minute under the same conditions, using each of the polishing liquids of Examples 134 to 140.

The wafer after polishing was cleaned with a cleaning liquid (pCMP liquid) (alkaline cleaning liquid: CL9010 (manufactured by Fujifilm Electronics Materials Co., Ltd.)) for 1 minute in a cleaning unit, further subjected to isopropanol (IPA) cleaning for 30 minutes, and then subjected to a drying treatment.

The obtained wafer was measured by a defect detection device, coordinates where defects having a major diameter of 0.06 μm or more were present were identified, and then the types of the defects at the identified coordinates were classified. The number of scratches (scratch-like defects) detected on the wafer was classified according to the following categories.

It can be evaluated that the smaller the number of the scratches is, the more excellent the scratch suppressing property is.

AAA: The number of the scratches is 1 or less

AA: The number of the scratches is 2 or 3

A: The number of the scratches is 4 or 5

B: The number of the scratches is 6 to 10

C: The number of the scratches is 11 to 15

D: The number of the scratches is 16 or more

<Evaluation of Uniformity—3>

Evaluated of the Uniformity was performed in the same manner as in <Evaluation of Uniformity—1>, except that the polishing liquids of Examples 144, 146, 147, and 149 to 152 described above were used.

The evaluation results of the tests performed while changing the contact pressure are shown below.

TABLE 26

| | | Polishing pressure (psi) | | | | | |
|---|---|---|---|---|---|---|---|
| | Table 7 | 0.25 | 0.5 | 1 | 2 | 3 | 3.5 |
| Example 144 | Scratch suppressing property | A | AA | AA | AA | AA | C |
| | Uniformity | C | AA | AAA | AAA | AAA | B |
| Example 146 | Scratch suppressing property | A | AA | AA | AA | AA | C |
| | Uniformity | C | AA | AAA | AAA | AAA | B |
| Example 147 | Scratch suppressing property | A | AA | AA | AA | AA | C |
| | Uniformity | C | AA | AAA | AAA | AAA | B |
| Example 149 | Scratch suppressing property | A | AA | AA | AA | AA | C |
| | Uniformity | C | AA | AAA | AAA | AAA | B |
| Example 150 | Scratch suppressing property | A | AA | AA | AA | AA | C |
| | Uniformity | C | AA | AAA | AAA | AAA | B |
| Example 151 | Scratch suppressing property | AA | AAA | AAA | AAA | AAA | B |
| | Uniformity | C | AA | AAA | AAA | AAA | B |
| Example 152 | Scratch suppressing property | AA | AAA | AAA | AAA | AAA | B |
| | Uniformity | C | AA | AAA | AAA | AAA | B |

As shown in the table, it was confirmed that the polishing pressure is preferably 0.5 to 3.0 psi, and more preferably 1.0 to 3.0 psi.

Example 2C

Further, the following tests were performed while changing the supply rate of the polishing liquid, using the polishing liquid of each of Examples 144, 146, 147, and 149 to 152 described above.

[Tests]

<Evaluation of Scratch Suppressing Property—4>

Evaluation of the scratch suppressing property was performed in the same manner as in <Evaluation of Scratch Suppressing Property—3>, except that the supply rate of the polishing liquid was changed as shown in the table below and the polishing pressure was fixed at 2.0 psi.

<Evaluation of Uniformity—4>

In addition, evaluation of the uniformity was performed in the same manner as in <Evaluation of Uniformity—3>, except that the supply rate of the polishing liquid was changed as shown in the table below and the polishing pressure was fixed at 2.0 psi.

The evaluation results of the tests performed while changing the supply rate of the polishing liquid are shown below.

TABLE 27

| | Table 8 | Supply rate (ml/(min · $cm^2$)) of polishing liquid | | | | | |
|---|---|---|---|---|---|---|---|
| | | 0.1 | 0.14 | 0.21 | 0.28 | 0.35 | 0.4 |
| Example 144 | Scratch suppressing property | C | AA | AA | AA | AA | A |
| | Uniformity | B | AA | AAA | AAA | AAA | C |
| Example 146 | Scratch suppressing property | C | AA | AA | AA | AA | A |
| | Uniformity | B | AA | AAA | AAA | AAA | C |
| Example 147 | Scratch suppressing property | C | AA | AA | AA | AA | A |
| | Uniformity | B | AA | AAA | AAA | AAA | C |
| Example 149 | Scratch suppressing property | C | AA | AA | AA | AA | A |
| | Uniformity | B | AA | AAA | AAA | AAA | C |
| Example 150 | Scratch suppressing property | C | AA | AA | AA | AA | A |
| | Uniformity | B | AA | AAA | AAA | AAA | C |
| Example 151 | Scratch suppressing property | C | AAA | AAA | AAA | AAA | AA |
| | Uniformity | B | AA | AAA | AAA | AAA | C |
| Example 152 | Scratch suppressing property | C | AAA | AAA | AAA | AAA | AA |
| | Uniformity | B | AA | AAA | AAA | AAA | C |

As shown in the table, it was confirmed that the supply rate of the polishing liquid is preferably 0.14 to 0.35 ml/(min·$cm^2$), and more preferably 0.21 to 0.35 ml/(min·$cm^2$).

Example 2D

Further, the following tests were performed while changing the type of the cleaning liquid (pCMP liquid), using the polishing liquid of each of Examples 144, 146, 147, and 149 to 152 described above.

[Tests]

<Evaluation of Residue Suppressing Property—2>

A wafer was treated in the same manner as in <Evaluation of Scratch Suppressing Property—3>, except that the polishing pressure was fixed at 2.0 psi and the type of the cleaning liquid to be used was changed as shown in Table 9.

The obtained wafer was measured by a defect detection device, coordinates where defects having a major diameter of 0.06 μm or more were present were identified, and then the types of the defects at the identified coordinates were classified. The number of residues (residue-based defects) detected on the wafer was classified according to the following categories.

It can be evaluated that the smaller the number of the residues is, the more excellent the residue suppressing property is.

AAA: The number of the residues is less than 200

AA: The number of the residues is 200 or more and less than 350

A: The number of the residues is 350 or more and less than 500

B: The number of the residues is 500 or more and less than 750

C: The number of the residues is 750 or more and less than 1,000

D: The number of the residues is 1,000 or more

<Evaluation of Corrosion Suppressing Property—2>

A wafer was treated in the same manner as in <Evaluation of Residue Suppressing Property—2> described above.

The surface roughness (Ra) on the Co wiring line (wiring line with a width of 100 μm) exposed on a surface in the surface to be polished in the obtained wafer was measured with an atomic force microscope (AFM) at N=3, and average Ra's were classified according to the following categories.

It can be evaluated that the smaller Ra is, the more excellent the corrosion suppressing property is.

AAA: Ra of the measured area of 5 μm is less than 1.0 nm

AA: Ra of the measured area of 5 μm is 1.0 nm or more and less than 1.5 nm

A: Ra of the measured area of 5 μm is 1.5 nm or more and less than 2.0 nm

B: Ra of the measured area of 5 μm is 2.0 nm or more and less than 2.5 nm

C: Ra of the measured area of 5 μm is 2.5 nm or more and less than 3.0 nm

D: Ra of the measured area of 5 μm is 3.0 nm or more

The evaluation results of the tests performed while changing the type of the cleaning liquid are shown below.

TABLE 28

| | Table 9 | Cleaning liquid | | |
|---|---|---|---|---|
| | | DIW | Acidic | Alkaline |
| Example 144 | Residue suppressing property | C | B | AAA |
| | Corrosion suppressing property | AAA | C | AAA |
| Example 146 | Residue suppressing property | C | B | AAA |
| | Corrosion suppressing property | AAA | C | AAA |
| Example 147 | Residue suppressing property | C | B | AAA |
| | Corrosion suppressing property | AAA | C | AAA |
| Example 149 | Residue suppressing property | C | B | AAA |
| | Corrosion suppressing property | AAA | C | AAA |
| Example 150 | Residue suppressing property | C | B | AAA |
| | Corrosion suppressing property | AAA | C | AAA |
| Example 151 | Residue suppressing property | C | B | AAA |
| | Corrosion suppressing property | AAA | C | AAA |
| Example 152 | Residue suppressing property | C | B | AAA |
| | Corrosion suppressing property | AAA | C | AAA |

DIW: Water

Acidic: CLEAN100 (manufactured by Fujifilm Electronics Materials Co., Ltd.: acidic cleaning liquid)

Alkaline: CL9010 (manufactured by Fujifilm Electronics Materials Co., Ltd.: alkaline cleaning liquid)

As shown in the table, it was confirmed that the alkaline cleaning liquid is preferable as the cleaning liquid.

Example 2E

Further, the following tests were performed while changing the type of the object to be polished, using the polishing liquid of each of Examples 134 to 140 described above.

[Tests]

<Evaluation of Polishing Speed (RR)—3>

A wafer (diameter: 12 inches (30.48 cm)) having a film consisting of Co, Cu, TiN, Ta, TaN, SiN, TEOS, SiOC, or SiC on the surface was polished under the conditions that a polishing pressure was set to 2.0 psi and a supply rate of the polishing liquid was set to 0.28 ml/(min·$cm^2$), using FREX300SII (polishing device).

The film thickness before and after polishing was measured with a polishing time of 1 minute, a polishing speed RR (nm/min) was calculated from a difference in the film thickness, and the polishing speed was evaluated with respect to each material according to the following categories.

(Case where Film is TiN, Ta, TaN, TEOS, or SiOC)

A: RR is 50 nm/min or more

B: RR is less than 50 nm/min (Case where the Film is Co, SiN, or SiC)

A: RR is 20 nm/min or more

B: RR is less than 20 nm/min

The evaluation results are shown below.

Furthermore, a speed ratio of the polishing speed of Co to the polishing speed of TiN, Ta, TaN, SiN, TEOS, SiOC, or SiC (polishing speed of Co/polishing speed of TiN, Ta, TaN, SiN, TEOS, SiOC, or SiC) was in the range of more than 0.05 and less than 5.

TABLE 29

| | Object to be polished | | | | | | | |
|---|---|---|---|---|---|---|---|---|
| Table 10 | Co | TiN | Ta | TaN | SiN | TEOS | SiOC | SiC |
| Example 144 | A | A | A | A | A | A | A | A |
| Example 146 | A | A | A | A | A | A | A | A |
| Example 147 | A | A | A | A | A | A | A | A |
| Example 149 | A | A | A | A | A | A | A | A |
| Example 150 | A | A | A | A | A | A | A | A |
| Example 151 | A | A | A | A | A | A | A | A |
| Example 152 | A | A | A | A | A | A | A | A |

As shown in the results, it was confirmed that the present polishing liquid has no extreme difference between the polishing speed for Co and the polishing speed for TiN, Ta, TaN, SiN, TEOS, SiOC, or SiC, and is suitable as a polishing liquid used for removing a barrier layer and the like.

Furthermore, in the present polishing liquid, the polishing speed with respect to Co can be optionally adjusted (adjusted to, for example, between 0 and 30 nm/min) by adjusting the content of hydrogen peroxide in the polishing liquid.

Example 3A

[Preparation of Polishing Liquid]

<Raw Materials>

The polishing liquids described in Table 11-1 to Table 11-4 below were prepared using the raw materials used for preparing the polishing liquid in Example 1A described above and the following raw materials.

(Polymer Compound)

Polyacrylic acid (PAA)

(Cationic Compound)

Tetrabutylammonium hydroxide (TBAH)

<Preparation of Polishing Liquid>

In the same manner as in <Preparation of Polishing Liquid> in Example 1A described above, the respective raw materials (or aqueous solutions thereof) were filtered, and the respective raw materials (or aqueous solutions thereof) after the filtration treatment were mixed to prepare the polishing liquid of each of Examples or Comparative Examples shown in Table 11-1 to Table 11-4 below.

The components of the produced polishing liquid are shown in Table 11-1 to Table 11-4 below.

In the tables, the "Amount" column, the "%" column, the "ppm" column, the description in the "Adjusted" as the content of the pH adjuster, the description in the "Balance" as the amount of water to be added, the "ΔC log P" column, and the "Ratio 1" column all show the same items as those described in each column in Table 6 in Example 2A described above.

The "Ratio 2" column in the tables shows a mass ratio (content of the passivation film forming agent/content of the anionic surfactant) of the content of the passivation film forming agent to the content of the anionic surfactant in the polishing liquid.

The "ΔC Log P" column shows a value of a difference (C log P value of the anionic surfactant−C log P value of the passivation film forming agent) obtained by subtracting the C log P value of the passivation film forming agent from the C log P value of the anionic surfactant.

In the tables, the "Molecular weight" column shows a polystyrene-equivalent value of the weight-average molecular weight of the polymer compound measured by a GPC method using HLC-8020GPC (manufactured by Tosoh Corporation), and using TSKgel SuperHZM-H, TSKgel SuperHZ4000, and TSKgel SuperHZ2000 (manufactured by Tosoh Corporation, 4.6 mm ID×15 cm) as columns and tetrahydrofuran (THF) as an eluent.

For example, the polishing liquid of Example 201 includes 2.00% by mass of PL1 as colloidal silica, 0.005% by mass of 5-methylbenzotriazole as the compound (1), 0.03 ppm by mass of the compound A having the structural formula as the compound (2), 0.1% by mass of a polyacrylic acid as the polymer compound, 1.0% by mass of hydrogen peroxide, 0.05% by mass of ethylene glycol as an organic solvent, and a pH adjuster in an amount that brings the pH of the final polishing liquid to 3.2 as a whole, and the residual component is water.

[Tests]

The following evaluations were each performed using the obtained polishing liquids.

<Evaluation of Dishing Suppressing Property—3>

Evaluation of the dishing suppressing property was performed in the same manner as in <Evaluation of Dishing Suppressing Property—2> of Example 2A.

<Evaluation of Erosion Suppressing Property—2>

Evaluation of the erosion suppressing property was performed in the same manner as in <Evaluation of Erosion Suppressing Property—1> of Example 2A.

Table 11-1 to Table 11-4 below show the evaluation results of the tests performed using the polishing liquid of each of Examples or Comparative Examples.

TABLE 30

| | Colloidal silica | | Compound (1) | | Compound (2) | | Compound (3) | | |
|---|---|---|---|---|---|---|---|---|---|
| Table 11-1 | Type | Amount (%) | Type | Amount (%) | Type | Amount (ppm) | Type | Amount (ppm) | Ratio 1 |
| Example 201 | PL1 | 2.00 | 5-MBTA | 0.0050 | Compound A | 0.030 | | | 1,667 |
| Example 202 | PL1 | 2.00 | BTA | 0.0050 | Compound B | 0.050 | | | 1,000 |
| Example 203 | PL1 | 2.00 | 5-MBTA | 0.0050 | Compound C | 0.030 | | | 1,667 |
| Example 204 | PL1 | 2.00 | Tetrazole | 0.0050 | Compound D | 0.030 | | | 1,667 |
| Example 205 | PL1 | 2.00 | Tetrazole | 0.0050 | Compound E | 0.050 | | | 1,000 |
| Example 206 | PL1 | 4.50 | 5-MBTA | 0.0500 | Compound A | 0.020 | | | 25,000 |
| Example 207 | PL1 | 4.50 | 5-MBTA | 0.0005 | Compound A | 0.040 | | | 125 |
| Example 208 | PL1 | 4.50 | 5-META | 0.0050 | Compound A | 0.002 | | | 19,608 |

TABLE 30-continued

| | Colloidal silica | | Compound (1) | | Compound (2) | | Compound (3) | | |
|---|---|---|---|---|---|---|---|---|---|
| Table 11-1 | Type | Amount (%) | Type | Amount (%) | Type | Amount (ppm) | Type | Amount (ppm) | Ratio 1 |
| Example 209 | PL1 | 4.50 | 5-MBTA | 0.0025 | Compound A | 0.300 | | | 83 |
| Example 210 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 211 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 212 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 213 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 214 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 215 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 216 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 217 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 218 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 219 | PL1 | 2.00 | 5-MBTA | 0.0050 | Compound A | 0.030 | | | |
| | | | | | Compound B | 0.030 | | | 556 |
| | | | | | Compound C | 0.030 | | | |
| Example 220 | PL1 | 2.00 | 5-MBTA | 0.0050 | Compound A | 0.030 | | | |
| | | | | | Compound B | 0.030 | | | 556 |
| | | | | | Compound C | 0.030 | | | |

TABLE 31

| | Passivation film forming agent | | | Polymer compound | | | Cationic compound | | Anionic surfactant | | |
|---|---|---|---|---|---|---|---|---|---|---|---|
| Table 11-1 (continued) | Type | ClogP | Amount (%) | Type | Molecular amount | Amount (%) | Type | Amount (%) | Type | ClogP | Amount (%) |
| Example 201 | | | | PAA | 25,000 | 0.1 | | | | | |
| Example 202 | | | | PAA | 25,000 | 0.1 | | | | | |
| Example 203 | | | | PAA | 25,000 | 0.1 | | | | | |
| Example 204 | | | | PAA | 25,000 | 0.1 | | | | | |
| Example 205 | | | | PAA | 25,000 | 0.1 | | | | | |
| Example 206 | | | | PAA | 25,000 | 0.1 | | | | | |
| Example 207 | | | | PAA | 25,000 | 0.1 | | | | | |
| Example 208 | | | | PAA | 25,000 | 0.1 | | | | | |
| Example 209 | | | | PAA | 25,000 | 0.1 | | | | | |
| Example 210 | | | | PAA | 25,000 | 0.1 | | | | | |
| Example 211 | | | | PAA | 25,000 | 0.1 | | | N-LSAR | 5.55 | 0.002 |
| Example 212 | Phthalic acid | 0.81 | 0.10 | PAA | 25,000 | 0.1 | | | | | |
| Example 213 | 4-Me phthalic acid | 1.27 | 0.10 | PAA | 25,000 | 0.1 | | | | | |
| Example 214 | 4-Nitrophthalic acid | 1 | 0.10 | PAA | 25,000 | 0.1 | | | | | |
| Example 215 | Salicylic acid | 2.06 | 0.10 | PAA | 25,000 | 0.1 | | | | | |
| Example 216 | 4-Me salicylic acid | 2.52 | 0.10 | PAA | 25,000 | 0.1 | | | | | |
| Example 217 | Anthranilic acid | 1.21 | 0.10 | PAA | 25,000 | 0.1 | | | | | |
| Example 218 | 4-Me benzoic acid | 2.36 | 0.10 | PAA | 25,000 | 0.1 | | | | | |
| Example 219 | 4-tBu benzoic acid | 3.58 | 0.10 | PAA | 25,000 | 0.1 | | | | | |
| Example 220 | 4-Pr benzoic acid | 3.42 | 0.10 | PAA | 25,000 | 0.1 | | | | | |

TABLE 32

| Table 11-1 (continued) | ΔClogP | Ratio 2 | $H_2O_2$ Amount (%) | Organic solvent Type | Organic solvent Amount (%) | pH adjuster Amount | Water Amount | pH | Dishing suppressing property | Erosion suppressing property |
|---|---|---|---|---|---|---|---|---|---|---|
| Example 201 | | | 1.0 | ETG | 0.05 | Adjusted | Balance | 3.2 | A | B |
| Example 202 | | | 1.0 | ETG | 0.05 | Adjusted | Balance | 3.2 | A | B |
| Example 203 | | | 1.0 | ETG | 0.05 | Adjusted | Balance | 3.2 | A | B |
| Example 204 | | | 1.0 | ETG | 0.05 | Adjusted | Balance | 3.2 | A | B |
| Example 205 | | | 1.0 | ETG | 0.05 | Adjusted | Balance | 3.2 | A | B |
| Example 206 | | | 1.0 | ETG | 0.05 | Adjusted | Balance | 9.0 | B | B |
| Example 207 | | | 1.0 | ETG | 0.05 | Adjusted | Balance | 9.0 | A | B |
| Example 208 | | | 1.0 | ETG | 0.05 | Adjusted | Balance | 9.0 | A | B |
| Example 209 | | | 1.0 | ETG | 0.05 | Adjusted | Balance | 9.0 | B | B |
| Example 210 | | | 1.0 | ETG | 0.05 | Adjusted | Balance | 3.2 | A | B |
| Example 211 | | | 1.0 | ETG | 0.05 | Adjusted | Balance | 3.2 | A | A |
| Example 212 | | | 1.0 | ETG | 0.05 | Adjusted | Balance | 3.2 | A | A |
| Example 213 | | | 1.0 | ETG | 0.05 | Adjusted | Balance | 3.2 | A | A |
| Example 214 | | | 1.0 | ETG | 0.05 | Adjusted | Balance | 3.2 | A | A |
| Example 215 | | | 1.0 | ETG | 0.05 | Adjusted | Balance | 3.2 | A | A |
| Example 216 | | | 1.0 | ETG | 0.05 | Adjusted | Balance | 3.2 | A | A |
| Example 217 | | | 1.0 | ETG | 0.05 | Adjusted | Balance | 3.2 | A | A |
| Example 218 | | | 1.0 | ETG | 0.05 | Adjusted | Balance | 3.2 | A | A |
| Example 219 | | | 1.0 | ETG | 0.05 | Adjusted | Balance | 3.2 | A | A |
| Example 220 | | | 1.0 | ETG | 0.05 | Adjusted | Balance | 3.2 | A | A |

TABLE 33

| Table 11-2 | Colloidal silica Type | Colloidal silica Amount (%) | Compound (1) Type | Compound (1) Amount (%) | Compound (2) Type | Compound (2) Amount (ppm) | Compound (3) Type | Compound (3) Amount (ppm) | Ratio 1 |
|---|---|---|---|---|---|---|---|---|---|
| Example 221 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 222 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 223 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 224 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 225 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 226 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 227 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 228 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 229 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 230 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 231 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 232 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 233 | PL1 | 2.00 | 5-MBTA | 0.0050 | Compound A | 0.030 | | | 556 |
| | | | | | Compound B | 0.030 | | | |
| | | | | | Compound C | 0.030 | | | |

TABLE 33-continued

| Table 11-2 | Colloidal silica Type | Colloidal silica Amount (%) | Compound (1) Type | Compound (1) Amount (%) | Compound (2) Type | Compound (2) Amount (ppm) | Compound (3) Type | Compound (3) Amount (ppm) | Ratio 1 |
|---|---|---|---|---|---|---|---|---|---|
| Example 234 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 235 | PL1 | 2.00 | 5-MBTA | 0.0050 | Compound A | 0.030 | | | 556 |
| | | | | | Compound B | 0.030 | | | |
| | | | | | Compound C | 0.030 | | | |

TABLE 34

| Table 11-2 (continued) | Passivation film forming agent Type | Passivation film forming agent ClogP | Passivation film forming agent Amount (%) | Polymer compound Type | Polymer compound Molecular amount | Polymer compound Amount (%) | Cationic compound Type | Cationic compound Amount (%) | Anionic surfactant Type | Anionic surfactant ClogP | Anionic surfactant Amount (%) |
|---|---|---|---|---|---|---|---|---|---|---|---|
| Example 221 | 1,4,5,8-Naphthalenetetracarboxylic acid | 1.37 | 0.10 | PAA | 25,000 | 0.1 | | | | | |
| Example 222 | 6-Hydroxy-2-naphthalenecarboxylic acid | 2.39 | 0.10 | PAA | 25,000 | 0.1 | | | | | |
| Example 223 | 1-Hydroxy-2-naphthalenecarboxylic acid | 3.29 | 0.10 | PAA | 25,000 | 0.1 | | | | | |
| Example 224 | 3-Hydroxy-2-naphthalenecarboxylic acid | 3.29 | 0.10 | PAA | 25,000 | 0.1 | | | | | |
| Example 225 | Phthalic acid | 0.81 | 0.10 | PAA | 25,000 | 0.1 | | | N-LSAR | 5.55 | 0.002 |
| Example 226 | 4-Me phthalic acid | 1.27 | 0.10 | PAA | 25,000 | 0.1 | | | N-LSAR | 5.55 | 0.002 |
| Example 227 | 4-Nitrophthalic acid | 1 | 0.10 | PAA | 25,000 | 0.1 | | | N-LSAR | 5.55 | 0.002 |
| Example 228 | Salicylic acid | 2.06 | 0.10 | PAA | 25,000 | 0.1 | | | N-LSAR | 5.55 | 0.002 |
| Example 229 | 4-Me salicylic acid | 2.52 | 0.10 | PAA | 25,000 | 0.1 | | | N-LSAR | 5.55 | 0.002 |
| Example 230 | Anthranilic acid | 1.21 | 0.10 | PAA | 25,000 | 0.1 | | | N-LSAR | 5.55 | 0.002 |
| Example 231 | 4-Me benzoic acid | 2.36 | 0.10 | PAA | 25,000 | 0.1 | | | N-LSAR | 5.55 | 0.002 |
| Example 232 | 4-tBu benzoic acid | 3.58 | 0.10 | PAA | 25,000 | 0.1 | | | N-LSAR | 5.55 | 0.002 |
| Example 233 | 4-Pr benzoic acid | 3.42 | 0.10 | PAA | 25,000 | 0.1 | | | N-LSAR | 5.55 | 0.002 |
| Example 234 | 1,4,5,8-naphthalenecarboxylic acid | 1.37 | 0.10 | PAA | 25,000 | 0.1 | | | N-LSAR | 5.55 | 0.002 |
| Example 235 | 6-Hydroxy-2-naphthalenecarboxylic acid | 2.39 | 0.10 | PAA | 25,000 | 0.1 | | | N-LSAR | 5.55 | 0.002 |

TABLE 35

| Table 11-2 (continued) | ΔClogP | Ratio 2 | $H_2O_2$ Amount (%) | Organic solvent Type | Organic solvent Amount (%) | pH Adjuster Amount | Water Amount | pH | Dishing suppressing property | Erosion suppressing property |
|---|---|---|---|---|---|---|---|---|---|---|
| Example 221 | | | 1.0 | ETG | 0.05 | Adjusted | Balance | 3.2 | AA | A |
| Example 222 | | | 1.0 | ETG | 0.05 | Adjusted | Balance | 3.2 | AA | A |
| Example 223 | | | 1.0 | ETG | 0.05 | Adjusted | Balance | 3.2 | A | A |
| Example 224 | | | 1.0 | ETG | 0.05 | Adjusted | Balance | 3.2 | A | A |
| Example 225 | 4.74 | 50.0 | 1.0 | ETG | 0.05 | Adjusted | Balance | 3.2 | AA | A |
| Example 226 | 4.28 | 50.0 | 1.0 | ETG | 0.05 | Adjusted | Balance | 3.2 | AA | AA |
| Example 227 | 4.55 | 50.0 | 1.0 | ETG | 0.05 | Adjusted | Balance | 3.2 | AA | AA |
| Example 228 | 3.49 | 50.0 | 1.0 | ETG | 0.05 | Adjusted | Balance | 3.2 | AA | AA |
| Example 229 | 3.03 | 50.0 | 1.0 | ETG | 0.05 | Adjusted | Balance | 3.2 | AA | AA |
| Example 230 | 4.34 | 50.0 | 1.0 | ETG | 0.05 | Adjusted | Balance | 3.2 | AA | AA |
| Example 231 | 3.19 | 50.0 | 1.0 | ETG | 0.05 | Adjusted | Balance | 3.2 | AA | AA |
| Example 232 | 1.97 | 50.0 | 1.0 | ETG | 0.05 | Adjusted | Balance | 3.2 | AA | A |
| Example 233 | 2.13 | 50.0 | 1.0 | ETG | 0.05 | Adjusted | Balance | 3.2 | AA | A |
| Example 234 | 4.18 | 50.0 | 1.0 | ETG | 0.05 | Adjusted | Balance | 3.2 | AAA | AA |
| Example 235 | 3.16 | 50.0 | 1.0 | ETG | 0.05 | Adjusted | Balance | 3.2 | AAA | AA |

TABLE 36

| | Colloidal silica | | Compound (1) | | Compound (2) | | Compound (3) | | |
|---|---|---|---|---|---|---|---|---|---|
| Table 11-3 | Type | Amount (%) | Type | Amount (%) | Type | Amount (ppm) | Type | Amount (%) | Ratio 1 |
| Example 236 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 237 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 238 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 239 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 240 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 241 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 242 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 243 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 244 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 245 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 246 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 247 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 248 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 249 | PL1 | 2.00 | 5-MBTA | 0.0050 | Compound A | 0.030 | | | 556 |
| | | | | | Compound B | 0.030 | | | |
| | | | | | Compound C | 0.030 | | | |
| Example 250 | PL1 | 2.00 | 5-MBTA | 0.0050 | Compound A | 0.030 | | | 556 |
| | | | | | Compound B | 0.030 | | | |
| | | | | | Compound C | 0.030 | | | |

TABLE 37

| | Passivation film forming agent | | | Polymer compound | | | Cationic compound | | Anionic surfactant | | |
|---|---|---|---|---|---|---|---|---|---|---|---|
| Table 11-3 (continued) | Type | ClogP | Amount (%) | Type | Molecular amount | Amount (%) | Type | Amount (%) | Type | ClogP | Amount (%) |
| Example 236 | 1-Hydroxy-2-naphthalenecarboxylic acid | 3.29 | 0.10 | PAA | 25,000 | 0.1 | | | N-LSAR | 5.55 | 0.002 |
| Example 237 | 3-Hydroxy-2-naphthalenecarboxylic acid | 3.29 | 0.10 | PAA | 25,000 | 0.1 | | | N-LSAR | 5.55 | 0.002 |
| Example 238 | 4-Me phthalic acid | 1.27 | 0.10 | PAA | 25,000 | 0.1 | | | N-LSAR | 5.55 | 0.001 |
| Example 239 | 4-Me phthalic acid | 1.27 | 0.10 | PAA | 25,000 | 0.1 | | | N-LSAR | 5.55 | 0.010 |
| Example 240 | 4-Me phthalic acid | 1.27 | 0.10 | PAA | 25,000 | 0.1 | | | N-LSAR | 5.55 | 0.025 |
| Example 241 | 4-Me phthalic acid | 1.27 | 0.10 | PAA | 25,000 | 0.1 | | | N-LSAR | 5.55 | 0.500 |
| Example 242 | 4-Me phthalic acid | 1.27 | 0.01 | PAA | 25,000 | 0.1 | | | N-LSAR | 5.55 | 0.002 |
| Example 243 | 4-Me phthalic acid | 1.27 | 0.05 | PAA | 25,000 | 0.1 | | | N-LSAR | 5.55 | 0.002 |
| Example 244 | 4-Me phthalic acid | 1.27 | 0.10 | PAA | 25,000 | 0.1 | TBAH | 0.5 | N-LSAR | 5.55 | 0.002 |
| Example 245 | 4-Me phthalic acid | 1.27 | 0.10 | PAA | 25,000 | 0.1 | TBAH | 0.5 | N-LSAR | 5.55 | 0.001 |
| Example 246 | 4-Me phthalic acid | 1.27 | 0.10 | PAA | 25,000 | 0.1 | TBAH | 0.5 | N-LSAR | 5.55 | 0.010 |
| Example 247 | 4-Me phthalic acid | 1.27 | 0.10 | PAA | 25,000 | 0.1 | TBAH | 0.5 | N-LSAR | 5.55 | 0.025 |
| Example 248 | 4-Me phthalic acid | 1.27 | 0.10 | PAA | 25,000 | 0.1 | TBAH | 0.5 | N-LSAR | 5.55 | 0.500 |
| Example 249 | 4-Me phthalic acid | 1.27 | 0.01 | PAA | 25,000 | 0.1 | TBAH | 0.5 | N-LSAR | 5.55 | 0.002 |
| Example 250 | 4-Me phthalic acid | 1.27 | 0.05 | PAA | 25,000 | 0.1 | TBAH | 0.5 | N-LSAR | 5.55 | 0.002 |

TABLE 38

| Table 11-3 (continued) | ΔClogP | Ratio 2 | $H_2O_2$ Amount (%) | Organic Solvent Type | Organic Solvent Amount (%) | pH Adjuster Amount | Water Amount | pH | Dishing suppressing property | Erosion suppressing property |
|---|---|---|---|---|---|---|---|---|---|---|
| Example 236 | 2.26 | 50.0 | 1.0 | ETG | 0.05 | Adjusted | Balance | 3.2 | AA | A |
| Example 237 | 2.26 | 50.0 | 1.0 | ETG | 0.05 | Adjusted | Balance | 3.2 | AA | A |
| Example 238 | 4.28 | 125.0 | 1.0 | ETG | 0.05 | Adjusted | Balance | 3.2 | AA | AA |
| Example 239 | 4.28 | 10.0 | 1.0 | ETG | 0.05 | Adjusted | Balance | 3.2 | AA | AA |
| Example 240 | 4.28 | 4.0 | 1.0 | ETG | 0.05 | Adjusted | Balance | 3.2 | AA | AA |
| Example 241 | 4.28 | 0.2 | 1.0 | ETG | 0.05 | Adjusted | Balance | 3.2 | AA | AA |
| Example 242 | 4.28 | 5.0 | 1.0 | ETG | 0.05 | Adjusted | Balance | 3.2 | AA | AA |
| Example 243 | 4.28 | 25.0 | 1.0 | ETG | 0.05 | Adjusted | Balance | 3.2 | AA | AA |
| Example 244 | 4.28 | 50.0 | 1.0 | ETG | 0.05 | Adjusted | Balance | 3.2 | AAA | AAA |
| Example 245 | 4.28 | 125.0 | 1.0 | ETG | 0.05 | Adjusted | Balance | 3.2 | AAA | AAA |
| Example 246 | 4.28 | 10.0 | 1.0 | ETG | 0.05 | Adjusted | Balance | 3.2 | AAA | AAA |
| Example 247 | 4.28 | 4.0 | 1.0 | ETG | 0.05 | Adjusted | Balance | 3.2 | AAA | AAA |
| Example 248 | 4.28 | 0.2 | 1.0 | ETG | 0.05 | Adjusted | Balance | 3.2 | AAA | AAA |
| Example 249 | 4.28 | 5.0 | 1.0 | ETG | 0.05 | Adjusted | Balance | 3.2 | AAA | AAA |
| Example 250 | 4.28 | 25.0 | 1.0 | ETG | 0.05 | Adjusted | Balance | 3.2 | AAA | AAA |

TABLE 39

| | Colloidal silica | | Compound (1) | | Compound (2) | | Compound (3) | | |
|---|---|---|---|---|---|---|---|---|---|
| Table 11-4 | Type | Amount (%) | Type | Amount (%) | Type | Amount (ppm) | Type | Amount (%) | Ratio 1 |
| Example 251 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 252 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 253 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 254 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 255 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 256 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 257 | PL1 | 2.00 | 5-MBTA<br>1-HBTA | 0.0050<br>0.0100 | Compound A<br>Compound B<br>Compound C | 0.030<br>0.030<br>0.030 | | | 2,778 |
| Example 258 | PL1 | 2.00 | 5-MBTA | 0.0050 | Compound A<br>Compound B<br>Compound C | 0.030<br>0.030<br>0.030 | | | 556 |
| Example 259 | PL1 | 2.00 | 5-MBTA | 0.0050 | Compound A<br>Compound B<br>Compound C | 0.030<br>0.030<br>0.030 | | | 556 |
| Example 260 | PL1 | 2.00 | 5-MBTA | 0.0050 | Compound A<br>Compound B<br>Compound C | 0.030<br>0.030<br>0.030 | | | 556 |
| Example 261 | PL1 | 2.00 | 5-MBTA | 0.0050 | Compound A<br>Compound B<br>Compound C | 0.030<br>0.030<br>0.030 | | | 556 |
| Example 262 | PL1 | 2.00 | 5-MBTA | 0.0050 | Compound A<br>Compound B<br>Compound C | 0.030<br>0.030<br>0.030 | | | 556 |
| Comparative Example 201 | PL1 | 2.00 | 1-HBTA | 0.0030 | | | 5-Ate | 0.003 | |

TABLE 40

| Table 11-4 (continued) | Passivation film forming agent Type | ClogP | Amount (%) | Polymer compound Type | Molecular amount | Amount (%) | Cationic compound Type | Amount (%) | Anionic surfactant Type | ClogP | Amount (%) |
|---|---|---|---|---|---|---|---|---|---|---|---|
| Example 251 | 4-Me phthalic acid | 1.27 | 0.10 | PAA | 25,000 | 0.1 | TBAH | 0.5 | N-LSAR | 5.55 | 0.002 |
| Example 252 | 4-Me phthalic acid | 1.27 | 0.10 | PAA | 25,000 | 0.1 | TBAH | 0.5 | N-LSAR | 5.55 | 0.001 |
| Example 253 | 4-Me phthalic acid | 1.27 | 0.10 | PAA | 25,000 | 0.1 | TBAH | 0.5 | N-LSAR | 5.55 | 0.010 |
| Example 254 | 4-Me phthalic acid | 1.27 | 0.10 | PAA | 25,000 | 0.1 | TBAH | 0.5 | N-LSAR | 5.55 | 0.025 |
| Example 255 | 4-Me phthalic acid | 1.27 | 0.10 | PAA | 25,000 | 0.1 | TBAH | 0.5 | N-LSAR | 5.55 | 0.500 |
| Example 256 | 4-Me phthalic acid | 1.27 | 0.01 | PAA | 25,000 | 0.1 | TBAH | 0.5 | N-LSAR | 5.55 | 0.002 |
| Example 257 | 4-Me phthalic acid | 1.27 | 0.05 | PAA | 25,000 | 0.1 | TBAH | 0.5 | N-LSAR | 5.55 | 0.002 |
| Example 258 | 4-Me phthalic acid | 1.27 | 0.40 | PAA | 25,000 | 0.1 | | | N-LSAR | 5.55 | 0.002 |
| Example 259 | 4-Me phthalic acid | 1.27 | 0.60 | PAA | 25,000 | 0.1 | | | N-LSAR | 5.55 | 0.002 |
| Example 260 | 4-Me phthalic acid | 1.27 | 0.10 | PAA | 25,000 | 0.1 | | | N-LSAR | 5.55 | 0.002 |
| Example 261 | 4-Me phthalic acid | 1.27 | 0.10 | PAA | 25,000 | 0.1 | | | N-LSAR | 5.55 | 0.002 |
| Example 262 | 4-Me phthalic acid | 1.27 | 0.10 | PAA | 25,000 | 0.1 | | | N-LSAR | 5.55 | 0.002 |
| Comparative Example 201 | | | | PAA | 25,000 | 0.1 | | | | | |

TABLE 41

| Table 11-4 (continued) | ΔClogP | Ratio 2 | $H_2O_2$ Amount (%) | Organic solvent Type | Organic solvent Amount (%) | pH Adjuster Amount | Water Amount | pH | Dishing suppressing property | Erosion suppressing property |
|---|---|---|---|---|---|---|---|---|---|---|
| Example 251 | 4.28 | 50.0 | 1.0 | ETG | 0.05 | Adjusted | Balance | 3.2 | AAA | AAA |
| Example 252 | 4.28 | 125.0 | 1.0 | ETG | 0.05 | Adjusted | Balance | 3.2 | AAA | AAA |
| Example 253 | 4.28 | 10.0 | 1.0 | ETG | 0.05 | Adjusted | Balance | 3.2 | AAA | AAA |
| Example 254 | 4.28 | 4.0 | 1.0 | ETG | 0.05 | Adjusted | Balance | 3.2 | AAA | AAA |
| Example 255 | 4.28 | 0.2 | 1.0 | ETG | 0.05 | Adjusted | Balance | 3.2 | AAA | AAA |
| Example 256 | 4.28 | 5.0 | 1.0 | ETG | 0.05 | Adjusted | Balance | 3.2 | AAA | AAA |
| Example 257 | 4.28 | 25.0 | 1.0 | ETG | 0.05 | Adjusted | Balance | 3.2 | AAA | AAA |
| Example 258 | 4.28 | 200.0 | 1.0 | ETG | 0.05 | Adjusted | Balance | 3.2 | A | AA |
| Example 259 | 4.28 | 300.0 | 1.0 | ETG | 0.05 | Adjusted | Balance | 3.2 | B | AA |
| Example 260 | 4.28 | 50.0 | 1.0 | ETG | 0.05 | Adjusted | Balance | 2.0 | A | B |
| Example 261 | 4.28 | 50.0 | 1.0 | ETG | 0.05 | Adjusted | Balance | 2.5 | A | A |
| Example 262 | 4.28 | 50.0 | 1.0 | ETG | 0.05 | Adjusted | Balance | 4.0 | A | A |
| Comparative Example 201 | | | 1.0 | ETG | 0.05 | Adjusted | Balance | 3.2 | D | D |

From the results shown in the tables, it was confirmed that desired results could be obtained in a case of using the present polishing liquid.

Above all, it was confirmed that in a case where the mass ratio (ratio 1) of the content of the compound (1) to the content of the compound (2) is 100 or more, the effect of the present invention is more excellent (see the comparison of the results of Examples 207 and 209, and the like).

In addition, it was confirmed that in a case where the mass ratio (ratio 1) of the content of the compound (1) to the content of the compound (2) is 20,000 or less, the effect of the present invention is more excellent (see the comparison of the results of Examples 206 and 208, and the like).

It was confirmed that in a case where the present polishing liquid includes an anionic surfactant, the erosion suppressing property is excellent (see the comparison of the results of Examples 210 and 211, and the like).

It was confirmed that in a case where the present polishing liquid includes a passivation film forming agent, the erosion suppressing property is excellent (see the comparison of the results of Examples 210, and 212 to 224, and the like).

Above all, it was confirmed that in a case where the present polishing liquid includes 1,4,5,8-naphthalenetetracarboxylic acid or 6-hydroxy-2-naphthalenecarboxylic acid as a passivation film forming agent, the effect of the present invention is more excellent, as compared with a case where the present polishing liquid includes other passivation film forming agents (see the comparison of the results of Examples 212 to 224, and the like).

In addition, it was confirmed that in a case where the present polishing liquid includes a passivation film forming agent having a C log P value of 1.0 or more, the erosion suppressing property is more excellent, as compared with a case where the present polishing liquid includes a passivation film forming agent having a C log P value of less than 1.0 (see the comparison of the results of Examples 225 and 227, and the like).

It was confirmed that in a case where the present polishing liquid includes both a passivation film forming agent and an anionic surfactant, the effect of the present invention is more excellent (see the comparison of the results of Examples 211 to 237, and the like).

Above all, it was confirmed that in a case where a difference value (ΔC log P value) obtained by subtracting the C log P value of the passivation film forming agent from the C log P value of the anionic surfactant is 2.50 or more, the erosion suppressing property is excellent (see the comparison of the results of Examples 224 to 237, and the like).

In addition, it was confirmed that in a case where the mass ratio (ratio 2) of the content of the passivation film forming agent to the content of the anionic surfactant is less than 300, the effect of the present invention is more excellent; and in a case where the ratio 2 is less than 200, the effect of the present invention is more excellent (see the comparison of the results of Examples 252, 258, and 259, and the like).

It was confirmed that in a case where the present polishing liquid includes a cationic compound, the effect of the present invention is more excellent and the erosion suppressing property is excellent (see the comparison of the results of Example 226 and 238 to 257, and the like).

It was confirmed that in a case where the pH of the present polishing liquid is 2.2 or more, the erosion suppressing property is excellent; and in a case where the pH of the polishing liquid is 2.7 or more, the effect of the present invention and the erosion suppressing property are more excellent (see the comparison of the results in Examples 226, 260, and 261, and the like).

In addition, it was confirmed that in a case where the pH of the present polishing liquid is less than 4.0, the effect of the present invention and the erosion suppressing property are more excellent (see the comparison of the results of Examples 226 and 262, and the like).

Example 3B

Further, the following tests were performed while changing a polishing pressure (a contact pressure for contacting the surface to be polished and the polishing pad), using the polishing liquid of each of Examples 244 to 250 described above.

[Tests]

<Evaluation of Scratch Suppressing Property—5>

Evaluation of the scratch suppressing property was performed in the same manner as in <Evaluation of Scratch Suppressing Property—3> of Example 2B.

<Evaluation of Uniformity—5>

Evaluation of the uniformity suppressing property was performed in the same manner as in <Evaluation of Uniformity Suppressing Property—3> of Example 2B.

The evaluation results of the tests performed while changing the contact pressure are shown below.

TABLE 42

| Table 12 | | Polishing pressure (psi) | | | | | |
|---|---|---|---|---|---|---|---|
| | | 0.25 | 0.5 | 1 | 2 | 3 | 3.5 |
| Example 244 | Scratch suppressing property | A | AA | AA | AA | AA | C |
| | Uniformity | C | AA | AAA | AAA | AAA | B |
| Example 245 | Scratch suppressing property | A | AA | AA | AA | AA | C |
| | Uniformity | C | AA | AAA | AAA | AAA | B |
| Example 246 | Scratch suppressing property | A | AA | AA | AA | AA | C |
| | Uniformity | C | AA | AAA | AAA | AAA | B |
| Example 247 | Scratch suppressing property | A | AA | AA | AA | AA | C |
| | Uniformity | C | AA | AAA | AAA | AAA | B |
| Example 248 | Scratch suppressing property | A | AA | AA | AA | AA | C |
| | Uniformity | C | AA | AAA | AAA | AAA | B |
| Example 249 | Scratch suppressing property | AA | AAA | AAA | AAA | AAA | B |
| | Uniformity | C | AA | AAA | AAA | AAA | B |
| Example 250 | Scratch suppressing property | AA | AAA | AAA | AAA | AAA | B |
| | Uniformity | C | AA | AAA | AAA | AAA | B |

As shown in the table, it was confirmed that the polishing pressure is preferably 0.5 to 3.0 psi, and more preferably 1.0 to 3.0 psi.

Example 3C

Further, the following tests were performed while changing the supply rate of the polishing liquid, using the polishing liquid of each of Examples 244 to 250, described above.

[Tests]

<Evaluation of Scratch Suppressing Property—6>

Evaluation of the scratch suppressing property was performed in the same manner as in <Evaluation of Scratch Suppressing Property—4> of Example 2C.

<Evaluation of Uniformity—6>

Evaluation of the uniformity suppressing property was performed in the same manner as in <Evaluation of Uniformity Suppressing Property—4> of Example 2C.

The evaluation results of the tests performed while changing the supply rate of the polishing liquid are shown below.

TABLE 43

| Table 13 | | Supply rate (ml/(min · $cm^2$)) of polishing liquid | | | | | |
|---|---|---|---|---|---|---|---|
| | | 0.1 | 0.14 | 0.21 | 0.28 | 0.35 | 0.4 |
| Example 244 | Scratch suppressing property | C | AA | AA | AA | AA | A |
| | Uniformity | B | AA | AAA | AAA | AAA | C |
| Example 245 | Scratch suppressing property | C | AA | AA | AA | AA | A |
| | Uniformity | B | AA | AAA | AAA | AAA | C |
| Example 246 | Scratch suppressing property | C | AA | AA | AA | AA | A |
| | Uniformity | B | AA | AAA | AAA | AAA | C |
| Example 247 | Scratch suppressing property | C | AA | AA | AA | AA | A |
| | Uniformity | B | AA | AAA | AAA | AAA | C |
| Example 248 | Scratch suppressing property | C | AA | AA | AA | AA | A |
| | Uniformity | B | AA | AAA | AAA | AAA | C |
| Example 249 | Scratch suppressing property | C | AAA | AAA | AAA | AAA | AA |
| | Uniformity | B | AA | AAA | AAA | AAA | C |
| Example 250 | Scratch suppressing property | C | AAA | AAA | AAA | AAA | AA |
| | Uniformity | B | AA | AAA | AAA | AAA | C |

As shown in the table, it was confirmed that the supply rate of the polishing liquid is preferably 0.14 to 0.35 ml/(min·cm$^2$), and more preferably 0.21 to 0.35 ml/(min·cm$^2$).

Example 3D

Further, the following tests were performed while changing the type of the cleaning liquid (pCMP liquid), using the polishing liquid of each of Examples 244 to 250 described above.

[Tests]

<Evaluation of Residue Suppressing Property—3>

Evaluation of the residue suppressing property was performed in the same manner as in <Evaluation of Residue Suppressing Property—2> of Example 2D.

<Evaluation of Corrosion Suppressing Property—3>

Evaluation of the corrosion suppressing property was performed in the same manner as in <Evaluation of Corrosion Suppressing Property—2> of Example 2D.

The evaluation results of the tests performed while changing the type of the cleaning liquid are shown below.

TABLE 44

| | | Cleaning liquid | | |
|---|---|---|---|---|
| Table 14 | | DIW | Acidic | Alkaline |
| Example 244 | Residue suppressing property | C | B | AAA |
| | Corrosion suppressing property | AAA | C | AAA |
| Example 245 | Residue suppressing property | C | B | AAA |
| | Corrosion suppressing property | AAA | C | AAA |
| Example 246 | Residue suppressing property | C | B | AAA |
| | Corrosion suppressing property | AAA | C | AAA |
| Example 247 | Residue suppressing property | C | B | AAA |
| | Corrosion suppressing property | AAA | C | AAA |
| Example 248 | Residue suppressing property | C | B | AAA |
| | Corrosion suppressing property | AAA | C | AAA |
| Example 249 | Residue suppressing property | C | B | AAA |
| | Corrosion suppressing property | AAA | C | AAA |
| Example 250 | Residue suppressing property | C | B | AAA |
| | Corrosion suppressing property | AAA | C | AAA |

DIW: Water

Acidic: CLEAN100 (manufactured by Fujifilm Electronics Materials Co., Ltd.: acidic cleaning liquid)

Alkaline: CL9010 (manufactured by Fujifilm Electronics Materials Co., Ltd.: alkaline cleaning liquid)

As shown in the table, it was confirmed that the alkaline cleaning liquid is preferable as the cleaning liquid.

Example 3E

Further, the following tests were performed while changing the type of the object to be polished, using the polishing liquid of each of Examples 244 to 250 described above.

[Tests]

<Evaluation of Polishing Speed (RR)—4>

Evaluation of the polishing speed was performed in the same manner as in

<Evaluation of Polishing Speed (RR)—3> of Example 2E.

The evaluation results are shown below.

Furthermore, a speed ratio of the polishing speed of Co to the polishing speed of TiN, Ta, TaN, SiN, TEOS, SiOC, or SiC (polishing speed of Co/polishing speed of TiN, Ta, TaN, SiN, TEOS, SiOC, or SiC) was in the range of more than 0.05 and less than 5.

TABLE 45

| | Object to be polished | | | | | | | |
|---|---|---|---|---|---|---|---|---|
| Table 15 | Co | TiN | Ta | TaN | SiN | TEOS | SiOC | SiC |
| Example 244 | A | A | A | A | A | A | A | A |
| Example 245 | A | A | A | A | A | A | A | A |
| Example 246 | A | A | A | A | A | A | A | A |
| Example 247 | A | A | A | A | A | A | A | A |
| Example 248 | A | A | A | A | A | A | A | A |
| Example 249 | A | A | A | A | A | A | A | A |
| Example 250 | A | A | A | A | A | A | A | A |

As shown in the results, it was confirmed that the present polishing liquid has no extreme difference between the polishing speed for Co and the polishing speed for TiN, Ta, TaN, SiN, TEOS, SiOC, or SiC, and is suitable as a polishing liquid used for removing a barrier layer and the like.

Furthermore, in the present polishing liquid, the polishing speed with respect to Co can be optionally adjusted (adjusted to, for example, between 0 and 30 nm/min) by adjusting the content of hydrogen peroxide in the polishing liquid.

EXPLANATION OF REFERENCES

10*a*, 10*b* object to be polished
10*c* object to be polished, which has been polished
12 cobalt-containing film
14 barrier layer
16 interlayer insulating layer
18 bulk layer

What is claimed is:

1. A polishing liquid used for chemical mechanical polishing of an object to be polished having a cobalt-containing film, the polishing liquid comprising:

colloidal silica;

a nitrogen-containing aromatic heterocyclic compound; and hydrogen peroxide, wherein at least a nitrogen-containing aromatic heterocyclic compound (1) and a nitrogen-containing aromatic heterocyclic compound (2) different from the nitrogen-containing aromatic heterocyclic compound (1) are included as the nitrogen-containing aromatic heterocyclic compound, and the nitrogen-containing aromatic heterocyclic compound (1) is selected from the group consisting of a compound represented by General Formula (I) and a compound represented by General Formula (II), the nitrogen-containing aromatic heterocyclic compound (2) is selected from the group consisting of a compound represented by General Formula (II) and a compound represented by General Formula (III), or the nitrogen-containing aromatic heterocyclic compound (1) and the nitrogen-containing aromatic heterocyclic compound (2) are two selected from the group consisting of a compound represented by General Formula (IV) and a compound represented by General Formula (V), (I)

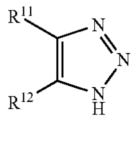

in General Formula (I), $R^{11}$ and $R^{12}$ each independently represent a hydrogen atom or a substituted or unsubstituted hydrocarbon group, and $R^{11}$ and $R^{12}$ may be bonded to each other to form a ring, (II)

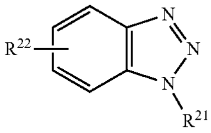

in General Formula (II), $R^{21}$ represents a hydroxyl group or a substituted or unsubstituted hydrocarbon group, and $R^{22}$ represents a hydrogen atom, a hydroxyl group, or a substituted or unsubstituted hydrocarbon group, (III)

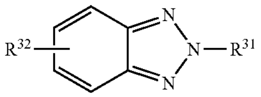

in General Formula (III), $R^{31}$ represents a substituted or unsubstituted hydrocarbon group, and $R^{32}$ represents a hydrogen atom or a substituted or unsubstituted hydrocarbon group, (IV)

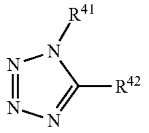

in General Formula (IV), $R^{41}$ represents a hydrogen atom, and $R^{42}$ represents a hydrogen atom, a hydroxyl group, a mercapto group, or an amino group, (V)

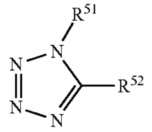

in General Formula (V), $R^{51}$ and $R^{52}$ each independently represent a hydrogen atom or a substituted or unsubstituted hydrocarbon group, provided that at least one of $R^{51}$ or $R^{52}$ represents the substituted or unsubstituted hydrocarbon group.

2. The polishing liquid according to claim 1, further comprising one or more passivation film forming agents selected from the group consisting of a compound represented by General Formula (1) and a compound represented by General Formula (2), (1)

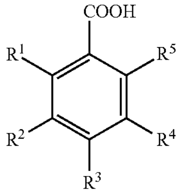

(2)

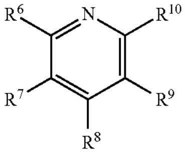

in General Formula (1), $R^1$ to $R^5$ each independently represent a hydrogen atom or a substituent, and two adjacent groups in $R^1$ to $R^5$ may be bonded to each other to form a ring, and in General Formula (2), $R^6$ to $R^{10}$ each independently represent a hydrogen atom or a substituent, and two adjacent groups in $R^6$ to $R^{10}$ may be bonded to each other to form a ring.

3. The polishing liquid according to claim 2, wherein in General Formula (1), $R^1$ to $R^5$ each independently represent an alkyl group, a nitro group, an amino group or a hydroxyl group.

4. The polishing liquid according to claim 2, wherein the passivation film forming agent is 1,4,5,8-naphthalenetetracarboxylic acid or 6-hydroxy-2-naphthalenecarboxylic acid.

5. The polishing liquid according to claim 2, wherein a C log P value of the passivation film forming agent is 1.0 to 3.8.

6. The polishing liquid according to claim 2, wherein the passivation film forming agent is one or more selected from the group consisting of 4-methylphthalic acid, 4-nitrophthalic acid, salicylic acid, 4-methylsalicylic acid, anthranilic acid, 4-methylbenzoic acid, 4-tert-butylbenzoic acid, 4-propylbenzoic acid, 1,4,5,8-naphthalenetetracarboxylic acid, 6-hydroxy-2-naphthalenecarboxylic acid, 1-hydroxy-2-naphthalenecarboxylic acid, 3-hydroxy-2-naphthalenecarboxylic acid, quinaldic acid, 8-hydroxyquinoline, and 2-methyl-8-hydroxyquinoline.

7. The polishing liquid according to claim 2, further comprising an anionic surfactant.

8. The polishing liquid according to claim 7, wherein a mass ratio of a content of the passivation film forming agent to a content of the anionic surfactant is more than 0.01 and less than 150.

9. The polishing liquid according to claim 7, wherein a value of a difference obtained by subtracting a C log P value of the passivation film forming agent from a C log P value of the anionic surfactant is more than 2.00 and less than 8.00.

10. The polishing liquid according to claim 7, wherein a value of a difference obtained by subtracting a C log P value of the passivation film forming agent from a C log P value of the anionic surfactant is 2.50 to 6.00.

11. The polishing liquid according to claim 1, further comprising one or more organic acids selected from the group consisting of glycine, alanine, sarcosine, iminodiacetic acid, polycarboxylic acid, and polyphosphonic acid.

12. The polishing liquid according to claim 1, further comprising a nitrogen-containing aromatic heterocyclic compound other than the compounds represented by General Formulae (I) to (V).

13. The polishing liquid according to claim 1, further comprising a polymer compound.

14. The polishing liquid according to claim 1, further comprising a cationic compound.

15. The polishing liquid according to claim 1, wherein a mass ratio of a content of the nitrogen-containing aromatic heterocyclic compound (1) to a content of the nitrogen-containing aromatic heterocyclic compound (2) is 30 to 15,000.

16. The polishing liquid according to claim 1, wherein a pH of the polishing liquid is 2.0 to 12.0.

17. The polishing liquid according to claim 1, further comprising an organic solvent.

18. The polishing liquid according to claim 1, wherein a content of the colloidal silica is 10% by mass or less with respect to a total mass of the polishing liquid, and an average primary particle diameter of the colloidal silica is 60 nm or less.

19. The polishing liquid according to claim 1, wherein a concentration of solid contents is 5% by mass or more, and the polishing liquid is used after 2-times or more dilution on a mass basis.

20. A polishing liquid used for chemical mechanical polishing of an object to be polished, the polishing liquid comprising:

abrasive grains;

a nitrogen-containing aromatic heterocyclic compound; and hydrogen peroxide, wherein at least a nitrogen-containing aromatic heterocyclic compound (1) and a nitrogen-containing aromatic heterocyclic compound (2) different from the nitrogen-containing aromatic heterocyclic compound (1) are included as the nitrogen-containing aromatic heterocyclic compound, and the nitrogen-containing aromatic heterocyclic compound (1) is selected from the group consisting of a compound represented by General Formula (I) and a compound represented by General Formula (II),the nitrogen-containing aromatic heterocyclic compound (2) is selected from the group consisting of a compound represented by General Formula (II) and a compound represented by General Formula (III), or the nitrogen-containing aromatic heterocyclic compound (1) and the nitrogen-containing aromatic heterocyclic compound (2) are two selected from the group consisting of a compound represented by General Formula (IV) and a compound represented by General Formula (V), (I)

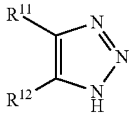

in General Formula (I), $R^{11}$ and $R^{12}$ each independently represent a hydrogen atom or a substituted or unsubstituted hydrocarbon group, and $R^{11}$ and $R^{12}$ may be bonded to each other to form a ring, (II)

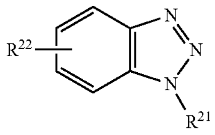

in General Formula (II), $R^{21}$ represents a hydroxyl group or a substituted or unsubstituted hydrocarbon group, and $R^{22}$ independently represents a hydrogen atom, a hydroxyl group, or a substituted or unsubstituted hydrocarbon group, (III)

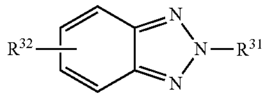

in General Formula (III), $R^{31}$ represents a substituted or unsubstituted hydrocarbon group, and $R^{32}$ represents a hydrogen atom or a substituted or unsubstituted hydrocarbon group, (IV)

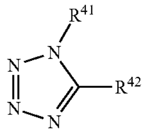

in General Formula (IV), $R^{41}$ represents a hydrogen atom, and $R^{42}$ represents a hydrogen atom, a hydroxyl group, a mercapto group, or an amino group, (V)

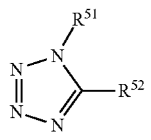

in General Formula (V), $R^{51}$ and $R^{52}$ each independently represent a hydrogen atom or a substituted or unsubstituted hydrocarbon group, provided that at least one of $R^{51}$ or $R^{52}$ represents the substituted or unsubstituted hydrocarbon group.

21. A chemical mechanical polishing method comprising:

a step of obtaining an object to be polished, which has been polished, by bringing a surface to be polished of an object to be polished into contact with a polishing pad attached to a polishing platen while supplying the polishing liquid according to claim 1 to the polishing pad, and relatively moving the object to be polished and the polishing pad to polish the surface to be polished.

22. The chemical mechanical polishing method according to claim 21, wherein a polishing pressure is 0.5 to 3.0 psi.

23. The chemical mechanical polishing method according to claim 21, wherein a supply rate of the polishing liquid supplied to the polishing pad is 0.14 to 0.35 ml/(min·$cm^2$).

24. The chemical mechanical polishing method according to claim 21, wherein the object to be polished has at least a first layer containing cobalt and a second layer other than the first layer, and the second layer includes one or more materials selected from the group consisting of tantalum, tantalum nitride, titanium nitride, silicon nitride, tetraethoxysilane, silicon oxycarbide, and silicon carbide.

25. The chemical mechanical polishing method according to claim 21, further comprising a step of cleaning the object to be polished, which has been polished, with an alkaline cleaning liquid after the step of obtaining the object to be polished, which has been polished.

* * * * *